United States Patent
Shibata et al.

(10) Patent No.: US 9,391,087 B2
(45) Date of Patent: Jul. 12, 2016

(54) NONVOLATILE SEMICONDUCTOR MEMORY DEVICE

(71) Applicant: KABUSHIKI KAISHA TOSHIBA, Tokyo (JP)

(72) Inventors: Noboru Shibata, Kanagawa (JP); Hiroshi Sukegawa, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/474,305

(22) Filed: Sep. 2, 2014

(65) Prior Publication Data

US 2015/0109862 A1   Apr. 23, 2015

(30) Foreign Application Priority Data

Oct. 17, 2013   (JP) ................................ 2013-216299

(51) Int. Cl.
  *H01L 27/115*   (2006.01)
  *G11C 5/06*     (2006.01)
  *G11C 8/14*     (2006.01)

(52) U.S. Cl.
  CPC ............ *H01L 27/1157* (2013.01); *G11C 5/063* (2013.01); *G11C 8/14* (2013.01); *H01L 27/11524* (2013.01); *H01L 27/11556* (2013.01); *H01L 27/11582* (2013.01)

(58) Field of Classification Search
  CPC ...... G11C 5/063; G11C 8/14; H01L 27/1157; H01L 27/11524; H01L 27/11556; H01L 27/11582
  USPC .............. 365/185.12, 185.17, 185.11, 185.01
  See application file for complete search history.

(56) References Cited

U.S. PATENT DOCUMENTS

| | | | | |
|---|---|---|---|---|
| 5,818,756 A * | 10/1998 | Sakui | ..................... | G11C 16/16 365/185.11 |
| 6,700,146 B2 * | 3/2004 | Ito | ..................... | H01L 27/11507 257/295 |
| 7,683,404 B2 * | 3/2010 | Jang | ..................... | H01L 21/8221 257/202 |
| 7,826,266 B2 * | 11/2010 | Ishii | ....................... | B82Y 10/00 365/185.05 |
| 7,983,084 B2 * | 7/2011 | Tokiwa | ............... | G11C 16/0483 365/185.06 |
| 8,026,504 B2 * | 9/2011 | Park | ........................ | H01L 27/24 257/24 |
| 8,194,453 B2 * | 6/2012 | Maejima | ............. | H01L 27/0688 257/324 |
| 8,199,573 B2 * | 6/2012 | Fukuzumi | ................ | G11C 5/02 365/185.05 |
| 8,315,097 B2 * | 11/2012 | Hishida | .............. | G11C 16/0483 365/183 |

(Continued)

FOREIGN PATENT DOCUMENTS

| JP | 2007201215 A | 8/2007 |
|---|---|---|
| JP | 2009-146954 A | 7/2009 |

*Primary Examiner* — Vu Le
*Assistant Examiner* — Sung Cho
(74) *Attorney, Agent, or Firm* — Patterson & Sheridan, LLP

(57) ABSTRACT

A nonvolatile semiconductor memory device includes first and second word line groups, each including a plurality of stacked word lines above a substrate, a first memory string including a first memory column through the first word line group, a second memory column through the second word line group, and a first memory connection portion electrically coupling the first and second memory columns, and a second memory string including a third memory column through the first word line group, a fourth memory column through the second word line group, and a second memory connection portion electrically coupling the third and fourth memory columns. The first memory connection portion is formed in a first layer of the substrate and the second memory connection portion is formed in a second layer of the substrate that is lower than the first layer.

12 Claims, 66 Drawing Sheets

(56) References Cited

U.S. PATENT DOCUMENTS

| | | | | |
|---|---|---|---|---|
| 8,320,182 B2* | 11/2012 | Kirisawa | ............ | G11C 16/0483 257/324 |
| 8,867,280 B2* | 10/2014 | Park | ................... | G11C 16/0483 365/185.05 |
| 8,970,040 B1* | 3/2015 | Chen | ................. | H01L 21/76838 257/211 |
| 8,980,712 B2* | 3/2015 | Joo | ............... | 438/268 |
| 2002/0063285 A1* | 5/2002 | Wu | ................... | H01L 27/10873 257/347 |
| 2004/0105310 A1* | 6/2004 | Arai | ..................... | G11C 16/344 365/185.17 |
| 2006/0120148 A1* | 6/2006 | Kim | ................... | G11C 13/0004 365/163 |
| 2008/0067554 A1* | 3/2008 | Jeong | ................... | H01L 27/115 257/211 |
| 2008/0087932 A1* | 4/2008 | Son | ..................... | H01L 21/8221 257/315 |
| 2008/0173928 A1* | 7/2008 | Arai | ..................... | H01L 29/7926 257/316 |
| 2012/0241844 A1 | 9/2012 | Iguchi et al. | | |
| 2012/0243326 A1* | 9/2012 | Maeda | ................... | G11C 16/26 365/185.21 |
| 2012/0250420 A1* | 10/2012 | Shirakawa | ......... | G11C 16/0483 365/185.22 |
| 2012/0326223 A1 | 12/2012 | Omura | | |
| 2013/0021848 A1* | 1/2013 | Iwai | ................... | G11C 16/0483 365/185.17 |
| 2013/0032873 A1 | 2/2013 | Kiyotoshi | | |
| 2013/0107628 A1* | 5/2013 | Dong | ................. | G11C 16/0483 365/185.17 |
| 2013/0126959 A1 | 5/2013 | Aburada et al. | | |
| 2013/0215683 A1* | 8/2013 | Lee | .................... | G11C 16/0466 365/185.29 |
| 2014/0362641 A1* | 12/2014 | Dong | ................. | G11C 11/5642 365/185.17 |
| 2015/0003158 A1* | 1/2015 | Aritome | ............ | G11C 16/0483 365/185.11 |

\* cited by examiner

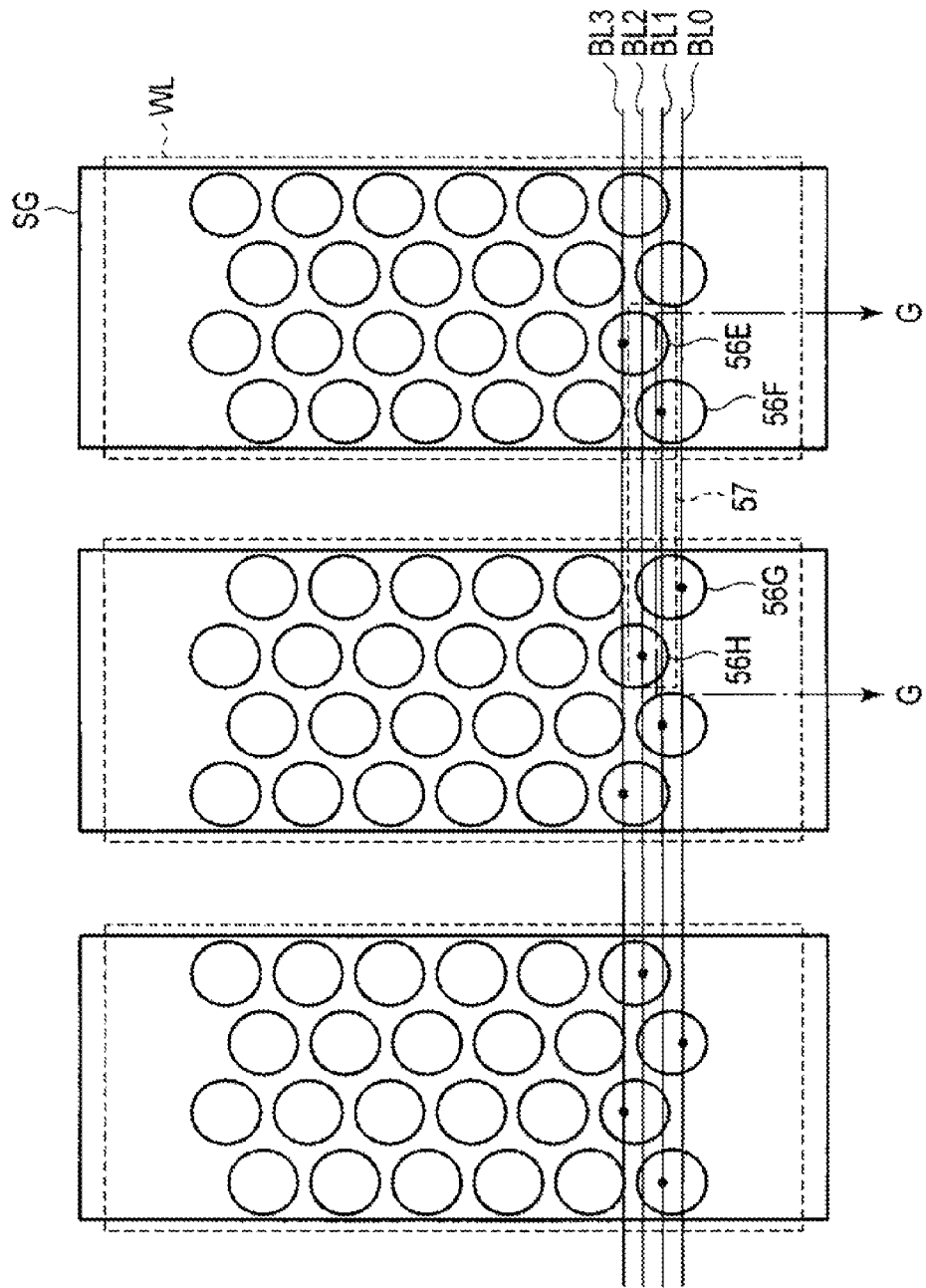

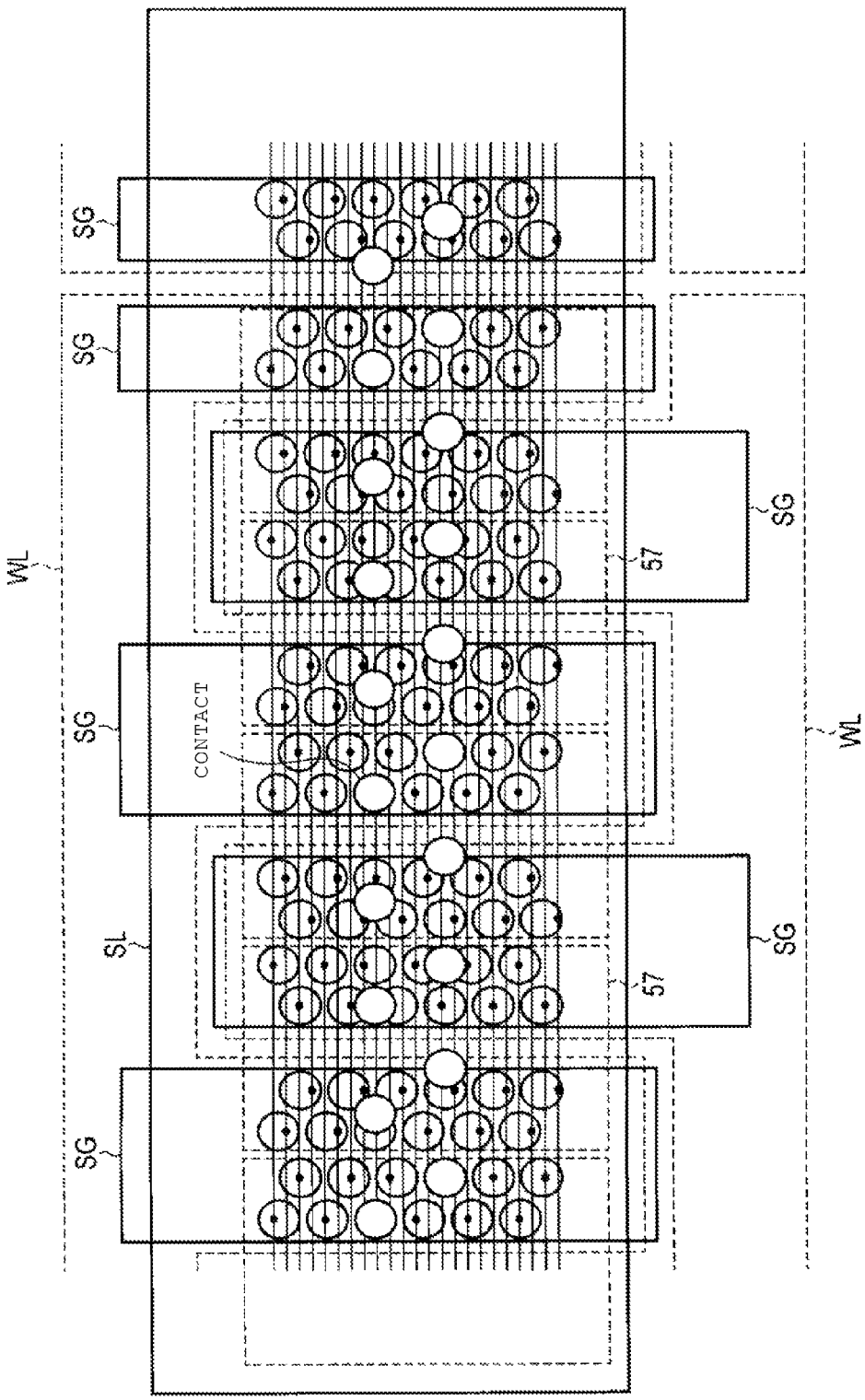

NONVOLATILE SEMICONDUCTOR MEMORY DEVICE

CROSS-REFERENCE TO RELATED APPLICATION

This application is based upon and claims the benefit of priority from Japanese Patent Application No. 2013-216299, filed Oct. 17, 2013, the entire contents of which are incorporated herein by reference.

FIELD

Embodiments described herein relate generally to a nonvolatile semiconductor memory device.

BACKGROUND

One type of NAND type flash memory is a three-dimensional stacked memory referred to as bit cost scalable: BiCS.

DESCRIPTION OF THE DRAWINGS

FIG. 34 is a plan view illustrating a memory string unit according to a seventh exemplary embodiment.

FIG. 58 is a plan view illustrating a memory string unit according to the fifth modification example of the seventh exemplary embodiment.

DETAILED DESCRIPTION

Figure 1:
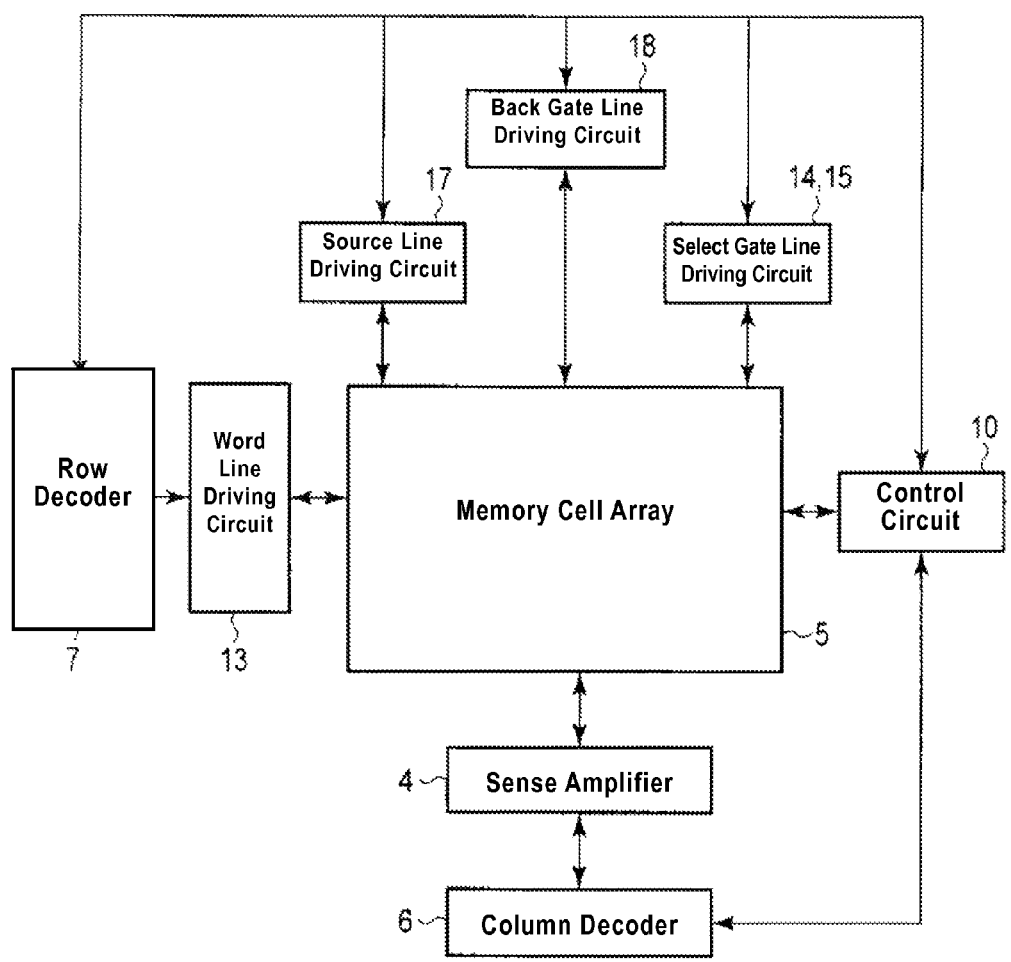
FIG. 1 is a block diagram illustrating an overall configuration example of a nonvolatile semiconductor memory device according to a first exemplary embodiment.

The present exemplary embodiments provide a nonvolatile semiconductor memory device capable of achieving a high density of memory cells.

In general, according to one embodiment, there is provided a nonvolatile semiconductor memory device including first and second word line groups, each including a plurality of stacked word lines above a substrate, a first memory string including a first memory column through the first word line group, a second memory column through the second word line group, and a first memory connection portion electrically coupling the first and second memory columns, and a second memory string including a third memory column through the first word line group, a fourth memory column through the second word line group, and a second memory connection portion electrically coupling the third and fourth memory columns. The first memory connection portion is formed in a first layer of the substrate and the second memory connection portion is formed in a second layer of the substrate that is lower than the first layer.

According to another embodiment, there is provided a nonvolatile semiconductor memory device including a first memory string and a second memory string. The first memory string includes a first memory columnar portion 56A1, a second memory columnar portion 56A2 that is disposed at the same position as the first memory columnar portion in a first direction, and a first memory connection portion 57A. The second memory string includes a third memory columnar portion 56B1 that is disposed at a position deviated from the first memory columnar portion in the first direction, a fourth memory columnar portion 56B2 that is disposed at the same position as the third memory columnar portion in the first direction, and a second memory connection portion 57B. The first memory columnar portion and the second memory columnar portion are located between the third memory columnar portion and the fourth memory columnar portion in a second direction, and the second memory connection portion is located in a lower layer than the first memory connection portion.

For a three-dimensional stacked memory, p-BiCS using a U-shaped (pipe type) semiconductor pillar in a NAND string is known. The U-shaped semiconductor pillar includes a pair of columnar portions and a connection portion which connects the columnar portions to each other at a lower end. The connection portion of the U-shaped semiconductor pillar is formed in a lower layer of a slit which separates a stacked word line plate. For this reason, the connection portion connects the pair of columnar portions which are formed in the word lines located on both sides of the slit. In other words, only two columnar portions are disposed in a single word line which is interposed between two slits. In this structure, a proportion in which slits are present as a whole is high, and a density in which columnar portions forming memory cells are present is low. As a result, there is a possibility of hindering a high density (large capacity) of a memory.

In contrast, in the present exemplary embodiments, columnar portions of four columns are formed in a zigzag arrangement in a single word line, thereby achieving a high density of memory cells.

The present exemplary embodiments will be described with reference to the drawings. In the drawings, the same parts have the same reference numerals. In addition, repeated description will be made as necessary.

First Exemplary Embodiment

Figure 5:
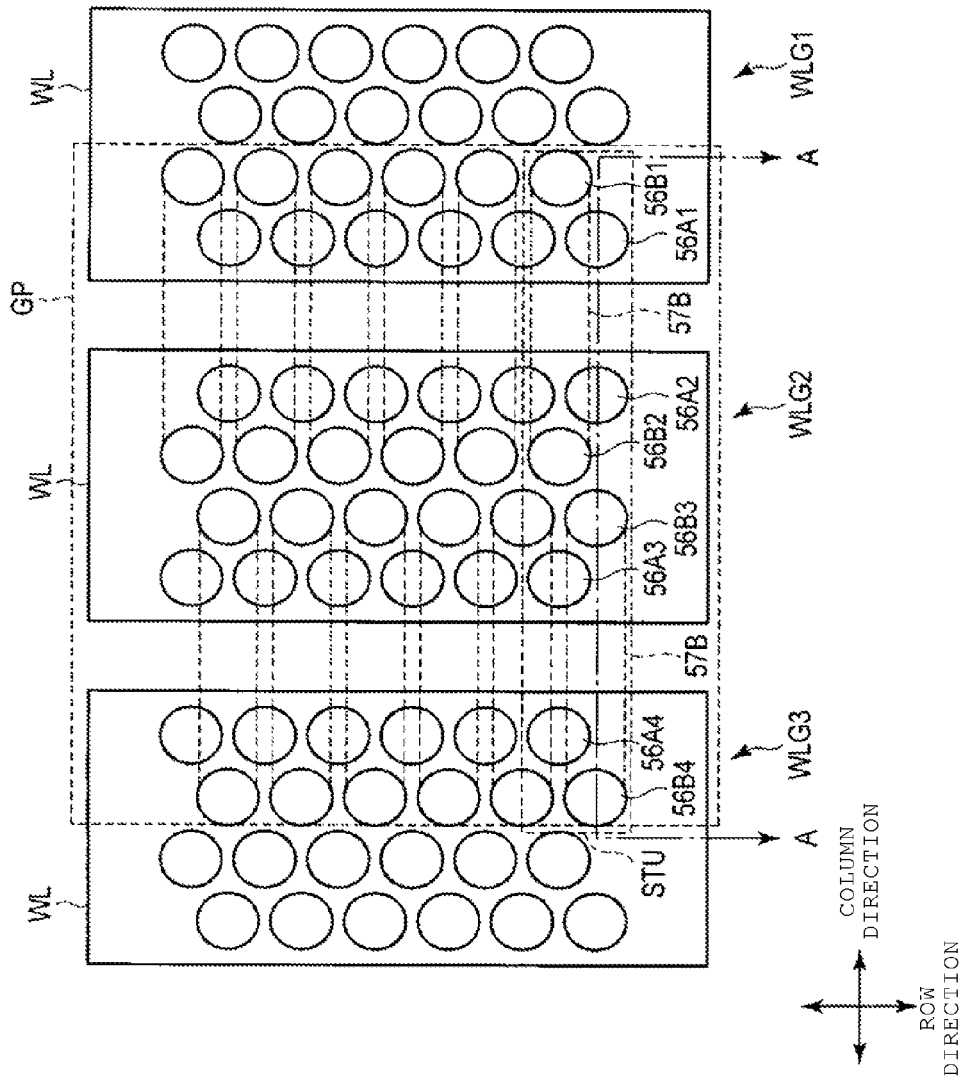
FIG. 5 is a plan view illustrating a memory string unit according to the first exemplary embodiment.
Figure 6:
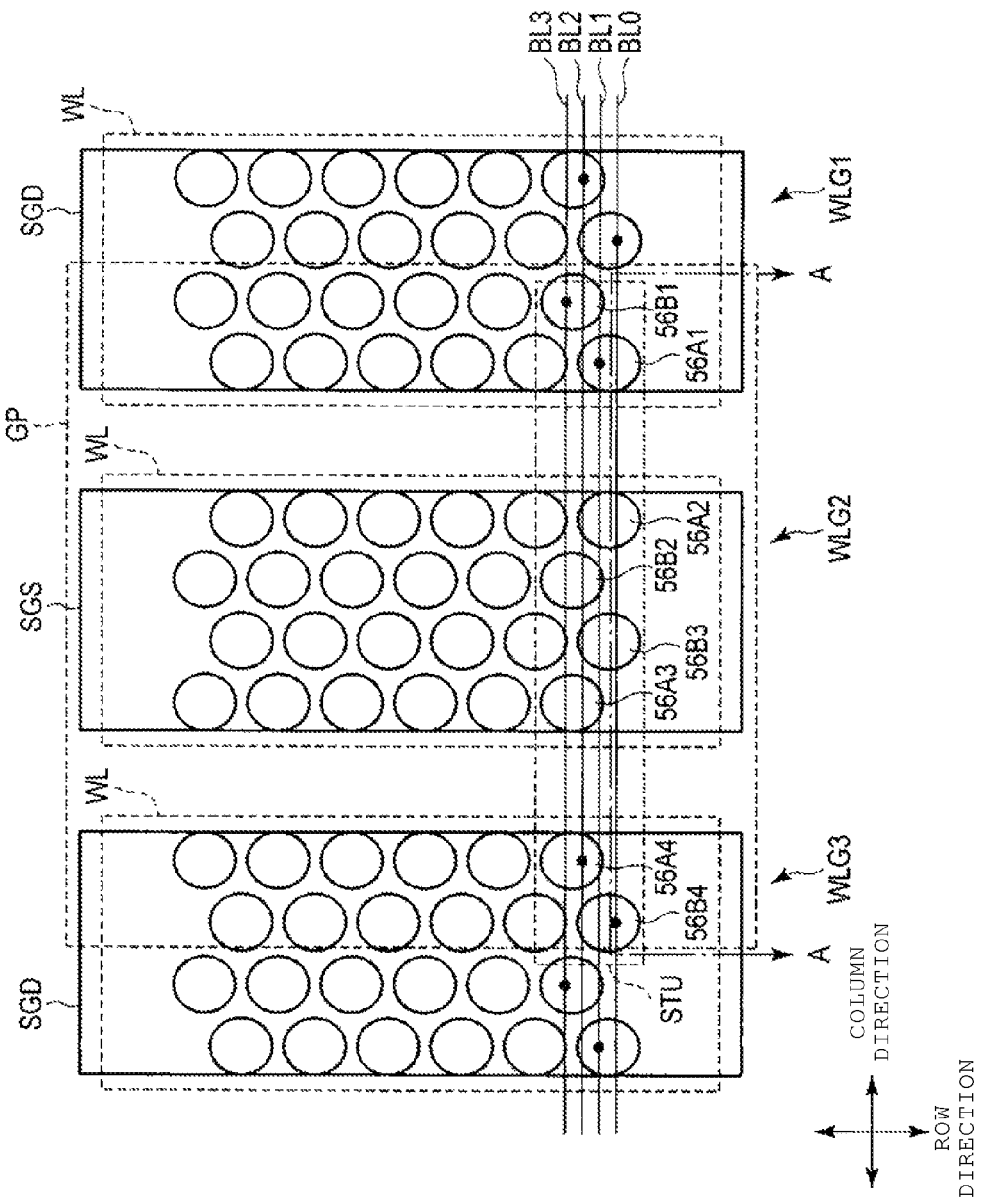
FIG. 6 is a plan view illustrating a memory string unit according to the first exemplary embodiment.
Figure 7:
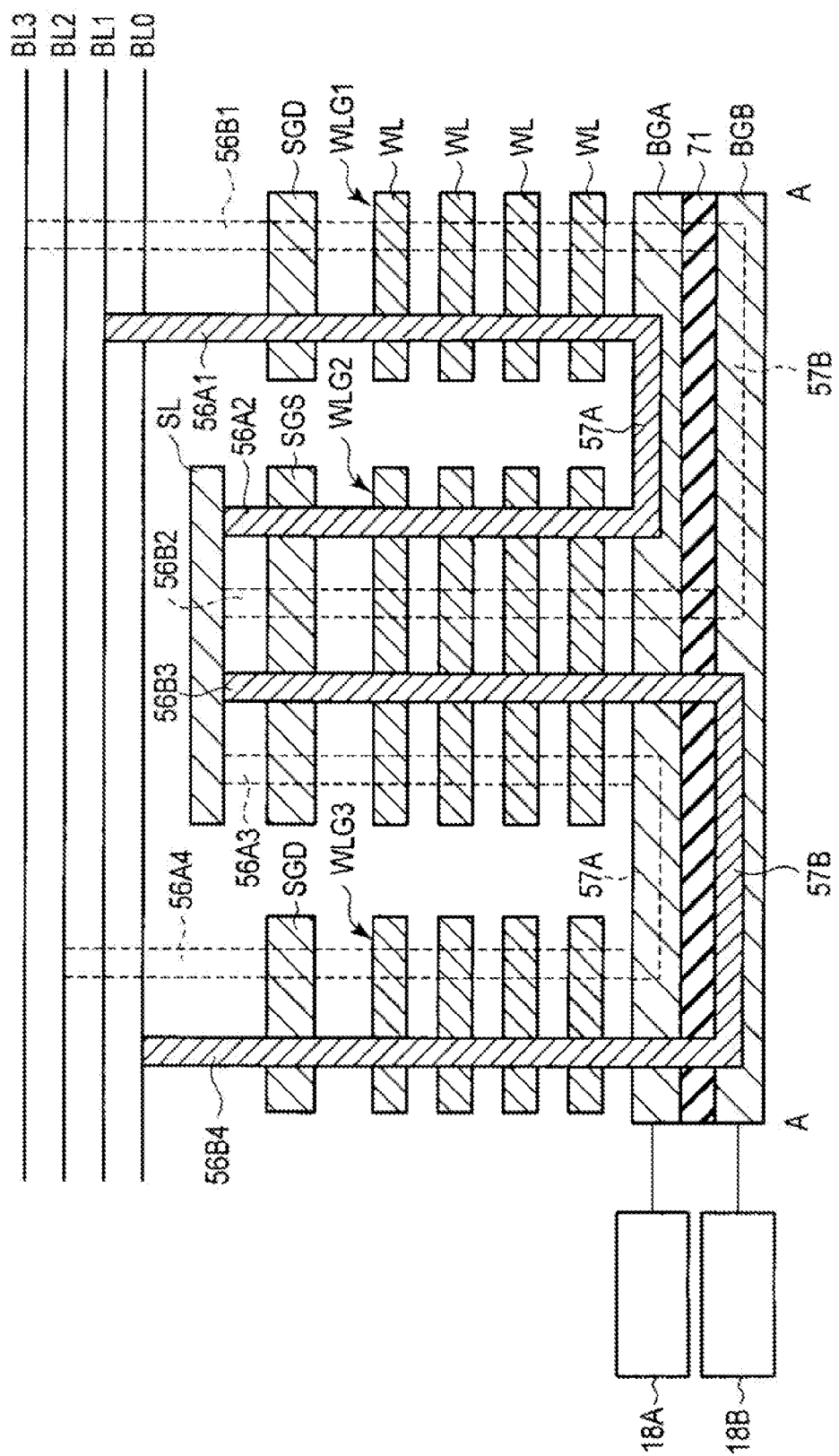
FIG. 7 is a cross-sectional view taken along the line A-A of FIGS. 4 to 6.

With reference to FIGS. 1 to 12, a nonvolatile semiconductor memory device according to a first exemplary embodiment will be described. In the first exemplary embodiment, for example, as illustrated in FIG. 7, a NAND string including a pair of memory columnar portions 56A and a memory connection portion 57A connecting the memory columnar portions 56A to each other, and a NAND string including a pair of memory columnar portions 56B between which a distance is larger than a distance between the pair of memory columnar portions 56A and a memory connection portion 57B connecting the memory columnar portions 56B to each other, are formed. In addition, a layer in which the memory connection portion 57A is formed and a layer in which the memory connection portion 57B is formed are changed, and thus the memory connection portions may be formed in a high density manner. Accordingly, for example, the memory columnar portions 56 of four columns may be formed in a zigzag arrangement in a single word line group WLG, thereby achieving a high density of memory cells. Hereinafter, the nonvolatile semiconductor memory device according to the first exemplary embodiment will be described in detail.

Overall Configuration Example

With reference to FIG. 1, an overall configuration example of the nonvolatile semiconductor memory device will now be described.

As illustrated in FIG. 1, the nonvolatile semiconductor memory device includes a control circuit 10, a sense amplifier 4, a memory cell array 5, a column decoder 6, a row decoder 7, a word line driving circuit 13, select gate line driving circuits (a source side select gate line driving circuit 14 and a drain side select gate line driving circuit 15), a source line driving circuit 17, and a back gate line driving circuit 18.

The memory cell array 5 includes a plurality of blocks BLK. Each of the plurality of blocks BLK includes a plurality of word lines WL and bit lines BL, and a plurality of memory strings (NAND strings) 40 arranged in a matrix.

The control circuit 10 generates and controls voltages which are supplied to the memory cells of the memory cell array 5 during a write operation, a read operation, and an erasure operation, and controls the sense amplifier 4, the column decoder 6, the row decoder 7, the select gate line driving circuits, the source line driving circuit 17, and the back gate line driving circuit 18, in response to commands input from an external device.

The column decoder 6 selects the bit line BL during a write operation, a read operation, and an erasure operation, under the control of the control circuit 10.

The sense amplifier 4 is connected to the column decoder 6, and supplies voltages to the bit lines BL which are selected and are not selected by the column decoder 6, during a write operation, a read operation, and an erasure operation. In addition, the sense amplifier 4 may be integrally formed with the column decoder 6.

The row decoder 7 selects the word line WL during a write operation, a read operation, and an erasure operation, under the control of the control circuit 10.

The word line driving circuit 13 is connected to the row decoder 7, and supplies voltages to the word lines WL which are selected and are not selected by the row decoder 7 during a write operation, a read operation, and an erasure operation. In addition, the word line driving circuit 13 may be integrally formed with the row decoder 7.

The select gate line driving circuits supply a voltage to a select gate SG during a write operation, a read operation, and an erasure operation, under the control of the control circuit 10.

The source line driving circuit 17 supplies a voltage to a source line SL during a write operation, a read operation, and an erasure operation, under the control of the control circuit 10.

The back gate line driving circuit 18 supplies a voltage to a back gate BG during a write operation, a read operation, and an erasure operation, under the control of the control circuit 10.

Configuration Example of Memory Cell Array

Hereinafter, a configuration example of the memory cell array according to the first exemplary embodiment will be described with reference to FIGS. 2 and 3.

Figure 2:
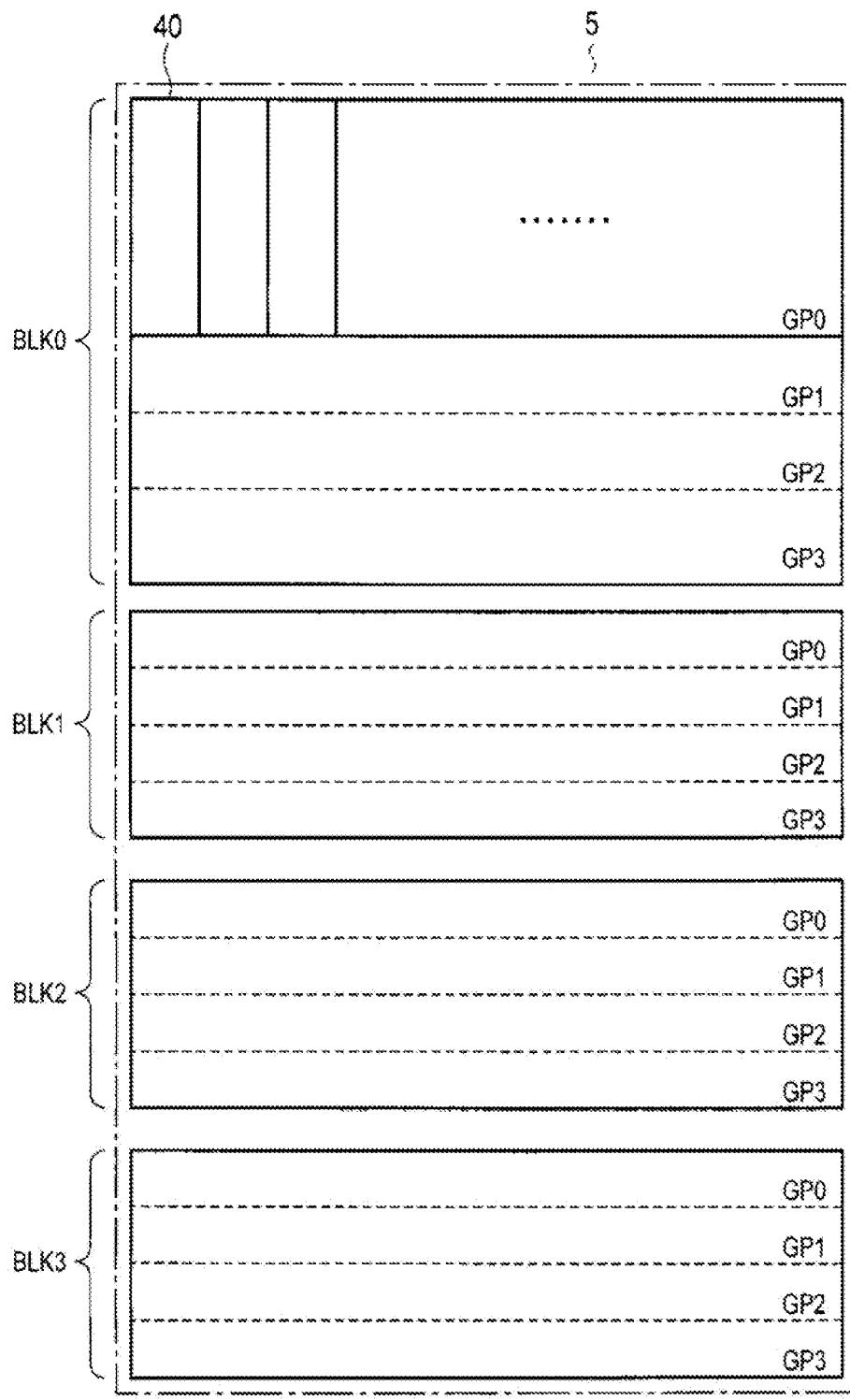
FIG. 2 is a block diagram illustrating a memory cell array according to the first exemplary embodiment.

As illustrated in FIG. 2, the memory cell array 5 includes a plurality of blocks (here, blocks BLK0 to BLK3). Each of the blocks BLK has a plurality of memory groups (here, memory groups GP0 to GP3). Each memory group GP has a plurality of memory strings 40. An erasure operation is performed, for example, for each block BLK in the memory cell array 5. In addition, in the following description, unless particularly differentiated from each other, the blocks BLK0 to BLK3 are simply referred to as a block BLK, and the memory groups GP0 to GP3 are simply referred to as a memory group GP, in some cases.

Figure 3:
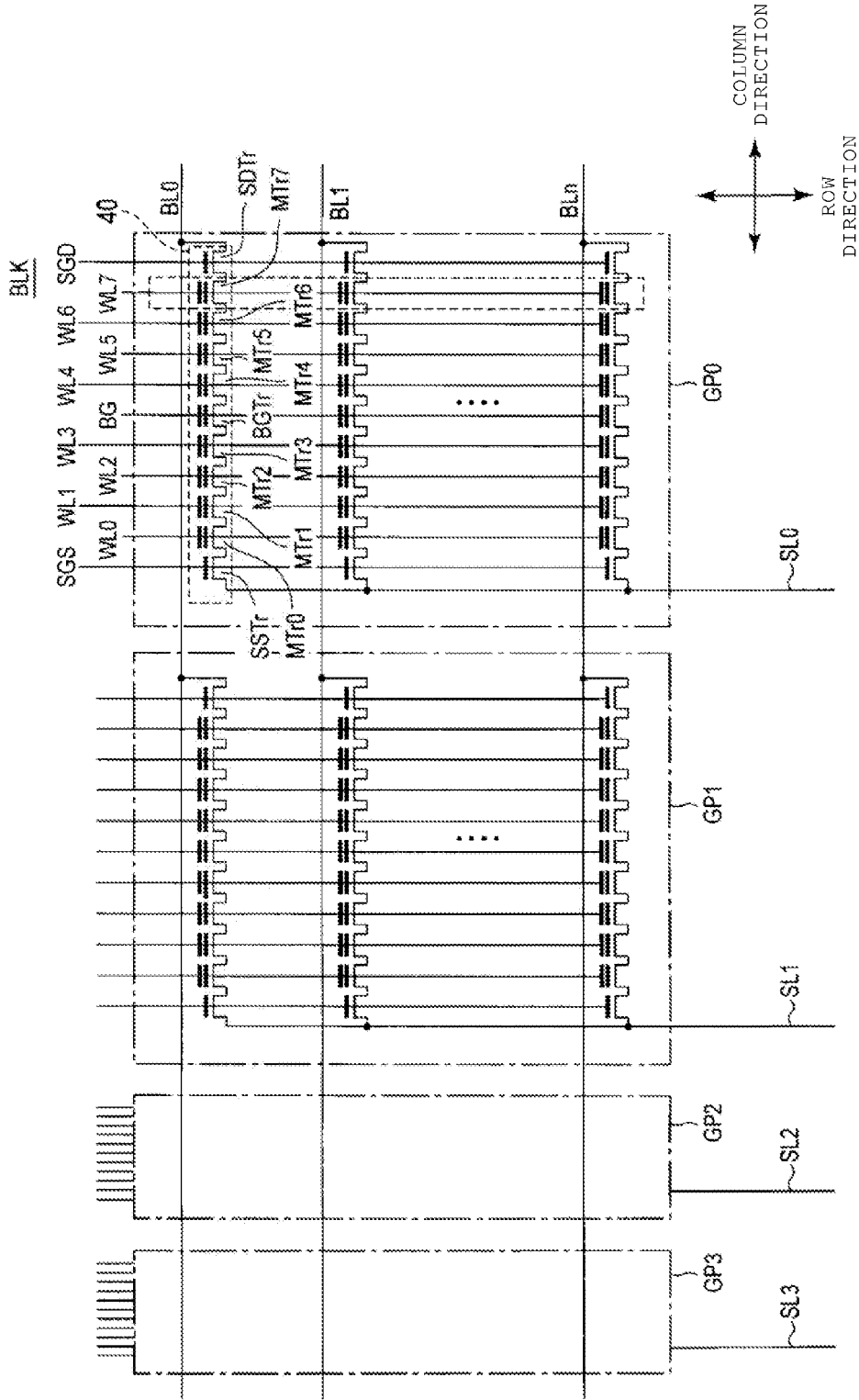
FIG. 3 is a circuit diagram illustrating a block according to the first exemplary embodiment.

FIG. 3 illustrates a circuit configuration of the block BLK illustrated in FIG. 2. This circuit configuration is disclosed in, for example, Japanese Patent Application No. 2012-165637, filed on Jul. 26, 2012, entitled "nonvolatile semiconductor memory device". The overall content of the patent application is incorporated by reference in the present application.

In addition, each word line WL may be directly shared by all the memory groups GP of the block BLK, and may be shared in an extraction part from the memory cell array 5.

As described above, data items of memory cell transistors MTr of the same block BLK are collectively erased, for example. In contrast, data reading and writing are collectively performed on a plurality of memory cell transistors MTr which are connected in common to any one of the word lines WL in any one of memory groups GP of any one of the blocks BLK. This unit is referred to as a "page".

A configuration of the memory cell array is disclosed in, for example, U.S. patent application Ser. No. 12/407,403, filed on Mar. 19, 2009, entitled "three-dimensional stacked nonvolatile semiconductor memory". In addition, a configuration thereof is disclosed in U.S. patent application Ser. No. 12/406,524, filed on Mar. 18, 2009, entitled "three-dimensional stacked nonvolatile semiconductor memory", U.S. patent application Ser. No. 12/679,991, filed on Mar. 25, 2010, entitled "nonvolatile semiconductor memory device and manufacturing method thereof", and U.S. patent application Ser. No. 12/532,030, filed on Mar. 23, 2009, entitled "semiconductor memory and manufacturing method thereof". The overall contents of the patent applications are incorporated by reference in the present application.

In the memory cell array 5, the memory string 40 is formed over a semiconductor substrate, and includes the back gate BG, a plurality of word lines WL, the select gate SG, a U-shaped semiconductor pillar SP, and a memory layer.

A configuration of the memory string 40 is disclosed in, for example, Japanese Patent Application No. 2012-165637, filed on Jul. 26, 2012, entitled "nonvolatile semiconductor memory device".

In the following description, a columnar portion of the U-shaped semiconductor pillar SP and a memory layer formed around the columnar portion are referred to as a memory columnar portion 56, and a connection portion of the U-shaped semiconductor pillar SP and a memory layer formed around the connection portion are referred to as a memory connection portion 57.

Configuration Example of Memory String Unit

Hereinafter, with reference to FIGS. 4 to 8, a configuration example of a memory string unit STU according to the first exemplary embodiment will be described. In the following, the memory string unit STU will be described as an aggregate of memory strings including four memory strings which are adjacent to each other in a column direction and a row direction.

Figure 4:
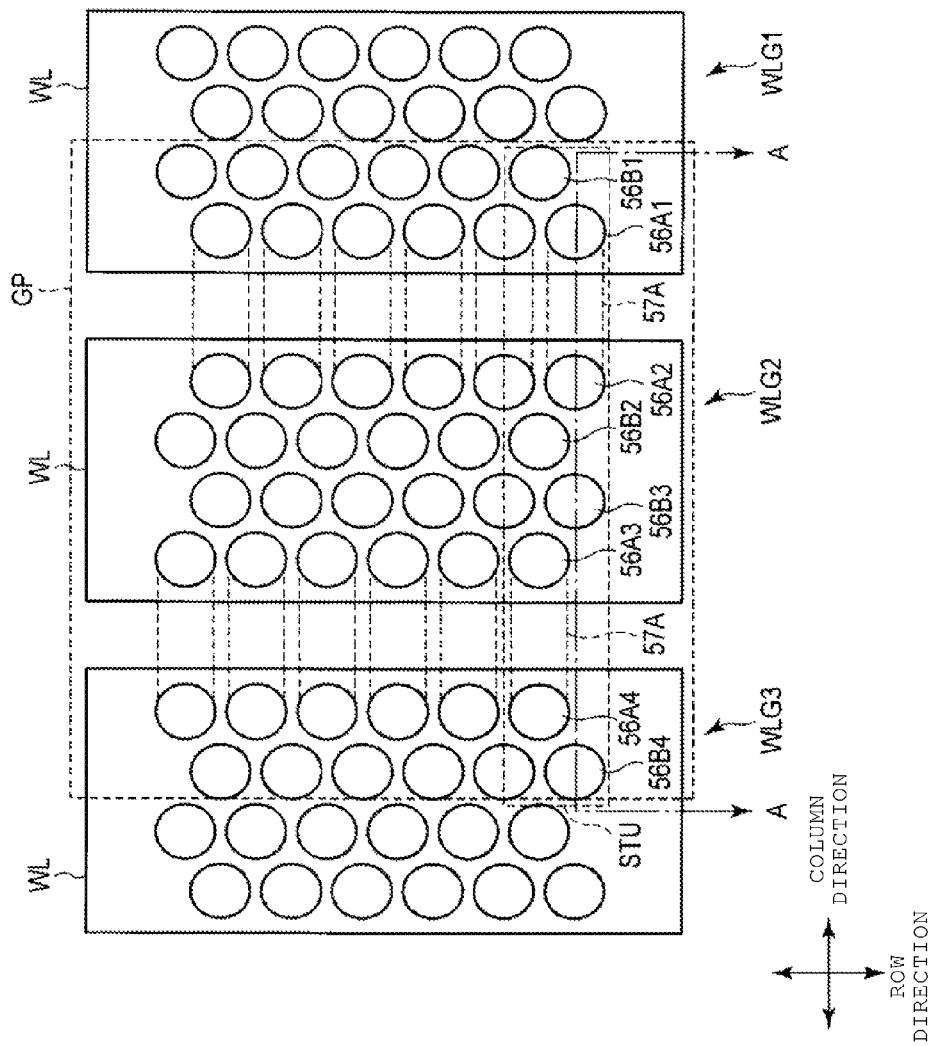
FIG. 4 is a plan view illustrating a memory string unit according to the first exemplary embodiment.

As illustrated in FIGS. 4 and 5, the memory cell array includes a plurality of word line groups WLG. Each of the word line groups WLG has a plurality of stacked word lines WL, each of which extends in the row direction.

The memory string unit STU is formed over three word line groups WLG1, WLG2 and WLG3 adjacent to each other in the column direction. The memory string unit STU is used as the basic unit and is disposed in a matrix in the column direction and the row direction, thereby forming the memory cell array 5. In addition, the memory string units STU arranged in the row direction correspond to the above-described memory group GP.

As illustrated in FIG. 6, for example, a single drain side select gate SGD is formed over the word line group WLG1, a single source side select gate SGS is formed over the word line group WLG2, and a single drain side select gate SGD is formed over the word line group WLG3.

In addition, the bit lines BL which extend in the column direction are formed over the select gates SG. Four bit lines BL0 to BL3 are disposed over the memory string unit STU.

Hereinafter, the memory string unit STU will be described more in detail.

As illustrated in FIGS. 4 to 7, the memory string unit STU includes a first memory string to a fourth memory string.

The first memory string is constituted by the word line groups WLG1 and WLG2 adjacent to each other in the column direction, the pair of memory columnar portions 56A1 and 56A2, the memory connection portion 57A, the drain side select gate SGD, the source side select gate SGS, and a back gate BGA.

The memory columnar portion 56A1 is formed so as to extend in the stack direction and to penetrate through the drain side select gate SGD and the word line group WLG1. An upper end of the memory columnar portion 56A1 is electrically connected to the bit line BL1. On the other hand, a lower end of the memory columnar portion 56A1 reaches an upper surface of the back gate BGA, and is electrically connected to the memory connection portion 57A.

The memory columnar portion 56A2 is formed so as to extend in the stack direction and to penetrate through the source side select gate SGS and the word line group WLG2. The memory columnar portion 56A2 is disposed at the same position as the memory columnar portion 56A1 in the row direction. An upper end of the memory columnar portion 56A2 is electrically connected to the source line SL. On the other hand, a lower end of the memory columnar portion 56A2 reaches the upper surface of the back gate BGA, and is electrically connected to the memory connection portion 57A.

The memory connection portion 57A extends in the column direction and is formed inside the back gate BGA. The memory connection portion 57A is formed so as to be in contact with the lower end of the memory columnar portion 56A1 and the lower end of the memory columnar portion 56A2. Accordingly, the memory columnar portion 56A1, the memory connection portion 57A, and the memory columnar portion 56A2 are electrically connected to each other.

The second memory string is constituted by the word line groups WLG1 and WLG2 adjacent to each other in the column direction, the pair of memory columnar portions 56B1 and 56B2, the memory connection portion 57B, the drain side select gate SGD, the source side select gate SGS, and a back gate BGB.

The memory columnar portion 56B1 is formed so as to extend in the stack direction and to penetrate through the drain side select gate SGD and the word line group WLG1. The memory columnar portion 56B1 is disposed so as to be adjacent to the memory columnar portion 56A1 in the column direction. On the other hand, the memory columnar portion 56B1 is disposed so as to be deviated from the memory columnar portion 56A1 in the row direction. For this reason, the memory columnar portion 56B1 does not overlap the memory columnar portion 56A1 in the column direction, and partially overlaps the memory columnar portion 56A1 in the row direction. An upper end of the memory columnar portion 56B1 is electrically connected to the bit line BL3. On the other hand, a lower end of the memory columnar portion 56B1 reaches an upper surface of the back gate BGB, and is electrically connected to the memory connection portion 57B.

The memory columnar portion 56B2 is formed so as to extend in the stack direction and to penetrate through the source side select gate SGS and the word line group WLG2. The memory columnar portion 56B2 is disposed at the same position as the memory columnar portion 56B1 in the row direction. In addition, the memory columnar portion 56B2 is disposed so as to be adjacent to the memory columnar portion 56A2 in the column direction. An upper end of the memory columnar portion 56B2 is electrically connected to the source line SL. On the other hand, a lower end of the memory columnar portion 56B2 reaches the upper surface of the back gate BGB, and is electrically connected to the memory connection portion 57B.

The memory connection portion 57B extends in the column direction and is formed inside the back gate BGB. The memory connection portion 57B is formed so as to be in contact with the lower end of the memory columnar portion 56B1 and the lower end of the memory columnar portion 56B2. Accordingly, the memory columnar portion 56B1, the memory connection portion 57B, and the memory columnar portion 56B2 are electrically connected to each other.

The memory columnar portion 56A1 and the memory columnar portion 56A2 are disposed between the memory columnar portion 56B1 and the memory columnar portion 56B2 in the column direction. For this reason, a distance between the memory columnar portion 56A1 and the memory columnar portion 56A2 is smaller than a distance between the memory columnar portion 56B1 and the memory columnar portion 56B2. In other words, a dimension of the memory connection portion 57A in the column direction is smaller than a dimension of the memory connection portion 57B in the column direction.

In addition, a straight line is considered which connects a middle point of a line segment connecting the memory columnar portion 56A1 to the memory columnar portion 56A2 to a middle point of a line segment connecting the memory columnar portion 56B1 to the memory columnar portion 56B2. In this case, the memory columnar portion 56A1 and the memory columnar portion 56B1 are linearly symmetrical to the memory columnar portion 56A2 and the memory columnar portion 56B2 with respect to the straight line.

The third memory string is constituted by the word line groups WLG2 and WLG3 adjacent to each other in the column direction, a pair of memory columnar portions 56B3 and 56B4, the memory connection portion 57B, the source side select gate SGS, the drain side select gate SGD, and the back gate BGB.

The memory columnar portion 56B3 is formed so as to extend in the stack direction and to penetrate through the source side select gate SGS and the word line group WLG2. The memory columnar portion 56B3 is disposed at the same position as the memory columnar portion 56A2 in the row direction. In addition, the memory columnar portion 56B3 is disposed so as to be adjacent to the memory columnar portion 56B2 on aside opposite the memory columnar portion 56A2 in the column direction. An upper end of the memory columnar portion 56B3 is electrically connected to the source line SL. On the other hand, a lower end of the memory columnar portion 56B3 reaches the upper surface of the back gate BGB, and is electrically connected to the memory connection portion 57B.

The memory columnar portion 56B4 is formed so as to extend in the stack direction and to penetrate through the drain side select gate SGD and the word line group WLG3. The memory columnar portion 56B4 is disposed at the same position as the memory columnar portion 56B3 in the row direction. An upper end of the memory columnar portion 56B4 is electrically connected to the bit line BL0. On the other hand, a lower end of the memory columnar portion 56B4 reaches the upper surface of the back gate BGB, and is electrically connected to the memory connection portion 57B.

The memory connection portion 57B extends in the column direction and is formed inside the back gate BGB. The memory connection portion 57B is formed so as to be in contact with the lower end of the memory columnar portion 56B3 and the lower end of the memory columnar portion 56B4. Accordingly, the memory columnar portion 56B3, the memory connection portion 57B, and the memory columnar portion 56B4 are electrically connected to each other.

The fourth memory string is constituted by the word line groups WLG2 and WLG3 adjacent to each other in the column direction, a pair of memory columnar portions 56A3 and 56A4, the memory connection portion 57A, the source side select gate SGS, the drain side select gate SGD, and the back gate BGA.

The memory columnar portion 56A3 is formed so as to extend in the stack direction and to penetrate through the source side select gate SGS and the word line group WLG2. The memory columnar portion 56A3 is disposed at the same position as the memory columnar portion 56B2 in the row direction. In addition, the memory columnar portion 56A3 is disposed so as to be adjacent to the memory columnar portion 56B3 on a side opposite the memory columnar portion 56B2 in the column direction. An upper end of the memory columnar portion 56A3 is electrically connected to the source line SL. On the other hand, a lower end of the memory columnar portion 56A3 reaches the upper surface of the back gate BGA, and is electrically connected to the memory connection portion 57A.

The memory columnar portion 56A4 is formed so as to extend in the stack direction and to penetrate through the drain side select gate SGD and the word line group WLG3. The memory columnar portion 56A4 is disposed at the same position as the memory columnar portion 56A3 in the row direction. In addition, the memory columnar portion 56A4 is disposed so as to be adjacent to the memory columnar portion 56B4 in the column direction. An upper end of the memory columnar portion 56A4 is electrically connected to the bit line BL2. On the other hand, a lower end of the memory columnar portion 56A4 reaches the upper surface of the back gate BGA, and is electrically connected to the memory connection portion 57A.

The memory connection portion 57A extends in the column direction and is formed inside the back gate BGA. The memory connection portion 57A is formed so as to be in contact with the lower end of the memory columnar portion 56A3 and the lower end of the memory columnar portion 56A4. Accordingly, the memory columnar portion 56A3, the memory connection portion 57A, and the memory columnar portion 56A4 are electrically connected to each other.

The memory columnar portion 56A3 and the memory columnar portion 56A4 are disposed between the memory columnar portion 56B3 and the memory columnar portion 56B4 in the column direction. For this reason, a distance between the memory columnar portion 56A3 and the memory columnar portion 56A4 is smaller than a distance between the memory columnar portion 56B3 and the memory columnar portion 56B4. In other words, a dimension of the memory connection portion 57A in the column direction is smaller than a dimension of the memory connection portion 57B in the column direction.

In addition, a straight line is considered which connects a middle point of a line segment connecting the memory columnar portion 56B3 to the memory columnar portion 56B4 to a middle point of a line segment connecting the memory columnar portion 56A3 to the memory columnar portion 56A4. In this case, the memory columnar portion 56B3 and the memory columnar portion 56A3 are linearly symmetrical to the memory columnar portion 56B4 and the memory columnar portion 56A4 with respect to the straight line.

As above, in each memory string unit STU, the four memory columnar portions 56 (the two memory columnar portions 56A and the two memory columnar portions 56B) are formed in a zigzag arrangement in a single word line group WLG. In other words, the four memory columnar portions 56 are disposed at the same position in the row direction every other memory columnar portion in the column direction.

The back gate BGA is formed on the back gate BGB via an insulating layer 71 which is a stopper film. In other words, the back gate BGB is formed in a lower layer than the back gate BGA. For this reason, the memory connection portion 57B is formed in a lower layer than the memory connection portion 57A. Further, the back gate BGB is electrically insulated from the back gate BGA by the insulating layer 71.

The back gate BGA is connected to a back gate line driving circuit 18A, and the back gate BGB is connected to a back gate line driving circuit 18B. Accordingly, the back gate BGA and the back gate BGB may be controlled independently. Therefore, it is possible to prevent a variation in an electrical characteristic due to the difference between the dimensions of the memory connection portion 57A formed inside the back gate BGA and the memory connection portion 57B formed inside the back gate BGB.

Figure 8:
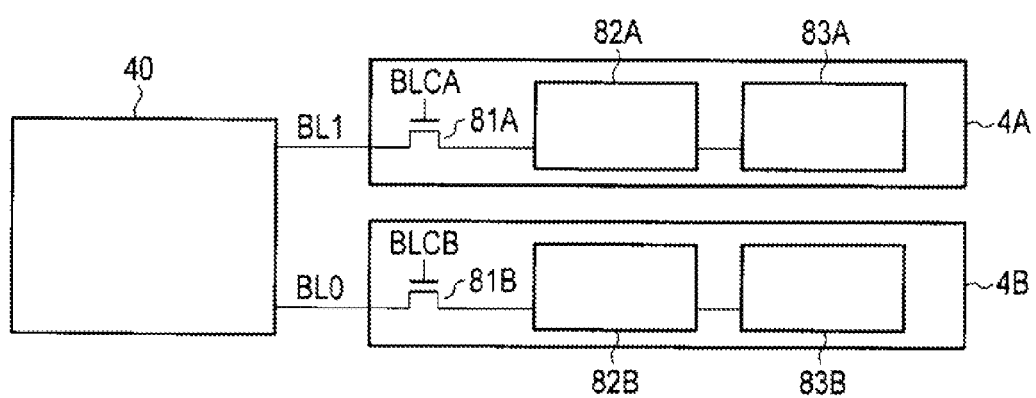
FIG. 8 is a block diagram illustrating a connection between a NAND string and a sense amplifier according to the first exemplary embodiment.

As illustrated in FIG. 8, the bit line BL1 is electrically connected to a sense amplifier 4A. The sense amplifier 4A includes a transistor 81A, a sense section 82A, and a latch section 83A.

One end of a current path of the transistor 81A is electrically connected to the bit line BL1, and the other end of the current path is electrically connected to the sense section 82A when a signal BLCA is applied to a gate of the transistor 81A. The transistor 81A is used to clamp the corresponding bit line BL1 to a potential corresponding to the signal BLCA.

The sense section 82A senses and amplifies data which is read to the bit line BL1, and applies a voltage to the bit line BL1 on the basis of data held by the latch section 83A. The latch section 83A holds data to be written which is received from the control circuit 10 when data is written. When data is read, data which is sensed and amplified by the sense section 82A is held and transmitted to the latch section 83A. In addition, if each memory cell transistor holds 2-bit or higher data, and the like, two or more latch sections 83A are provided.

The bit line BL0 is electrically connected to a sense amplifier 4B. The sense amplifier 4B includes a transistor 81B, a sense section 82B, and a latch section 83B. The sense amplifier 4B has the same configuration as the sense amplifier 4A, and thus description thereof will be omitted.

As described above, the bit line BL1, which is connected to the memory string including the memory connection portion 57A, is connected to the sense amplifier 4A. On the other hand, the bit line BL0, which is connected to the memory string including the memory connection portion 57B, is connected to the sense amplifier 4B. Accordingly, a signal BLCB and the signal BLCA may be separately controlled, thereby controlling the bit line BL0 and the bit line BL1 independently. Thus, in the same manner as in the back gate line driving circuits 18A and 18B, it is possible to prevent a variation in an electrical characteristic due to the difference between the dimensions of the memory connection portion 57A and the memory connection portion 57B.

Although not illustrated, the sense amplifiers 4 are separately connected to the bit line BL2 and the bit line BL3.

Effects of the First Exemplary Embodiment

According to the first exemplary embodiment, the first memory string including the pair of memory columnar portions 56A and the memory connection portion 57A connecting the memory columnar portions 56A to each other, and the second memory string including the pair of memory columnar portions 56B between which a distance is larger than a distance between the pair of memory columnar portions 56A and the memory connection portion 57B connecting the memory columnar portions 56B to each other, are formed. The first memory string and the second memory string are alternately disposed in the row direction. In addition, heights (layers) of the memory connection portion 57B and the memory connection portion 57A are changed, and thus the memory connection portions may be formed in a high density manner. Accordingly, the memory columnar portions 56 of four columns may be formed in a zigzag arrangement in a single word line group WLG, thereby achieving a high density of memory cells.

Modification Examples

Hereinafter, Modification Examples of the first exemplary embodiment will be described with reference to FIGS. 9 to 12.

If four memory columnar portions 56 are formed in a zigzag arrangement in the column direction in a single word line group WLG, when the number of select gates SG disposed over the single word line group WLG is n, and the number of bit lines BL disposed over the four memory columnar portions 56 is m, n=4/m is required to be satisfied. Accordingly, each memory cell may be selected and accessed.

Figure 9:
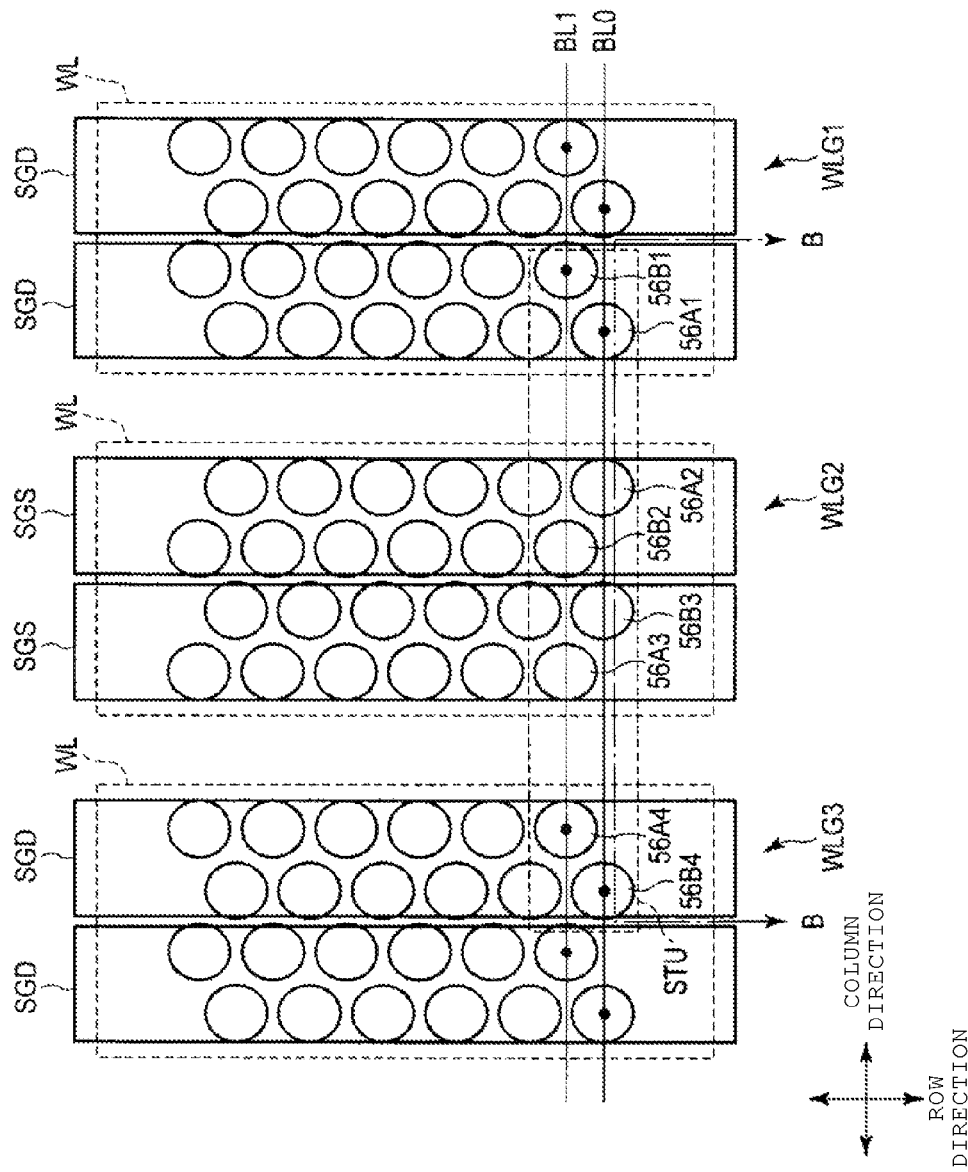
FIG. 9 is a plan view illustrating a memory string unit according to a first modification example of the first exemplary embodiment.
Figure 10:
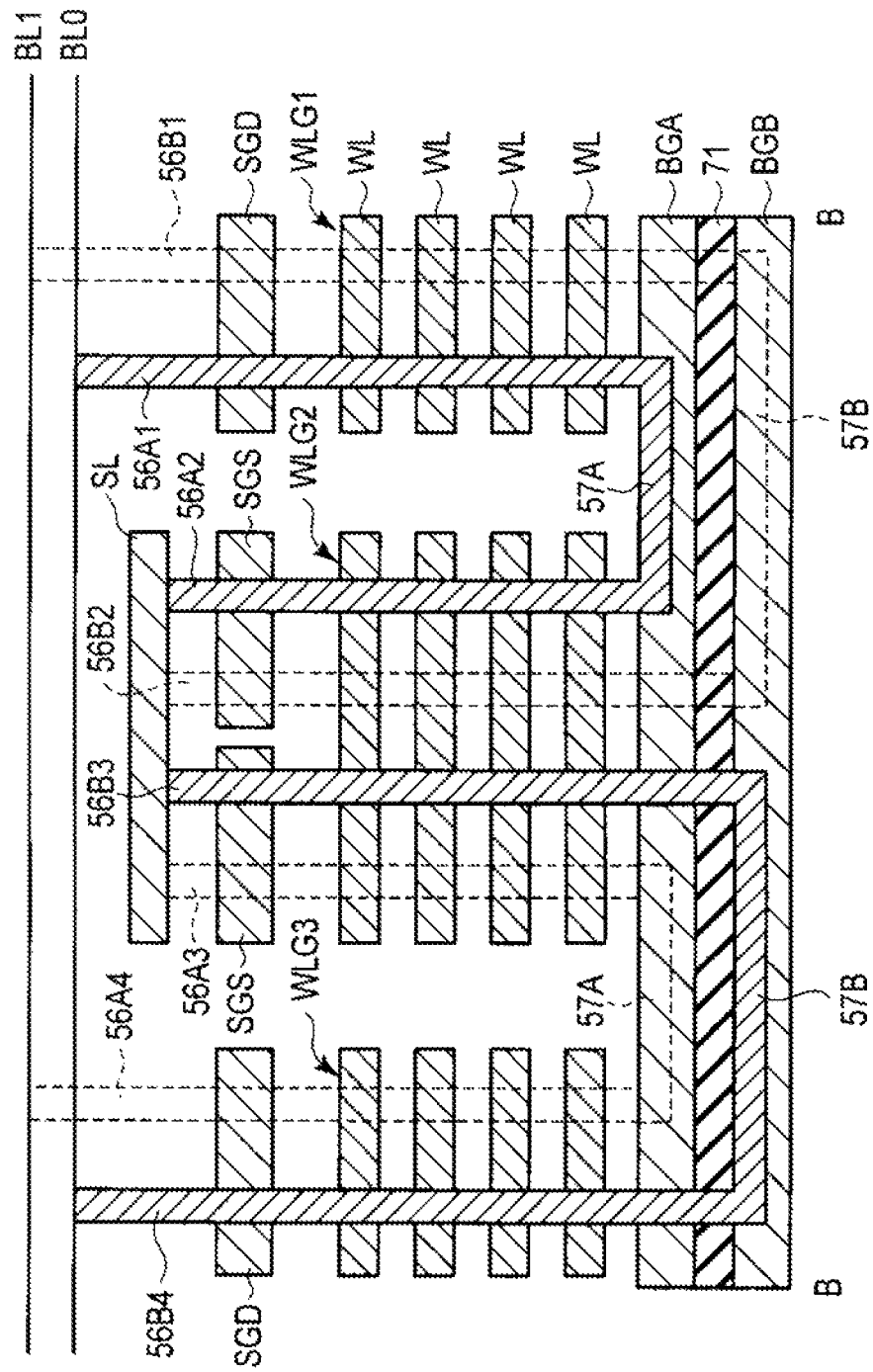
FIG. 10 is a cross-sectional view taken along the line B-B of FIG. 9.

As illustrated in FIGS. 9 and 10, in Modification Example 1, two select gates SG which are divided in the column direction are disposed over each word line group WLG. More specifically, two drain side select gates SGD are formed over the word line group WLG1, two source side select gates SGS are formed over the word line group WLG2, and two drain side select gates SGD are formed over the word line group WLG3. Two memory columnar portions 56 which are adjacent to each other in the column direction are formed in a zigzag arrangement in a single select gate SG.

In addition, the bit lines BL which extend in the column direction are formed over the select gate SG. Two bit lines BL0 and BL1 are disposed over the memory string unit STU.

The upper ends of the memory columnar portion 56A1 and the memory columnar portion 56B4 are electrically connected to the bit line BL0. The upper ends of the memory columnar portion 56B1 and the memory columnar portion 56A4 are electrically connected to the bit line BL0.

As illustrated in FIG. 8, the bit line BL1 is electrically connected to the sense amplifier 4A. In addition, the bit line BL0 is electrically connected to the sense amplifier 4B.

In this case, the bit line BL1 is connected to the memory string including the memory connection portion 57A with the small dimension and the memory string including the memory connection portion 57B with the large dimension. In other words, the sense amplifier 4A is required to supply a voltage to both of the memory connection portion 57A with the small dimension and the memory string including the memory connection portion 57B with the large dimension. For this reason, the sense amplifier 4A changes a supplied voltage in a case of accessing the memory string including the memory connection portion 57A with the small dimension and a case of accessing the memory string including the memory connection portion 57B with the large dimension. That is, the sense amplifier 4A changes the signal BLCA in a case of accessing the memory string including the memory connection portion 57A with the small dimension and a case of accessing the memory string including the memory connection portion 57B with the large dimension. Accordingly, it is possible to prevent a variation in an electrical characteristic due to the difference between the dimensions of the memory connection portion 57A and the memory connection portion 57B.

In addition, this is also the same for the sense amplifier 4B connected to the bit line BL0. In other words, the sense amplifier 4B changes the signal BLCB in a case of accessing the memory string including the memory connection portion 57A with the small dimension and a case of accessing the memory string including the memory connection portion 57B with the large dimension.

According to Modification Example 1, the two select gates SG which are separated in the column direction are provided over each word line group WLG, and the two bit lines BL0 and BL1 are provided over the memory string unit STU. In other words, each memory cell may be accessed even if the number of bit lines BL is decreased, by increasing the number of select gates SG. Accordingly, since the number of bit lines BL is decreased, a pitch problem of the bit line BL due to the high density may be prevented.

Figure 11:
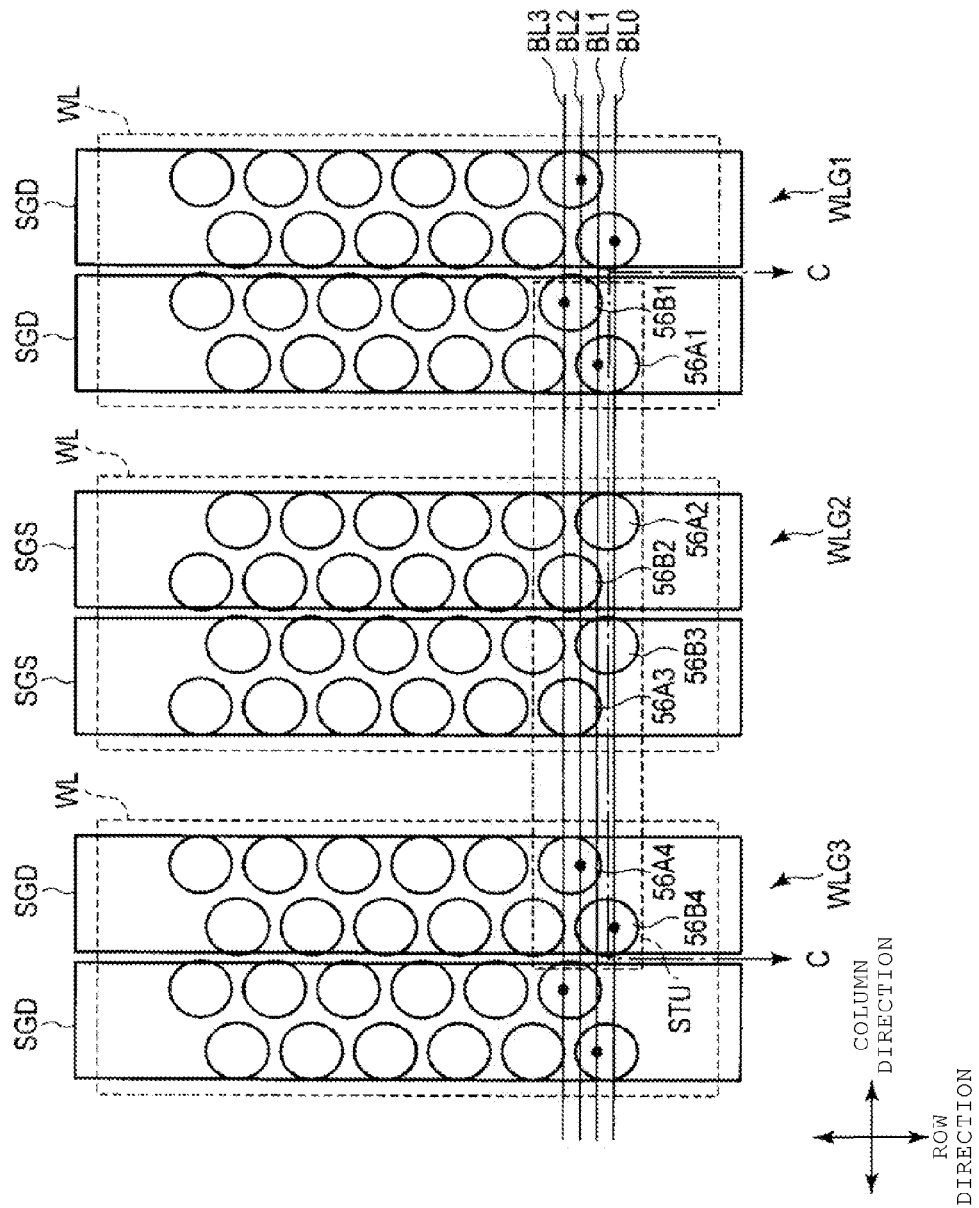
FIG. 11 is a plan view illustrating a memory string unit according to a second modification example of the first exemplary embodiment.
Figure 12:
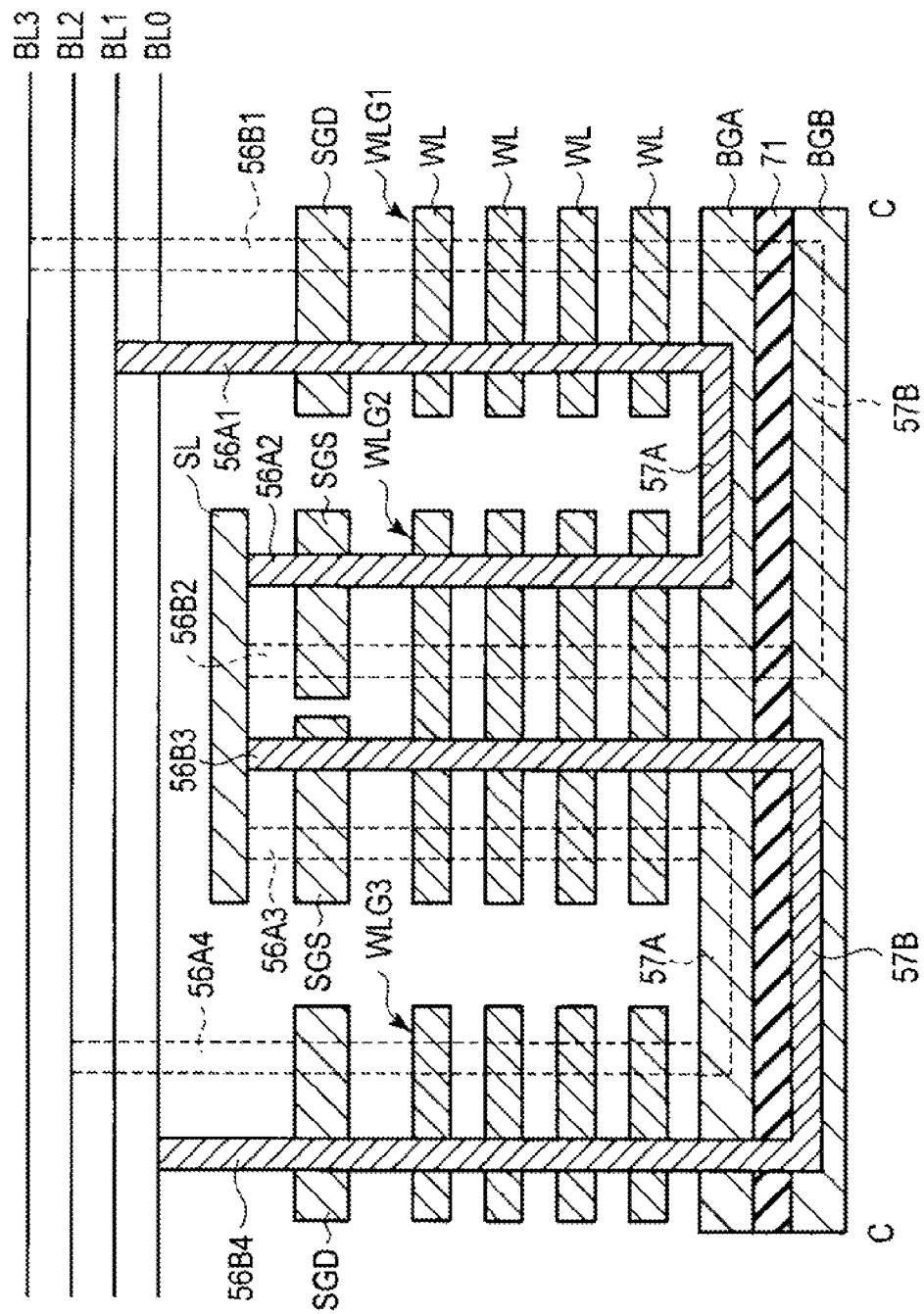
FIG. 12 is a cross-sectional view taken along the line C-C of FIG. 11.

As illustrated in FIGS. 11 and 12, in Modification Example 2, two select gates SG which are divided in the column direction are formed over each word line group WLG. More specifically, two drain side select gates SGD are formed over the word line group WLG1, two source side select gates SGS are formed over the word line group WLG2, and two drain side select gates SGD are formed over the word line group WLG3. Two memory columnar portions 56 which are adjacent to each other in the column direction are formed in a zigzag arrangement in a single select gate SG.

In addition, the bit lines BL which extend in the column direction are formed over the select gate SG. Four bit lines BL0 to BL3 are disposed over the memory string unit STU.

An upper end of the memory columnar portion 56A1 is electrically connected to the bit line BL1. An upper end of the memory columnar portion 56B1 is electrically connected to the bit line BL3. An upper end of the memory columnar portion 56B4 is electrically connected to the bit line BL0. An upper end of the memory columnar portion 56A4 is electrically connected to the bit line BL2.

According to Modification Example 2, the two select gates SG which are separated in the column direction are provided over each word line group WLG, and the four bit lines BL0 to BL3 are provided over the memory string unit STU. In other words, the number of bit lines BL and the number of select gates SG are made larger than the number in which each memory cell may be selected and accessed. Accordingly, an access region may be more selectively divided.

Second Exemplary Embodiment

A nonvolatile semiconductor memory device according to a second exemplary embodiment will be described with reference to FIGS. 13 to 17. In the second exemplary embodiment, a NAND string including a pair of memory columnar portions 56C having a larger width therebetween and a memory connection portion 57C is formed. In addition, a layer in which the memory connection portion 57A is formed, a layer in which the memory connection portion 57B is formed, and a layer in which the memory connection portion 57C, are changed, and thus the memory connection portions may be formed in a high density manner. Accordingly, the memory columnar portions 56 of six columns may be formed in a zigzag arrangement in a single word line group WLG, thereby achieving a high density of memory cells. Hereinafter, the nonvolatile semiconductor memory device according to the second exemplary embodiment will be described in detail.

In addition, in the second exemplary embodiment, description of the same configuration as in the first exemplary embodiment will be omitted, and different configurations will be described mainly.

Configuration Example of Memory String Unit

Hereinafter, with reference to FIGS. 13 to 17, a configuration example of a memory string unit STU according to the second exemplary embodiment will be described. Here, the memory string unit STU is an aggregate of memory strings including six memory strings which are adjacent to each other in the column direction and the row direction.

Figure 13:
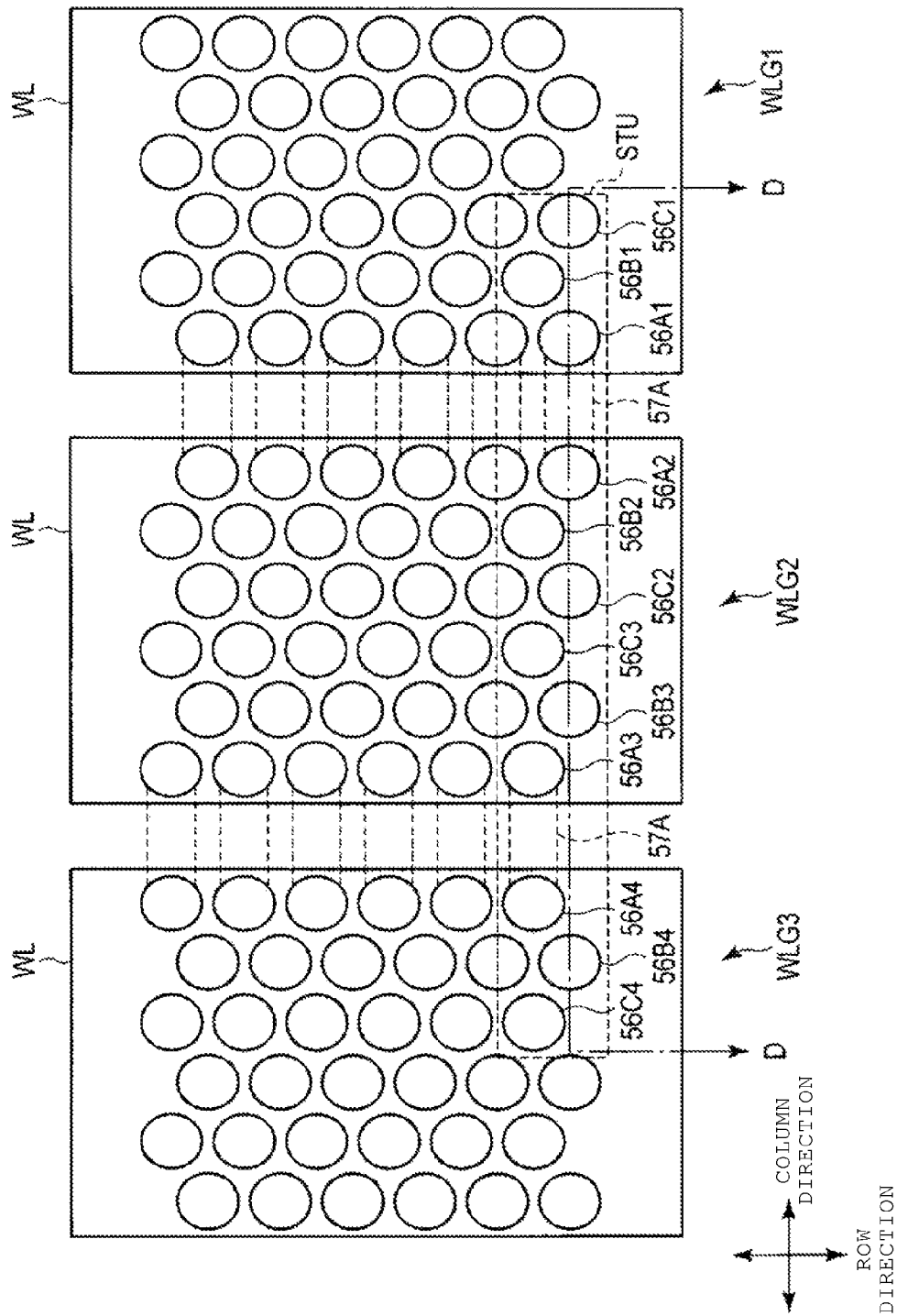
FIG. 13 is a plan view illustrating a memory string unit according to a second exemplary embodiment.
Figure 14:
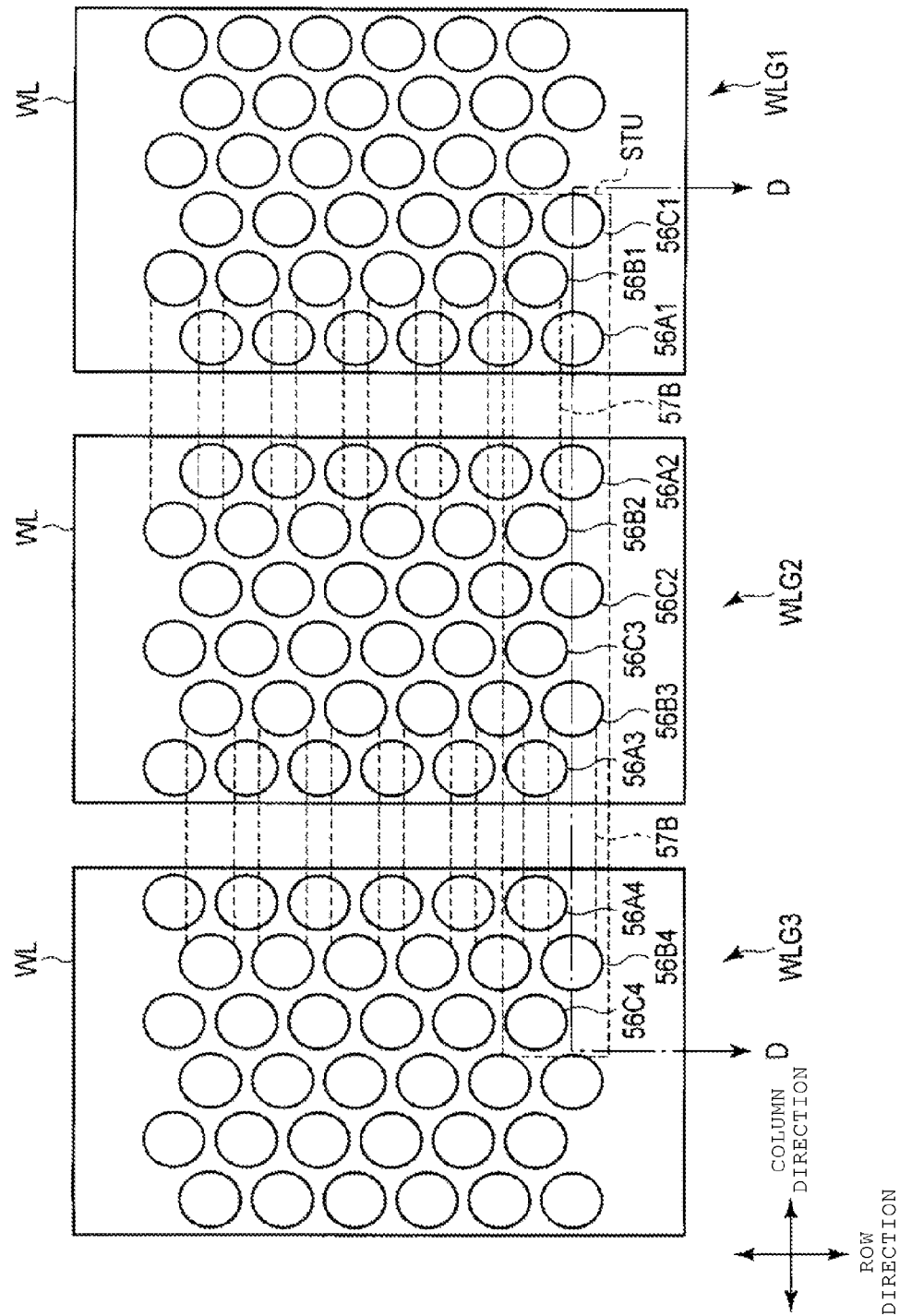
FIG. 14 is a plan view illustrating a memory string unit according to the second exemplary embodiment.
Figure 15:
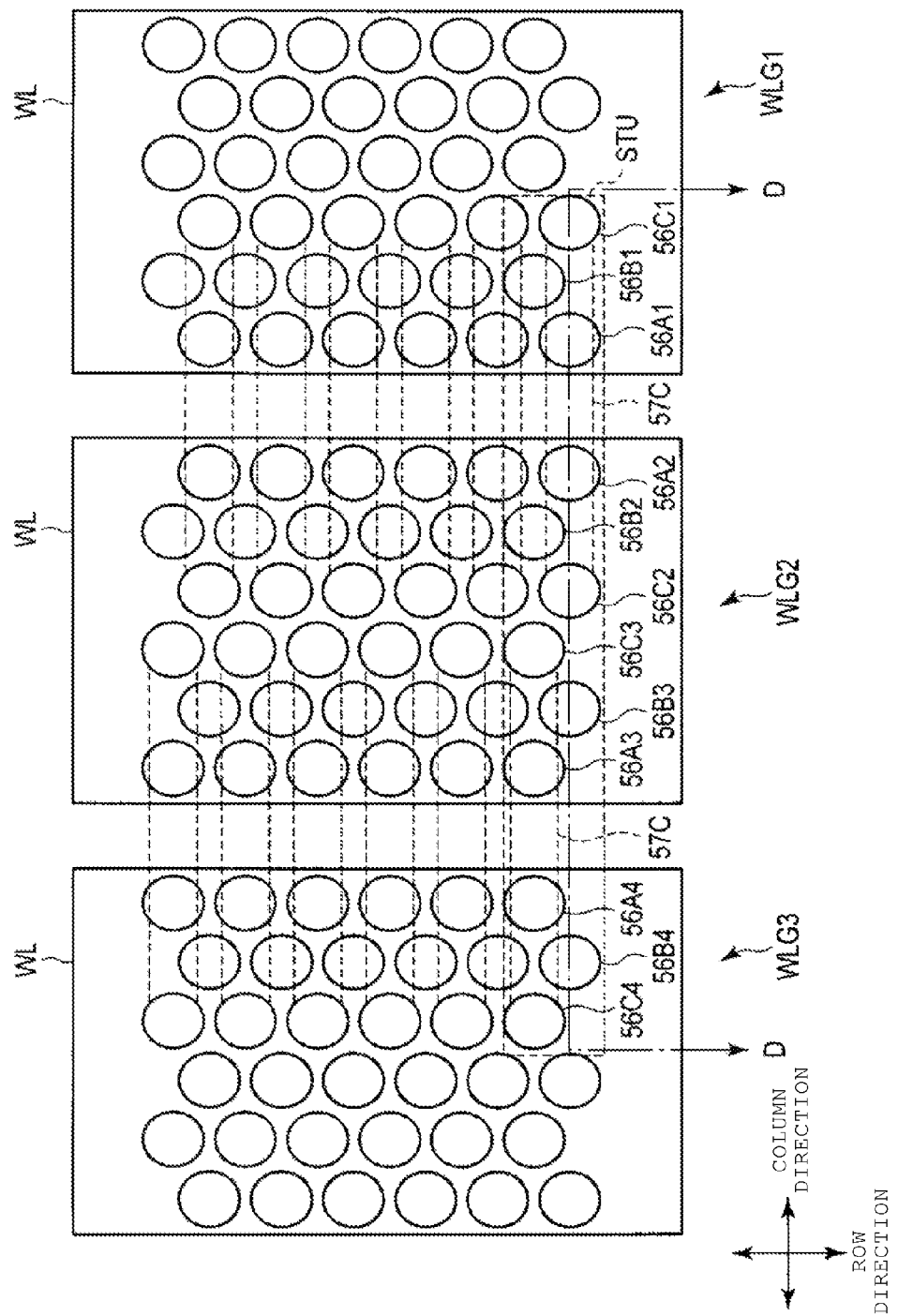
FIG. 15 is a plan view illustrating a memory string unit according to the second exemplary embodiment.

As illustrated in FIGS. 13 to 15, the memory cell array includes a plurality of memory string units arranged in the column direction and the row direction. Each memory string unit STU is formed over three word line groups WLG1, WLG2 and WLG3 adjacent to each other in the column direction.

Figure 16:
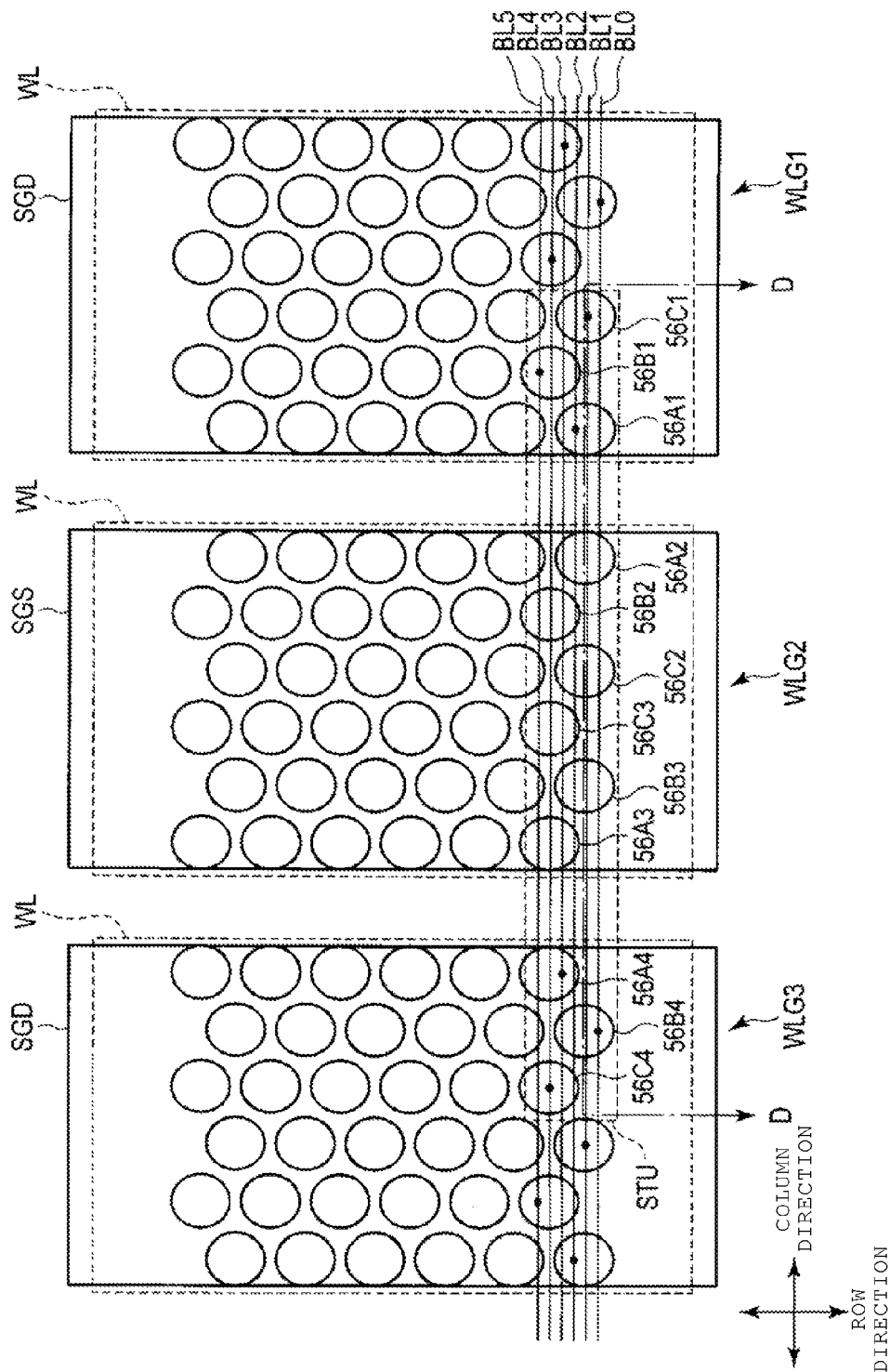
FIG. 16 is a plan view illustrating a memory string unit according to the second exemplary embodiment.
Figure 17:
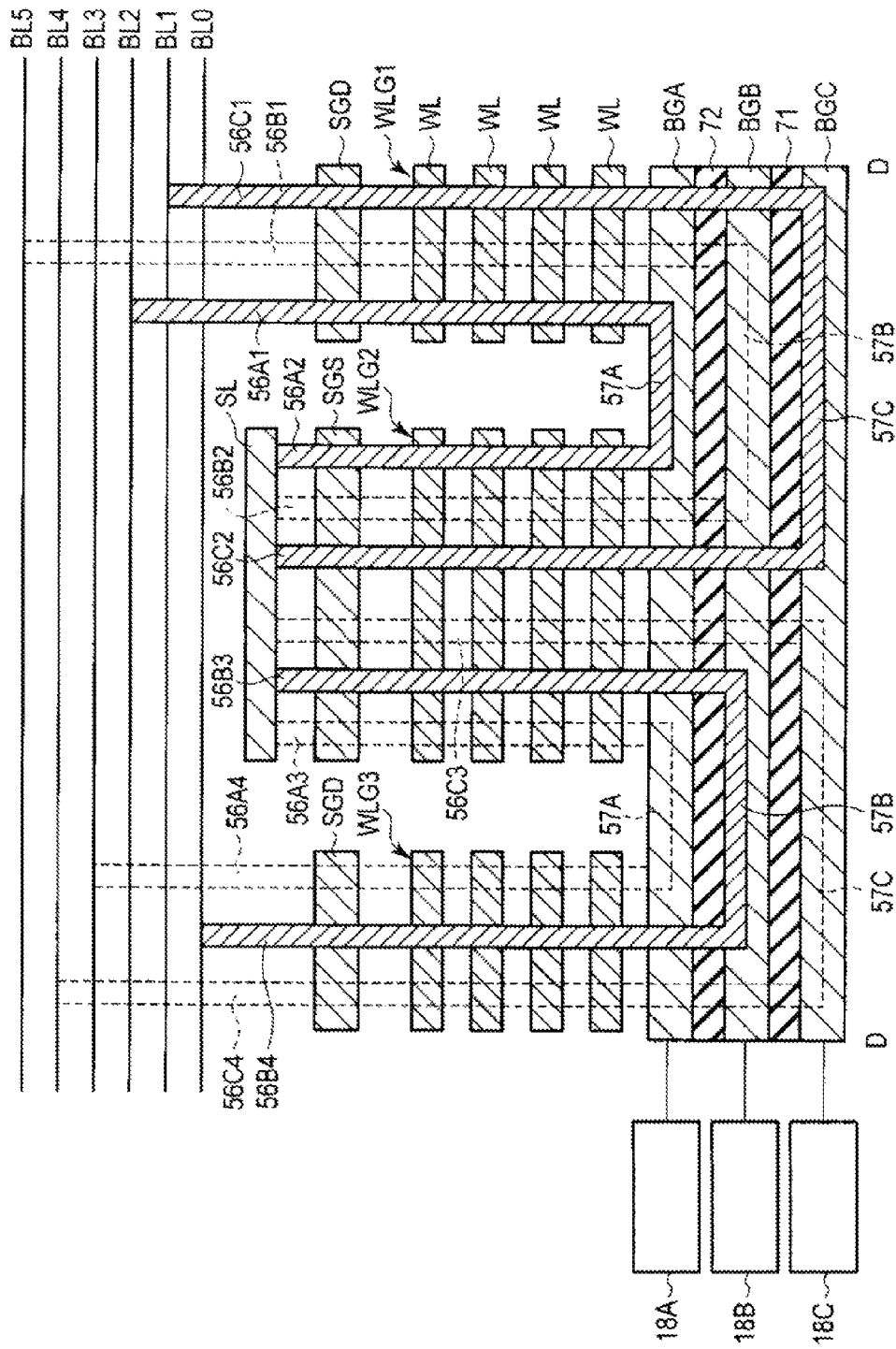
FIG. 17 is a cross-sectional view taken along the line D-D of FIGS. 13 to 16.
Figure 18:
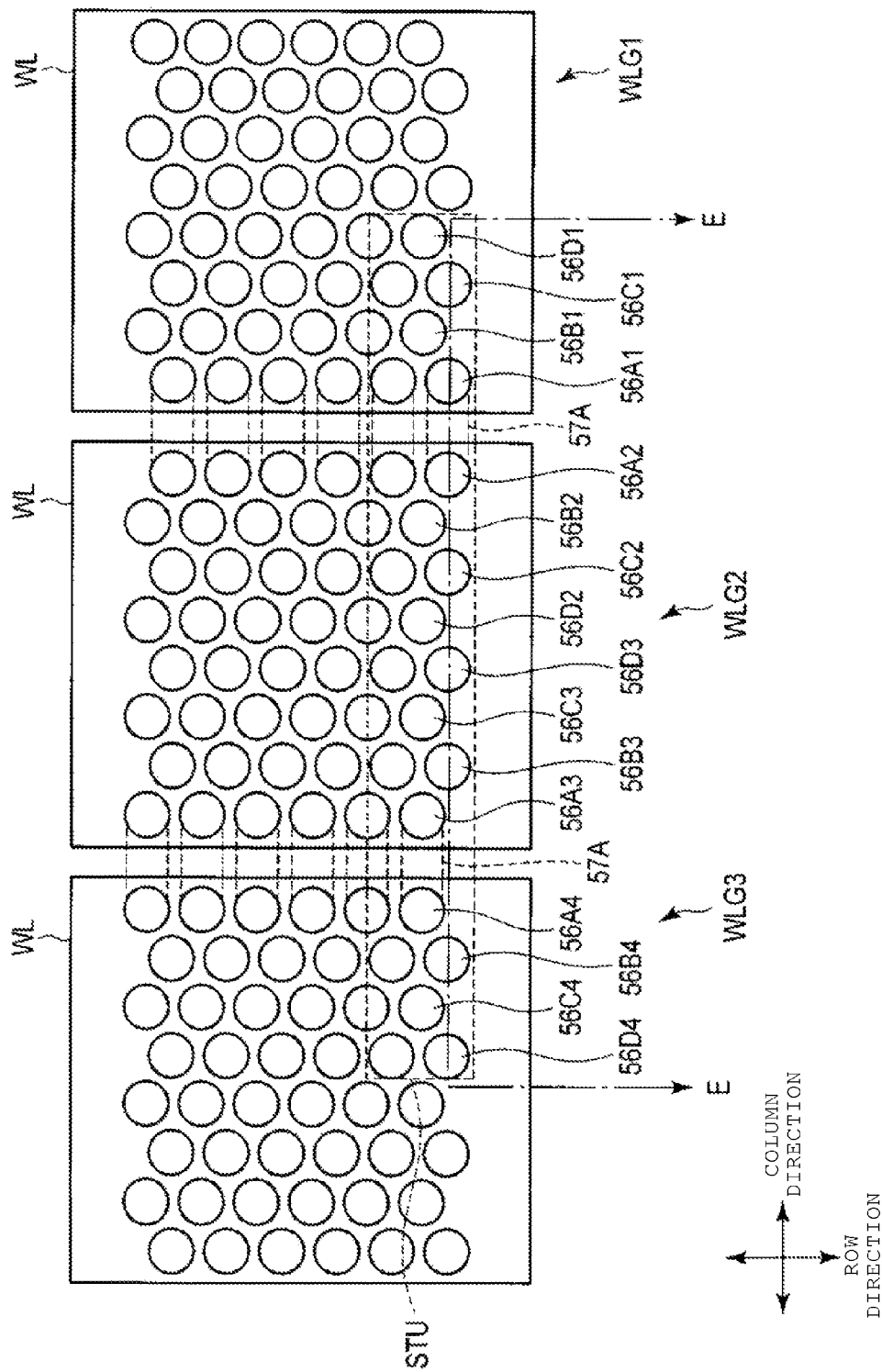
FIG. 18 is a plan view illustrating a memory string unit according to a third exemplary embodiment.
Figure 19:
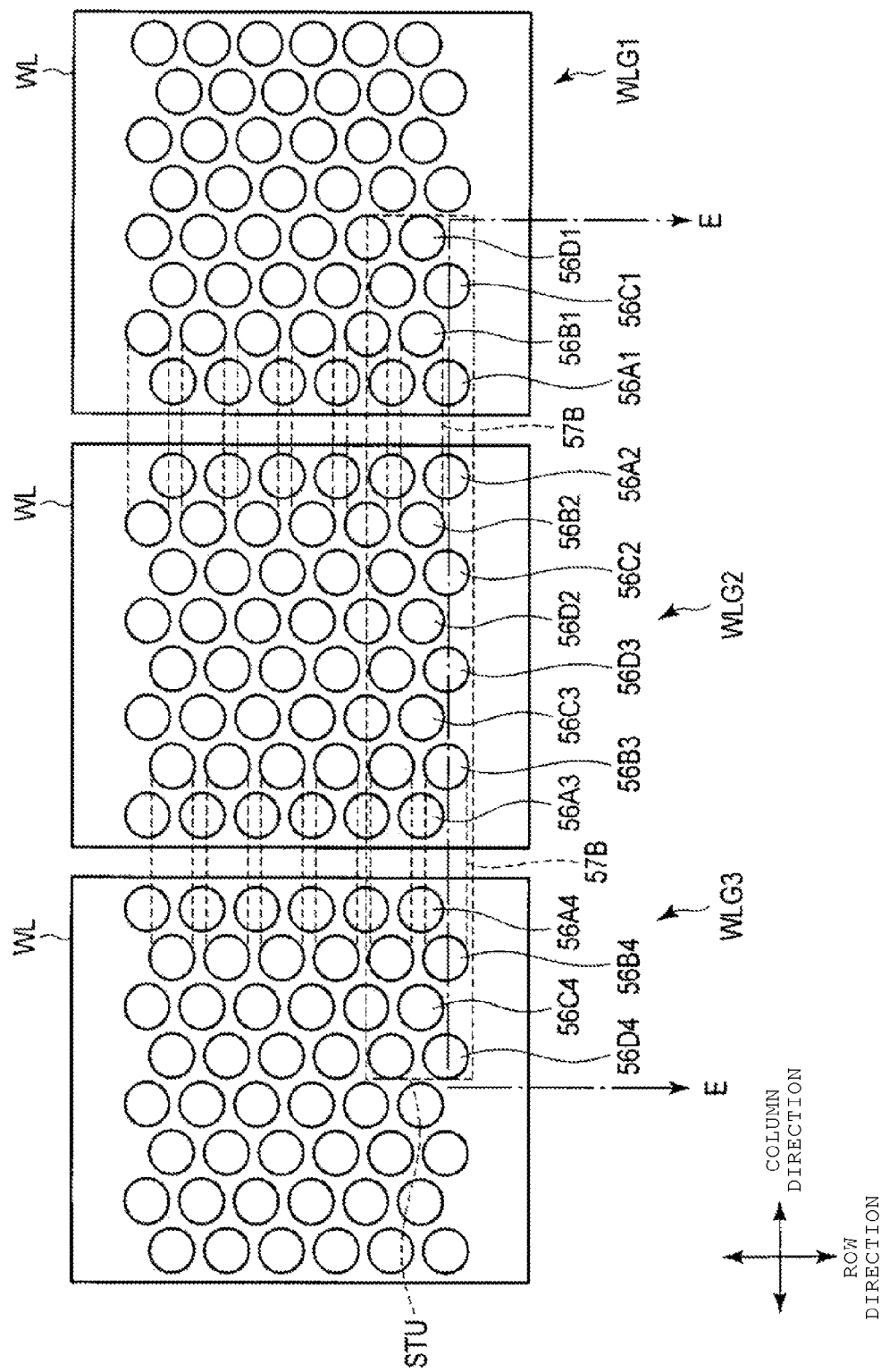
FIG. 19 is a plan view illustrating a memory string unit according to the third exemplary embodiment.
Figure 20:
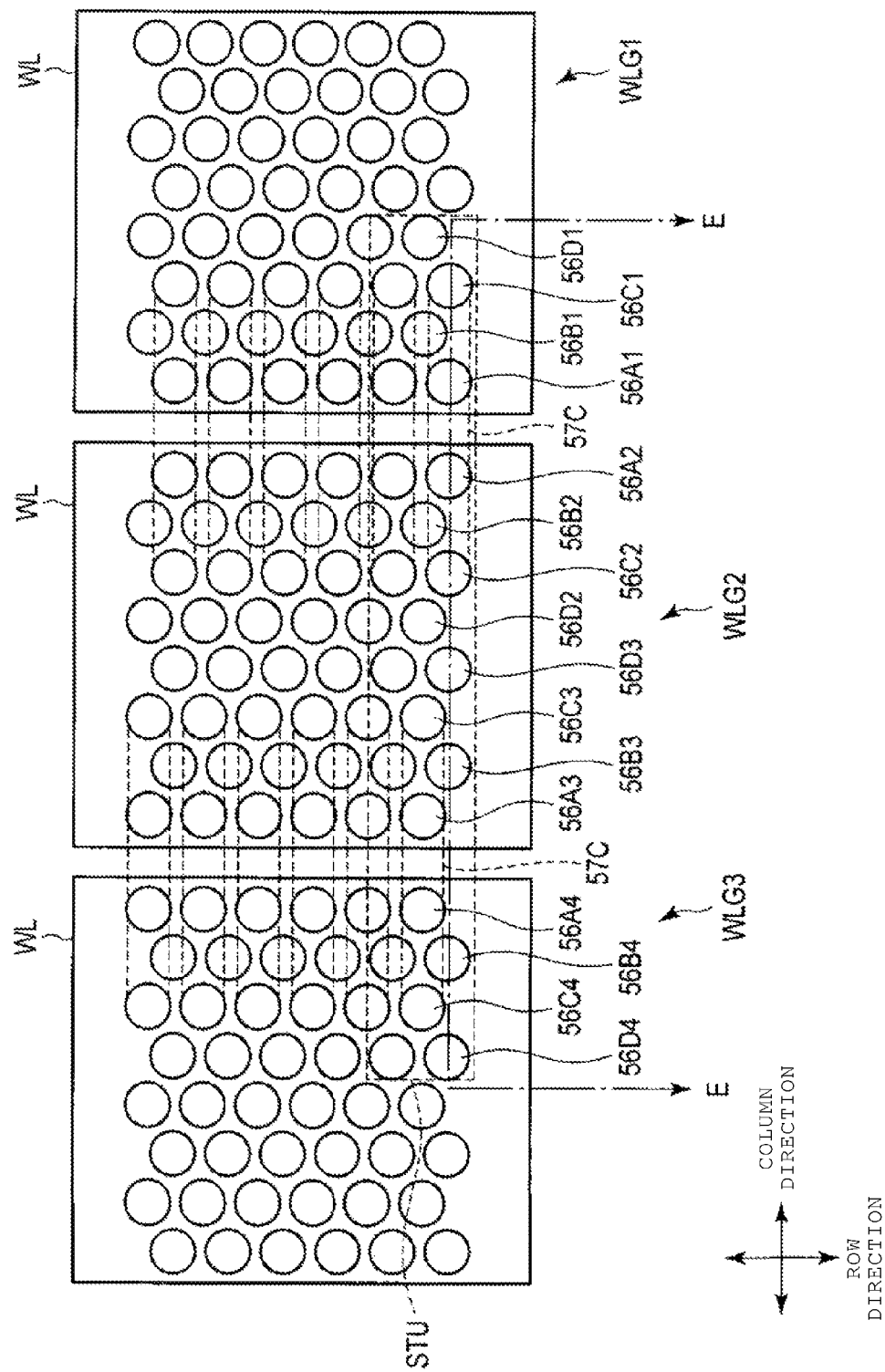
FIG. 20 is a plan view illustrating a memory string unit according to the third exemplary embodiment.
Figure 21:
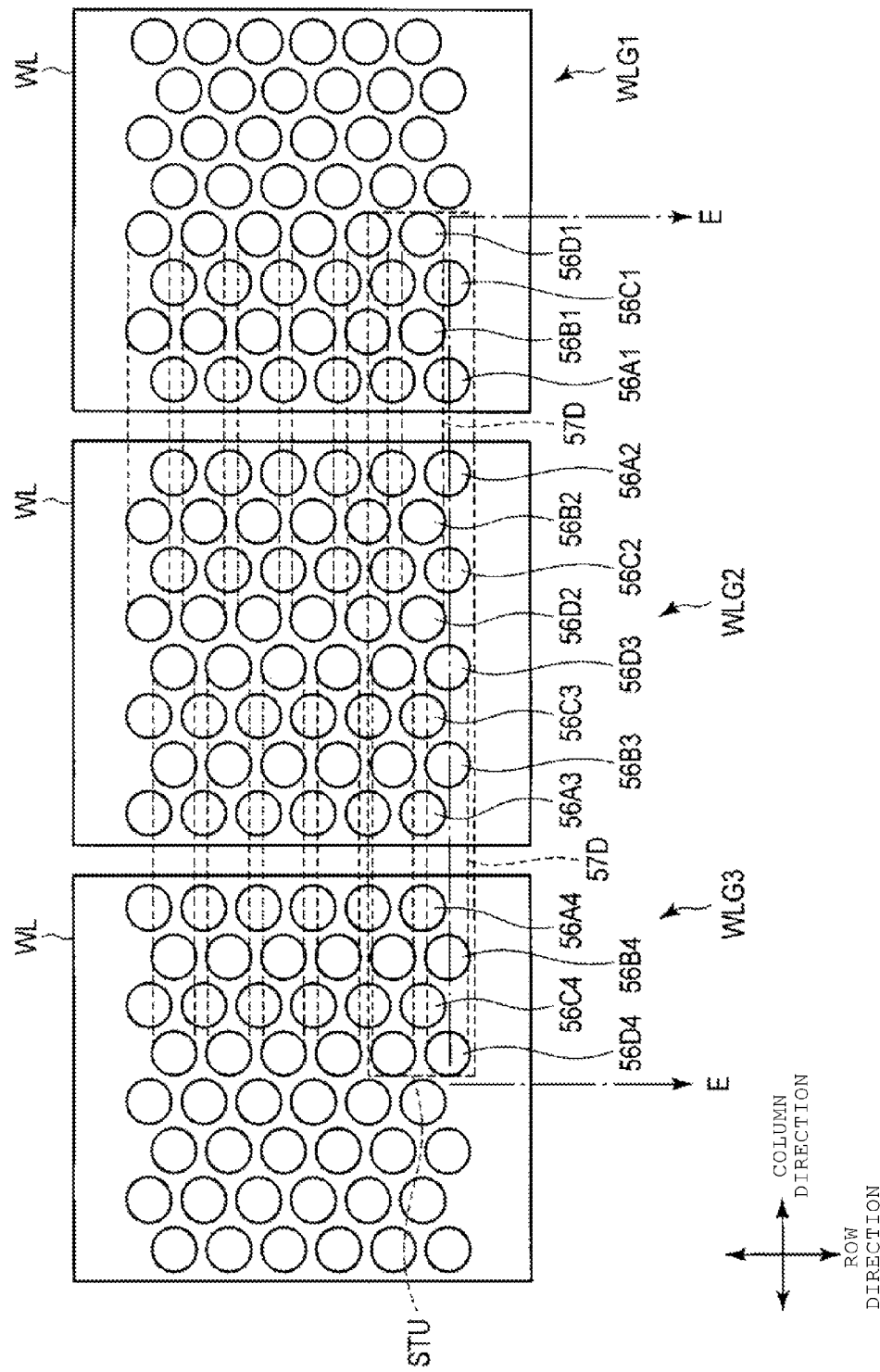
FIG. 21 is a plan view illustrating a memory string unit according to the third exemplary embodiment.

As illustrated in FIG. 16, a single select gate SG is formed over each word line group WLG. More specifically, a single drain side select gate SGD is formed over the word line group WLG1, a single source side select gate SGS is formed over the word line group WLG2, and a single drain side select gate SGD is formed over the word line group WLG3.

In addition, the bit lines BL which extend in the column direction are formed over the select gates SG. Six bit lines BL0 to BL5 are disposed over the memory string unit STU.

Hereinafter, the memory string unit STU will be described more in detail.

As illustrated in FIGS. 13 to 17, the memory string unit STU includes a first memory string to a sixth memory string.

The first memory string is constituted by the word line groups WLG1 and WLG2 adjacent to each other in the column direction, the pair of memory columnar portions 56A1 and 56A2, the memory connection portion 57A, the drain side select gate SGD, the source side select gate SGS, and the back gate BGA. An upper end of the memory columnar portion 56A1 is electrically connected to the bit line BL2.

The second memory string is constituted by the word line groups WLG1 and WLG2 adjacent to each other in the column direction, the pair of memory columnar portions 56B1 and 56B2, the memory connection portion 57B, the drain side select gate SGD, the source side select gate SGS, and the back gate BGB. An upper end of the memory columnar portion 56B1 is electrically connected to the bit line BL5.

The third memory string is constituted by the word line groups WLG2 and WLG3 adjacent to each other in the column direction, the pair of memory columnar portions 56B3 and 56B4, the memory connection portion 57B, the source side select gate SGS, the drain side select gate SGD, and the back gate BGB. An upper end of the memory columnar portion 56B4 is electrically connected to the bit line BL0.

The fourth memory string is constituted by the word line groups WLG2 and WLG3 adjacent to each other in the column direction, the pair of memory columnar portions 56A3 and 56A4, the memory connection portion 57A, the source side select gate SGS, the drain side select gate SGD, and the back gate BGA. An upper end of the memory columnar portion 56A4 is electrically connected to the bit line BL3.

The memory string unit STU according to the second exemplary embodiment further includes the fifth memory string and the sixth memory string.

The fifth memory string is constituted by the word line groups WLG1 and WLG2 adjacent to each other in the column direction, a pair of memory columnar portions 56C1 and 56C2, the memory connection portion 57C, the drain side select gate SGD, the source side select gate SGS, and a back gate BGC.

The memory columnar portion 56C1 is formed so as to extend in the stack direction and to penetrate through the drain side select gate SGD and the word line group WLG1. The memory columnar portion 56C1 is disposed so as to be adjacent to the memory columnar portion 56B1 on a side opposite the memory columnar portion 56A1 in the column direction. On the other hand, the memory columnar portion 56C1 is disposed at the same position as the memory columnar portion 56A1 in the row direction. An upper end of the memory columnar portion 56C1 is electrically connected to the bit line BL1. On the other hand, a lower end of the memory columnar portion 56C1 reaches an upper surface of the back gate BGC, and is electrically connected to the memory connection portion 57C.

The memory columnar portion 56C2 is formed so as to extend in the stack direction and to penetrate through the source side select gate SGS and the word line group WLG2. The memory columnar portion 56C2 is disposed at the same position as the memory columnar portion 56C1 in the row direction. In addition, the memory columnar portion 56C2 is disposed so as to be adjacent to the memory columnar portion 56B2 on a side opposite the memory columnar portion 56A2 in the column direction. An upper end of the memory columnar portion 56C2 is electrically connected to the source line SL. On the other hand, a lower end of the memory columnar portion 56C2 reaches the upper surface of the back gate BGC, and is electrically connected to the memory connection portion 57C.

The memory connection portion 57C extends in the column direction and is formed inside the back gate BGC. The memory connection portion 57C is formed so as to be in contact with the lower end of the memory columnar portion 56C1 and the lower end of the memory columnar portion 56C2. Accordingly, the memory columnar portion 56C1, the memory connection portion 57C, and the memory columnar portion 56C2 are electrically connected to each other.

The memory columnar portion 56A1 and the memory columnar portion 56A2, and the memory columnar portion 56B1 and the memory columnar portion 56B2 are disposed between the memory columnar portion 56C1 and the memory columnar portion 56C2 in the column direction. For this reason, each of a distance between the memory columnar portion 56A1 and the memory columnar portion 56A2 and a distance between the memory columnar portion 56B1 and the memory columnar portion 56B2 is smaller than a distance between the memory columnar portion 56C1 and the memory columnar portion 56C2. In other words, a dimension of each of the memory connection portions 57A and 57B in the column direction is smaller than a dimension of the memory connection portion 57C in the column direction.

The sixth memory string is constituted by the word line groups WLG2 and WLG3 adjacent to each other in the column direction, a pair of memory columnar portions 56C3 and 56C4, the memory connection portion 57C, the source side select gate SGS, the drain side select gate SGD, and the back gate BGC.

The memory columnar portion 56C3 is formed so as to extend in the stack direction and to penetrate through the source side select gate SGS and the word line group WLG2. The memory columnar portion 56C3 is disposed at the same position as the memory columnar portion 56A3 in the row direction. In addition, the memory columnar portion 56C3 is disposed so as to be adjacent to the memory columnar portion 56B3 on aside opposite the memory columnar portion 56A3 in the column direction. An upper end of the memory columnar portion 56C3 is electrically connected to the source line SL. On the other hand, a lower end of the memory columnar portion 56C3 reaches the upper surface of the back gate BGC, and is electrically connected to the memory connection portion 57C.

The memory columnar portion 56C4 is formed so as to extend in the stack direction and to penetrate through the drain side select gate SGD and the word line group WLG3. The memory columnar portion 56C4 is disposed at the same position as the memory columnar portion 56C3 in the row direction. In addition, the memory columnar portion 56C4 is disposed so as to be adjacent to the memory columnar portion 56B4 on a side opposite the memory columnar portion 56A4 in the column direction. An upper end of the memory columnar portion 56C4 is electrically connected to the bit line BL4. On the other hand, a lower end of the memory columnar portion 56C4 reaches the upper surface of the back gate BGC, and is electrically connected to the memory connection portion 57C.

The memory connection portion 57C extends in the column direction and is formed inside the back gate BGC. The memory connection portion 57C is formed so as to be in contact with the lower end of the memory columnar portion 56C3 and the lower end of the memory columnar portion 56C4. Accordingly, the memory columnar portion 56C3, the memory connection portion 57C, and the memory columnar portion 56C4 are electrically connected to each other.

The memory columnar portion 56A3 and the memory columnar portion 56A4, and the memory columnar portion 56B3 and the memory columnar portion 56B4 are disposed between the memory columnar portion 56C3 and the memory columnar portion 56C4 in the column direction. For this reason, each of a distance between the memory columnar portion 56A3 and the memory columnar portion 56A4 and a distance between the memory columnar portion 56B3 and the memory columnar portion 56B4 is smaller than a distance between the memory columnar portion 56C3 and the memory columnar portion 56C4. In other words, a dimension of each of the memory connection portions 57A and 57B in the column direction is smaller than a dimension of the memory connection portion 57C in the column direction.

As above, in each memory string unit STU, the six memory columnar portions 56 (the two memory columnar portions 56A, the two memory columnar portions 56B, and the two memory columnar portions 56C) are formed in a zigzag arrangement in a single word line group WLG. In other words, the six memory columnar portions 56 are disposed at the same position in the row direction every other memory columnar portion in the column direction.

The back gate BGA is formed on the back gate BGB via an insulating layer 72 which is a stopper film. The back gate BGB is formed on the back gate BGC via the insulating layer 71 which is a stopper film. In other words, the back gate BGB is formed in a lower layer than the back gate BGA, and the back gate BGC is formed in a lower layer than the back gate BGB. For this reason, the memory connection portion 57B is formed in a lower layer than the memory connection portion 57A, and the memory connection portion 57C is formed in a lower layer than the memory connection portion 57B. Further, the back gate BGB is electrically insulated and disconnected from the back gate BGA by the insulating layer 72, and the back gate BGC is insulated and disconnected from the back gate BGB by the insulating layer 71.

The back gate BGA is connected to the back gate line driving circuit 18A, the back gate BGB is connected to the back gate line driving circuit 18B, and the back gate BGC is connected to a back gate line driving circuit 18C. Accordingly, the back gate BGA, the back gate BGB, and the back gate BGC may be controlled independently. Therefore, it is possible to prevent a variation in an electrical characteristic due to the difference between the dimensions of the memory connection portion 57A formed inside the back gate BGA, the memory connection portion 57B formed inside the back gate BGB, and the memory connection portion 57C formed inside the back gate BGC.

Although not illustrated, the sense amplifiers 4 are separately connected to the bit lines BL0 to BL5.

Effects

According to the second exemplary embodiment, the first memory string including the pair of memory columnar portions 56A and the memory connection portion 57A connecting the memory columnar portions 56A to each other, and the second memory string including the pair of memory columnar portions 56B between which a distance is larger than a distance between the pair of memory columnar portions 56A and the memory connection portion 57B connecting the memory columnar portions 56B to each other, are formed. In addition, the fifth memory string including the pair of memory columnar portions 56C between which a distance is larger than a distance between the pair of memory columnar portions 56B and the memory connection portion 57C connecting the memory columnar portions 56C to each other, is formed. Further, heights (layers) of the memory connection portion 57C, the memory connection portion 57B, and the memory connection portion 57A are changed, and thus the memory connection portions may be formed in a high density manner. Accordingly, the memory columnar portions 56 of six columns may be formed in a zigzag arrangement in a single word line group WLG, thereby achieving a high density of memory cells.

In addition, the above Modification Examples of the first exemplary embodiment may be applied to the second exemplary embodiment, thereby changing the number of select gates SG and bit lines BL as appropriate.

Third Exemplary Embodiment

A nonvolatile semiconductor memory device according to a third exemplary embodiment will be described with reference to FIGS. 18 to 23. In the third exemplary embodiment, a NAND string including a pair of memory columnar portions 56D having a larger width therebetween and a memory connection portion 57D is formed. In addition, a layer in which the memory connection portion 57A is formed, a layer in which the memory connection portion 57B is formed, a layer in which the memory connection portion 57C is formed, and a layer in which the memory connection portion 57D is formed, are changed, and thus the memory connection portions may be formed in a high density manner. Accordingly, the memory columnar portions 56 of eight columns may be formed in a zigzag arrangement in a single word line group WLG, thereby achieving a high density of memory cells. Hereinafter, the nonvolatile semiconductor memory device according to the third exemplary embodiment will be described in detail.

In addition, in the third exemplary embodiment, description of the same configuration as in the first and second exemplary embodiments will be omitted, and different configurations will be described mainly.

Configuration Example of Memory String Unit

Hereinafter, with reference to FIGS. 18 to 23, a configuration example of a memory string unit STU according to the third exemplary embodiment will be described. Here, the memory string unit STU is an aggregate of memory strings including eight memory strings which are adjacent to each other in the column direction and the row direction.

As illustrated in FIGS. 18 to 21, the memory cell array includes a plurality of memory string units arranged in the column direction and the row direction. Each memory string unit is formed over three word line groups WLG1, WLG2 and WLG3 adjacent to each other in the column direction.

Figure 22:
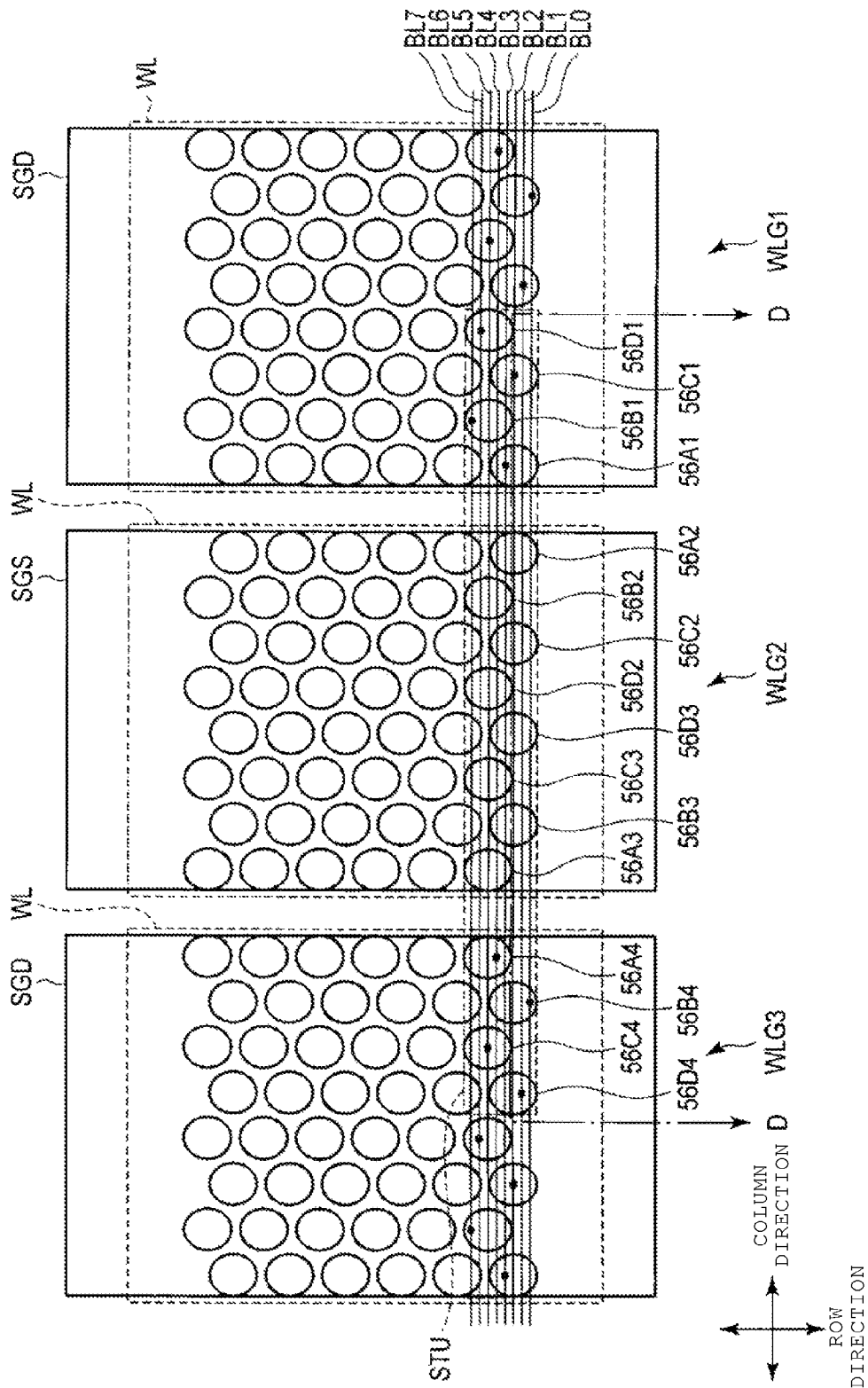
FIG. 22 is a plan view illustrating a memory string unit according to the third exemplary embodiment.
Figure 23:
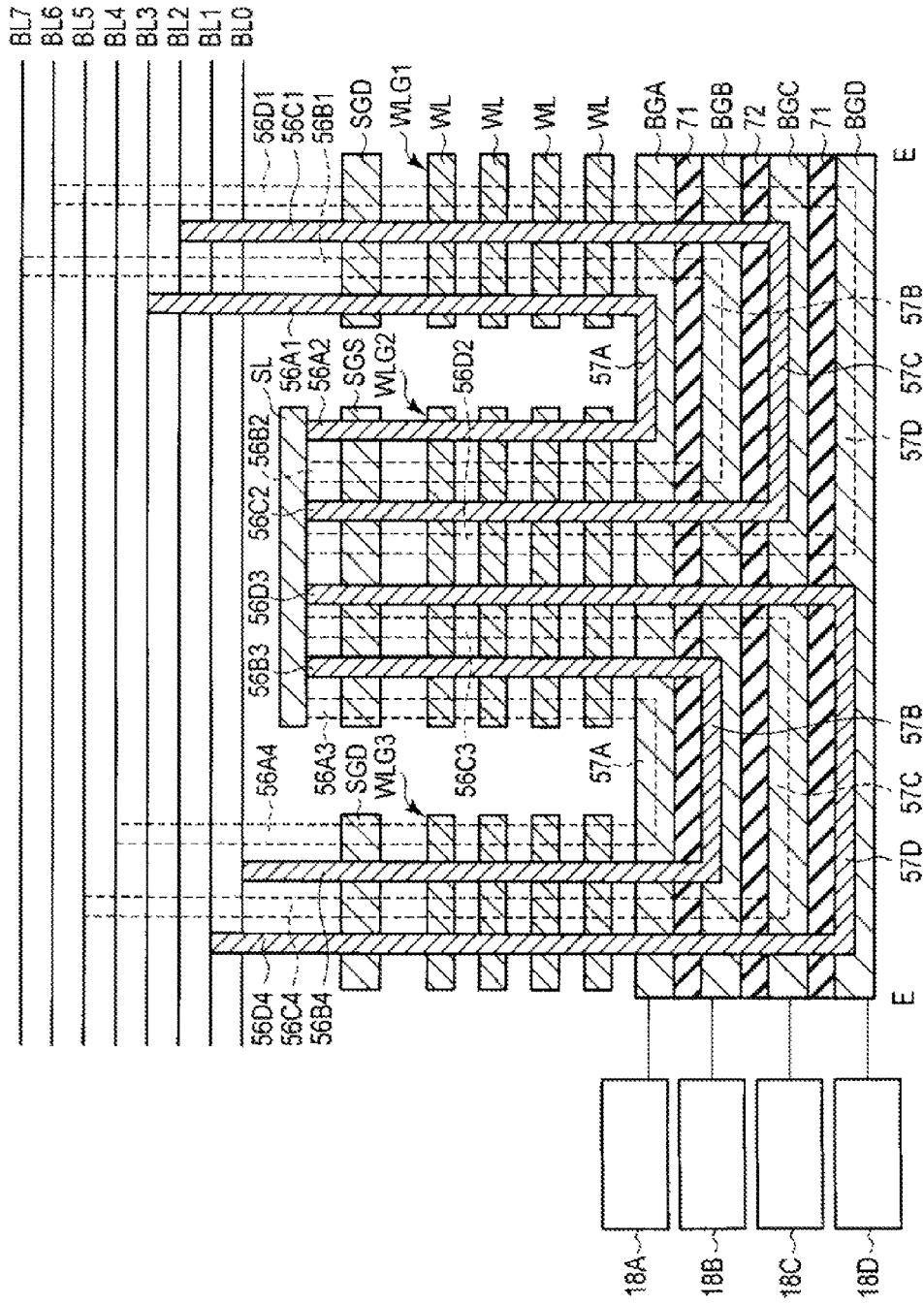
FIG. 23 is a cross-sectional view taken along the line E-E of FIGS. 18 to 22.

As illustrated in FIG. 22, a single select gate SG is formed over each word line group WLG. More specifically, a single drain side select gate SGD is formed over the word line group WLG1, a single source side select gate SGS is formed over the word line group WLG2, and a single drain side select gate SGD is formed over the word line group WLG3.

In addition, the bit lines BL which extend in the column direction are formed over the select gates SG. Eight bit lines BL0 to BL7 are disposed over the memory string unit STU.

Hereinafter, the memory string unit STU will be described more in detail.

As illustrated in FIGS. 18 to 23, the memory string unit STU includes a first memory string to an eighth memory string.

The first memory string is constituted by the word line groups WLG1 and WLG2 adjacent to each other in the column direction, the pair of memory columnar portions 56A1 and 56A2, the memory connection portion 57A, the drain side select gate SGD, the source side select gate SGS, and the back gate BGA. An upper end of the memory columnar portion 56A1 is electrically connected to the bit line BL3.

The second memory string is constituted by the word line groups WLG1 and WLG2 adjacent to each other in the column direction, the pair of memory columnar portions 56B1 and 56B2, the memory connection portion 57B, the drain side select gate SGD, the source side select gate SGS, and the back gate BGB. An upper end of the memory columnar portion 56B1 is electrically connected to the bit line BL7.

The third memory string is constituted by the word line groups WLG2 and WLG3 adjacent to each other in the column direction, the pair of memory columnar portions 56B3 and 56B4, the memory connection portion 57B, the source side select gate SGS, the drain side select gate SGD, and the back gate BGB. An upper end of the memory columnar portion 56B4 is electrically connected to the bit line BL0.

The fourth memory string is constituted by the word line groups WLG2 and WLG3 adjacent to each other in the column direction, the pair of memory columnar portions 56A3 and 56A4, the memory connection portion 57A, the source side select gate SGS, the drain side select gate SGD, and the back gate BGA. An upper end of the memory columnar portion 56A4 is electrically connected to the bit line BL4.

The fifth memory string is constituted by the word line groups WLG1 and WLG2 adjacent to each other in the column direction, the pair of memory columnar portions 56C1 and 56C2, the memory connection portion 57C, the drain side select gate SGD, the source side select gate SGS, and the back gate BGC. An upper end of the memory columnar portion 56C1 is electrically connected to the bit line BL7.

The sixth memory string is constituted by the word line groups WLG2 and WLG3 adjacent to each other in the column direction, the pair of memory columnar portions 56C3 and 56C4, the memory connection portion 57C, the source side select gate SGS, the drain side select gate SGD, and the back gate BGC. An upper end of the memory columnar portion 56C4 is electrically connected to the bit line BL5.

The memory string unit STU according to the third exemplary embodiment further includes the seventh memory string and the eighth memory string.

The seventh memory string is constituted by the word line groups WLG1 and WLG2 adjacent to each other in the column direction, a pair of memory columnar portions 56D1 and 56D2, the memory connection portion 57D, the drain side select gate SGD, the source side select gate SGS, and a back gate BGD.

The memory columnar portion 56D1 is formed so as to extend in the stack direction and to penetrate through the drain side select gate SGD and the word line group WLG1. The memory columnar portion 56D1 is disposed so as to be adjacent to the memory columnar portion 56C1 on a side opposite the memory columnar portion 56B1 in the column direction. On the other hand, the memory columnar portion 56D1 is disposed at the same position as the memory columnar portion 56B1 in the row direction. An upper end of the memory columnar portion 56D1 is electrically connected to the bit line BL6. On the other hand, a lower end of the memory columnar portion 56D1 reaches an upper surface of the back gate BGD, and is electrically connected to the memory connection portion 57D.

The memory columnar portion 56D2 is formed so as to extend in the stack direction and to penetrate through the source side select gate SGS and the word line group WLG2. The memory columnar portion 56D2 is disposed at the same position as the memory columnar portion 56D1 in the row direction. In addition, the memory columnar portion 56D2 is disposed so as to be adjacent to the memory columnar portion 56C2 on aside opposite the memory columnar portion 56B2 in the column direction. An upper end of the memory columnar portion 56D2 is electrically connected to the source line SL. On the other hand, a lower end of the memory columnar portion 56D2 reaches the upper surface of the back gate BGD, and is electrically connected to the memory connection portion 57D.

The memory connection portion 57D extends in the column direction and is formed inside the back gate BGD. The memory connection portion 57D is formed so as to be in contact with the lower end of the memory columnar portion 56D1 and the lower end of the memory columnar portion 56D2. Accordingly, the memory columnar portion 56D1, the memory connection portion 57D, and the memory columnar portion 56D2 are electrically connected to each other.

The memory columnar portion 56A1 and the memory columnar portion 56A2, the memory columnar portion 56B1 and the memory columnar portion 56B2, and the memory columnar portion 56C1 and the memory columnar portion 56C2 are disposed between the memory columnar portion 56D1 and the memory columnar portion 56D2 in the column direction. For this reason, each of a distance between the memory columnar portion 56A1 and the memory columnar portion 56A2, a distance between the memory columnar portion 56B1 and the memory columnar portion 56B2, and a distance between the memory columnar portion 56C1 and the memory columnar portion 56C2 is smaller than a distance between the memory columnar portion 56D1 and the memory columnar portion 56D2. In other words, a dimension of each of the memory connection portions 57A, 57B and 57C in the column direction is smaller than a dimension of the memory connection portion 57D in the column direction.

The eighth memory string is constituted by the word line groups WLG2 and WLG3 adjacent to each other in the column direction, a pair of memory columnar portions 56D3 and 56D4, the memory connection portion 57D, the source side select gate SGS, the drain side select gate SGD, and the back gate BGD.

The memory columnar portion 56D3 is formed so as to extend in the stack direction and to penetrate through the source side select gate SGS and the word line group WLG2. The memory columnar portion 56D3 is disposed at the same position as the memory columnar portion 56B3 in the row direction. In addition, the memory columnar portion 56D3 is disposed so as to be adjacent to the memory columnar portion 56C3 on a side opposite the memory columnar portion 56B3 in the column direction. An upper end of the memory columnar portion 56D3 is electrically connected to the source line SL. On the other hand, a lower end of the memory columnar portion 56D3 reaches the upper surface of the back gate BGD, and is electrically connected to the memory connection portion 57D.

The memory columnar portion 56D4 is formed so as to extend in the stack direction and to penetrate through the drain side select gate SGD and the word line group WLG3. The memory columnar portion 56D4 is disposed at the same position as the memory columnar portion 56D3 in the row direction. In addition, the memory columnar portion 56D4 is disposed so as to be adjacent to the memory columnar portion 56C4 on a side opposite the memory columnar portion 56B4 in the column direction. An upper end of the memory columnar portion 56D4 is electrically connected to the bit line BL1. On the other hand, a lower end of the memory columnar portion 56D4 reaches the upper surface of the back gate BGD, and is electrically connected to the memory connection portion 57D.

The memory connection portion 57D extends in the column direction and is formed inside the back gate BGD. The memory connection portion 57D is formed so as to be in contact with the lower end of the memory columnar portion 56D3 and the lower end of the memory columnar portion 56D4. Accordingly, the memory columnar portion 56D3, the memory connection portion 57D, and the memory columnar portion 56D4 are electrically connected to each other.

The memory columnar portion 56A3 and the memory columnar portion 56A4, the memory columnar portion 56B3 and the memory columnar portion 56B4, and the memory columnar portion 56C3 and the memory columnar portion 56C4 are disposed between the memory columnar portion 56D3 and the memory columnar portion 56D4 in the column direction. For this reason, each of a distance between the memory columnar portion 56A3 and the memory columnar portion 56A4, a distance between the memory columnar portion 56B3 and the memory columnar portion 56B4, and a distance between the memory columnar portion 56C3 and the memory columnar portion 56C4 is smaller than a distance between the memory columnar portion 56D3 and the memory columnar portion 56D4. In other words, a dimension of each of the memory connection portions 57A, 57B and 57C in the column direction is smaller than a dimension of the memory connection portion 57D in the column direction.

As above, in each memory string unit STU, the eight memory columnar portions 56 (the two memory columnar portions 56A, the two memory columnar portions 56B, the two memory columnar portions 56C, and the two memory columnar portions 56D) are formed in a zigzag arrangement in a single word line group WLG. In other words, the eight memory columnar portions 56 are disposed at the same position in the row direction every other memory columnar portion in the column direction.

The back gate BGA is formed on the back gate BGB via an insulating layer 73 which is a stopper film. The back gate BGB is formed on the back gate BGC via the insulating layer 72 which is a stopper film. The back gate BGC is formed on the back gate BGD via the insulating layer 71 which is a stopper film. In other words, the back gate BGB is formed in a lower layer than the back gate BGA, the back gate BGC is formed in a lower layer than the back gate BGB, and the back gate BGD is formed in a lower layer than the back gate BGC. For this reason, the memory connection portion 57B is formed in a lower layer than the memory connection portion 57A, the memory connection portion 57C is formed in a lower layer than the memory connection portion 57B, and the memory connection portion 57D is formed in a lower layer than the memory connection portion 57C. Further, the back gate BGB is electrically insulated from the back gate BGA by the insulating layer 73, the back gate BGC is electrically insulated from the back gate BGB by the insulating layer 72, and the back gate BGD is electrically insulated from the back gate BGC by the insulating layer 71.

The back gate BGA is connected to the back gate line driving circuit 18A, the back gate BGB is connected to the back gate line driving circuit 18B, the back gate BGC is connected to the back gate line driving circuit 18C, and the back gate BGD is connected to a back gate line driving circuit 18D. Accordingly, the back gate BGA, the back gate BGB, the back gate BGC, and the back gate BGD may be controlled independently. Therefore, it is possible to prevent a variation in an electrical characteristic due to the difference among the dimensions of the memory connection portion 57A formed inside the back gate BGA, the memory connection portion 57B formed inside the back gate BGB, the memory connection portion 57C formed inside the back gate BGC, and the memory connection portion 57D formed inside the back gate BGD.

Although not illustrated, the sense amplifiers 4 are separately connected to the bit lines BL0 to BL7.

Effects of the Third Exemplary Embodiment

According to the third exemplary embodiment, the first memory string including the pair of memory columnar portions 56A and the memory connection portion 57A connecting the memory columnar portions 56A to each other, the second memory string including the pair of memory columnar portions 56B between which a distance is larger than a distance between the pair of memory columnar portions 56A and the memory connection portion 57B connecting the memory columnar portions 56B to each other, and the fifth memory string including the pair of memory columnar portions 56C between which a distance is larger than a distance between the pair of memory columnar portions 56B and the memory connection portion 57C connecting the memory columnar portions 56C to each other, are formed. In addition, the seventh memory string including the pair of memory columnar portions 56D between which a distance is larger than a distance between the pair of memory columnar portions 56C and the memory connection portion 57D connecting the memory columnar portions 56D to each other, is formed. Further, heights (layers) of the memory connection portion 57D, the memory connection portion 57C, the memory connection portion 57B, and the memory connection portion 57A are changed, and thus the memory connection portions may be formed in a high density manner. Accordingly, the memory columnar portions 56 of eight columns may be formed in a zigzag arrangement in a single word line group WLG, thereby achieving a high density of memory cells.

In addition, the above Modification Examples of the first exemplary embodiment may be applied to the third exemplary embodiment, thereby changing the number of select gates SG and bit lines BL as appropriate.

Fourth Exemplary Embodiment

A nonvolatile semiconductor memory device according to a fourth exemplary embodiment will be described with reference to FIGS. 24 to 27. In the fourth exemplary embodiment, a dummy hole DH is formed around a boundary between two adjacent blocks BLK. Accordingly, the memory columnar portion 56B (memory hole MH) around the boundary between the two adjacent blocks BLK may be stably formed in processes. Hereinafter, the nonvolatile semiconductor memory device according to the fourth exemplary embodiment will be described in detail.

In addition, in the fourth exemplary embodiment, description of the same configuration as in the first exemplary embodiment will be omitted, and different configurations will be described mainly.

Configuration Example of Memory String Unit

Hereinafter, with reference to FIGS. 24 to 27, a configuration example of a memory string unit STU according to the fourth exemplary embodiment will be described. Here, the memory string unit STU is an aggregate of memory strings including four memory strings which are adjacent to each other in the column direction and the row direction in the same manner as in the first exemplary embodiment.

Figure 24:
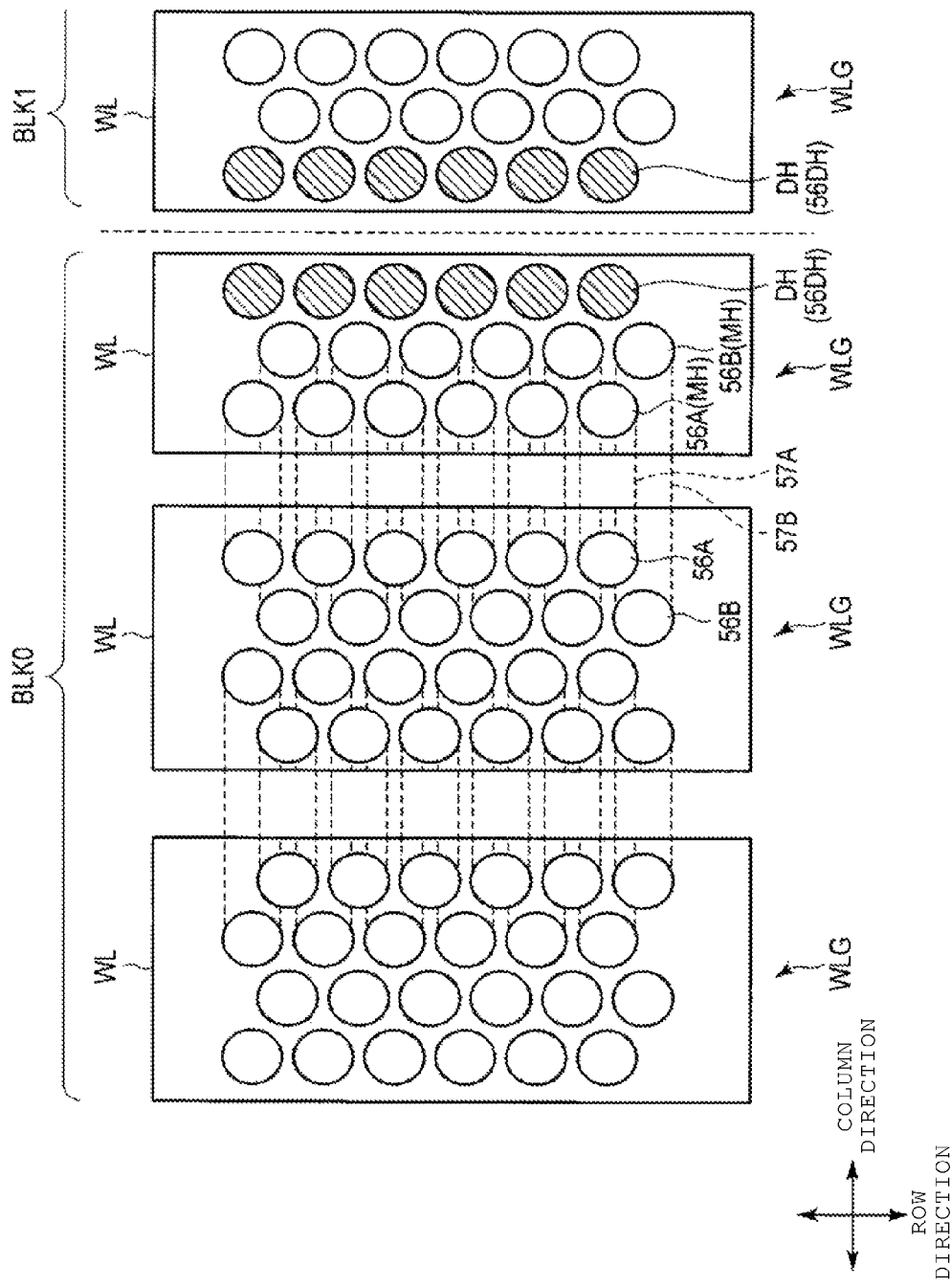
FIG. 24 is a plan view illustrating a first example of a memory string unit according to a fourth exemplary embodiment.

As illustrated in FIG. 24, in the word line group WLG at a boundary between the block BLK0 and the block BLK1, the memory columnar portions 56 of two columns (memory columnar portions 56A and memory columnar portions 56B) and dummy memory columnar portions 56DH of one column formed in the dummy holes DH are formed in a zigzag arrangement. In other words, the two memory columnar portions 56 and the dummy memory columnar portion 56DH are disposed at the same position in the row direction every other portion in the column direction.

The dummy memory columnar portions 56DH are formed around the edge of the word line group WLG at the boundary between the block BLK0 and the block BLK1. The dummy memory columnar portions 56DH do not exceed the boundary between the block BLK0 and the block BLK1 or constitute a memory string. For this reason, the dummy memory columnar portions 56DH do not function as a memory cell. The dummy memory columnar portion 56DH has the same shape as the memory columnar portion 56. This dummy memory columnar portion 56DH is provided, and thus the memory columnar portion 56 adjacent thereto in the column direction may be stably formed in processes.

Figure 25:
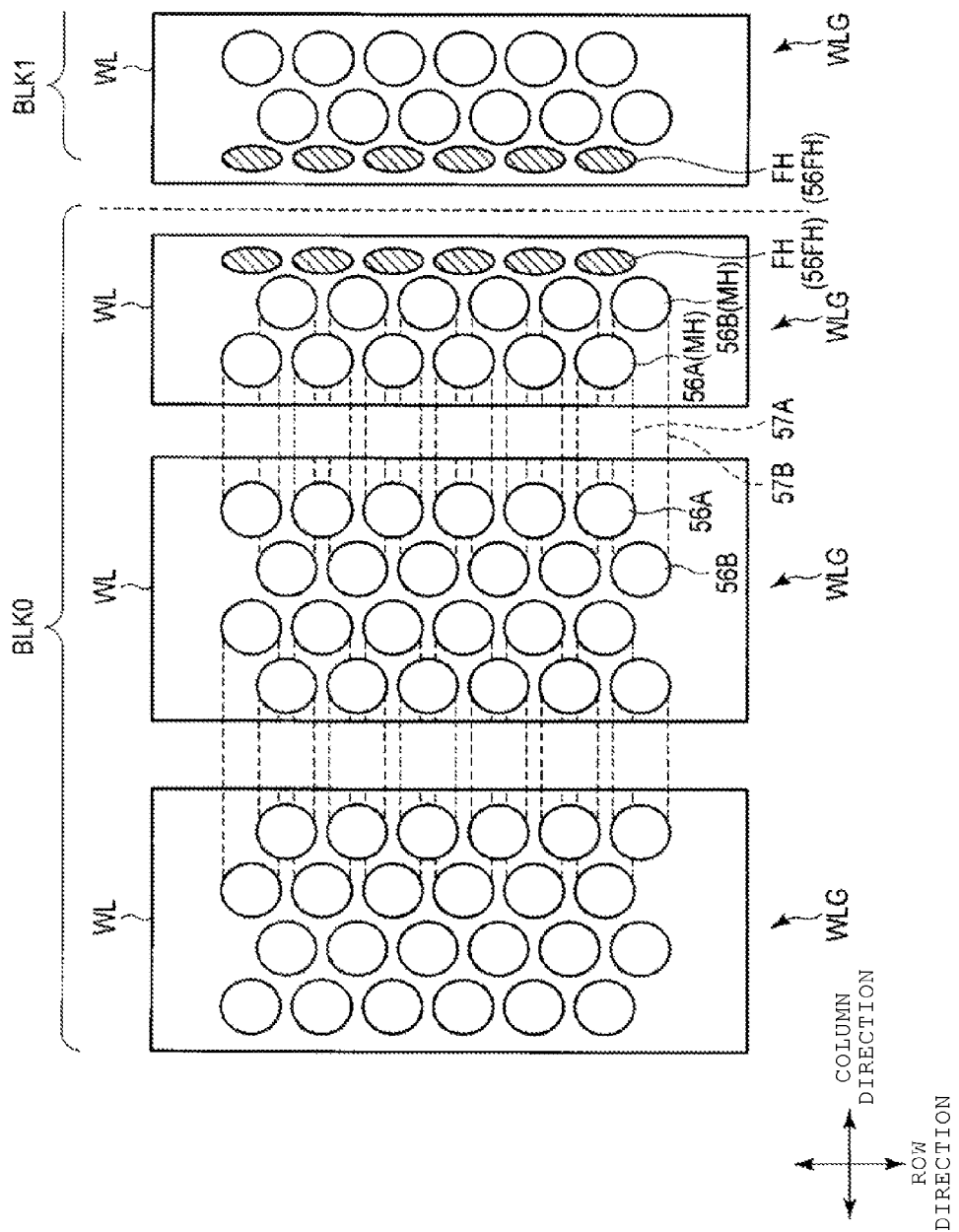
FIG. 25 is a plan view illustrating a second example of a memory string unit according to the fourth exemplary embodiment.

As illustrated in FIG. 25, in the word line group WLG at a boundary between the block BLK0 and the block BLK1, the memory columnar portions 56 of two columns (memory columnar portions 56A and memory columnar portions 56B) and fake memory columnar portions 56FH of one column formed in fake holes FH are formed in a zigzag arrangement. In other words, the two memory columnar portions 56 and the fake memory columnar portion 56FH are disposed at the same position in the row direction every other portion in the column direction.

The fake memory columnar portions 56FH are formed around the edge of the word line group WLG at the boundary between the block BLK0 and the block BLK1. The fake memory columnar portions 56FH do not exceed the boundary between the block BLK0 and the block BLK1 or constitute a memory string. For this reason, the fake memory columnar portions 56FH do not function as a memory cell. The fake memory columnar portion 56FH does not have the same shape as the memory columnar portion 56.

The fake memory columnar portions 56FH are formed in the same region as the above-described dummy memory columnar portions 56DH, and exert the same influence as when the dummy memory columnar portions 56DH are formed. A planar shape of the fake memory columnar portion 56FH is an elliptical shape, for example. This fake memory columnar portion 56FH is provided, and thus the memory columnar portion 56 adjacent thereto in the column direction may be stably formed in processes.

Effects of the Fourth Exemplary Embodiment

Typically, when the memory holes MH are formed, the memory holes MH are irregularly arranged at the boundary between two adjacent blocks BLK. For this reason, during etching for forming the memory hole MH, a shape of the memory hole MH around the boundary between the two adjacent blocks BLK is deformed. Therefore, if the memory columnar portion 56 is formed in the memory hole MH with the deformed shape, a variation in an electrical characteristic or the like occurs.

In contrast, according to the fourth exemplary embodiment, the dummy holes DH or the fake holes FH having a function equivalent to the dummy holes DH are formed around the boundary between two adjacent blocks BLK. The dummy holes DH or the fake holes FH are formed, and thus the memory holes MH are formed by being influenced by the dummy holes DH or the fake holes FH which are regularly arranged. Therefore, a shape of the memory hole MH around the boundary between the two adjacent blocks BLK may be prevented from being deformed.

Figure 26:
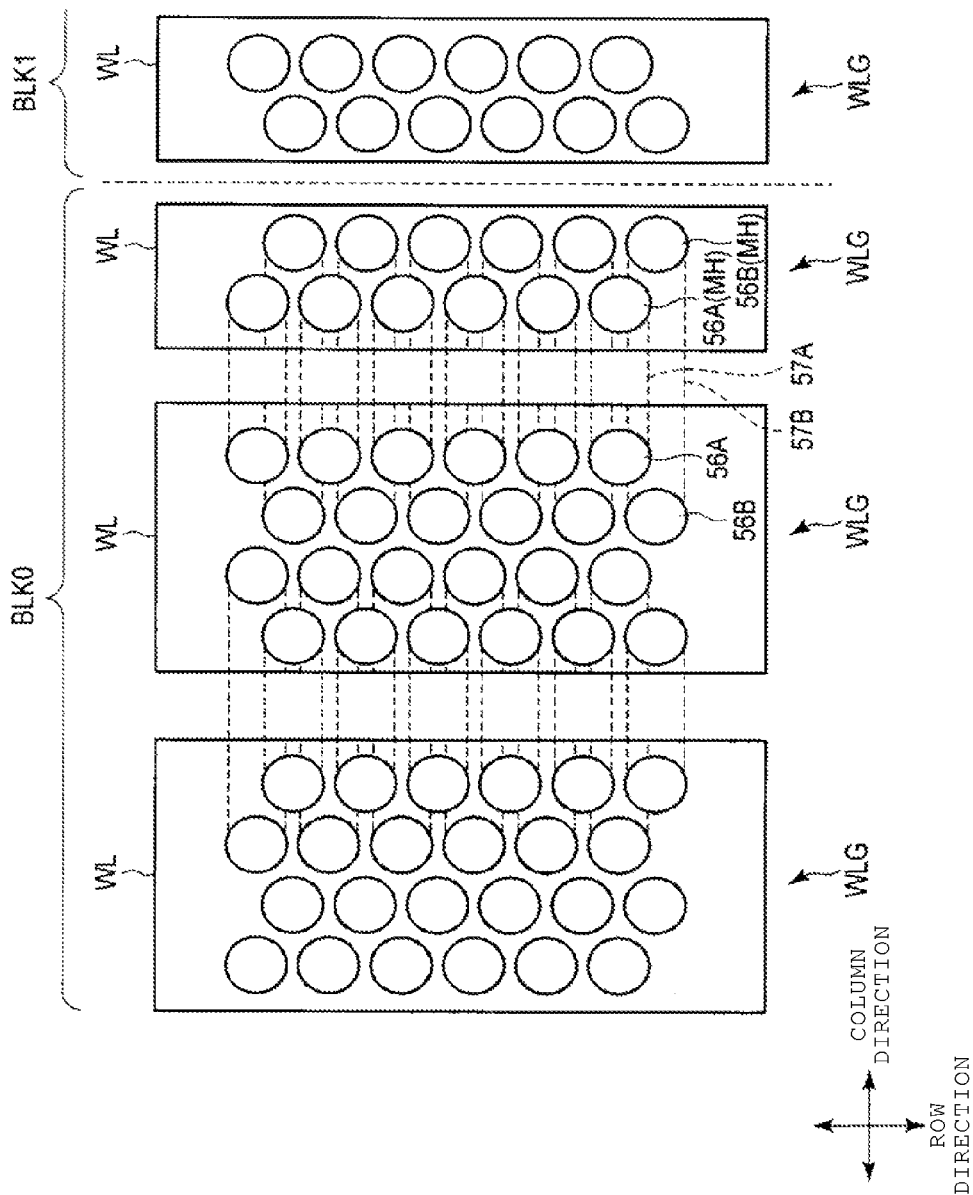
FIG. 26 is a plan view illustrating a third example of a memory string unit according to the fourth exemplary embodiment.

In addition, as illustrated in a third example of FIG. 26, if there is no concern that a shape of the memory hole MH around the boundary between two adjacent blocks BLK is deformed during etching for forming the memory hole MH, the dummy hole DH or the fake hole FH is not formed. In this case, the memory columnar portions 56 of two columns (the memory columnar portions 56A and the memory columnar portions 56B) are formed in a zigzag arrangement in the word line group WLG at the boundary between the block BLK0 and the block BLK1.

Figure 27:
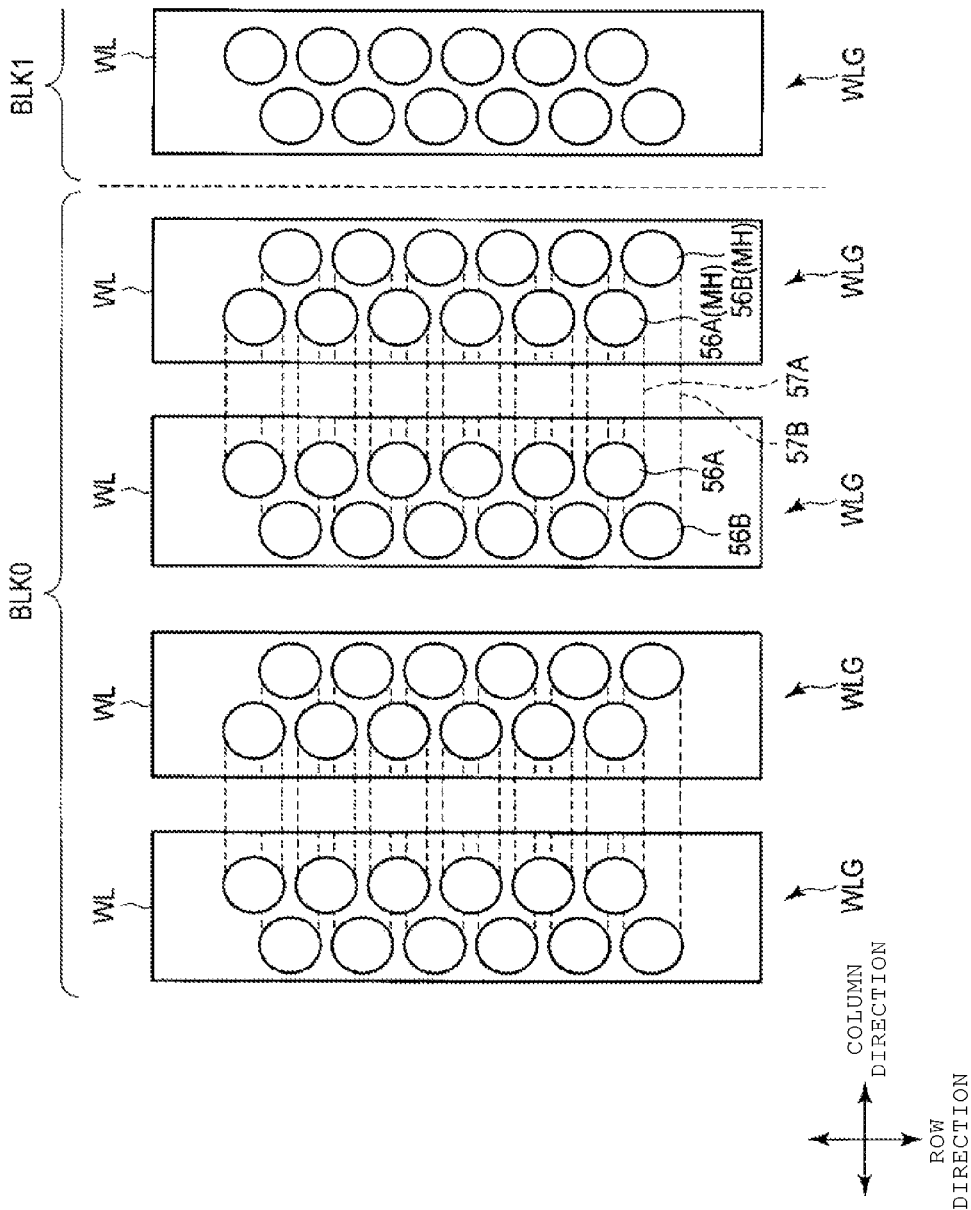
FIG. 27 is a plan view illustrating a fourth example of a memory string unit according to the fourth exemplary embodiment.

Further, as illustrated in a fourth example of FIG. 27, the third example may be applied to a case where the memory columnar portions 56 of two columns are formed in a zigzag arrangement in a single word line group WLG. In the fourth example, the memory columnar portions 56 arranged in the two adjacent word line groups WLG are linearly symmetrical to each other with respect to a slit.

Fifth Exemplary Embodiment

Figure 28:
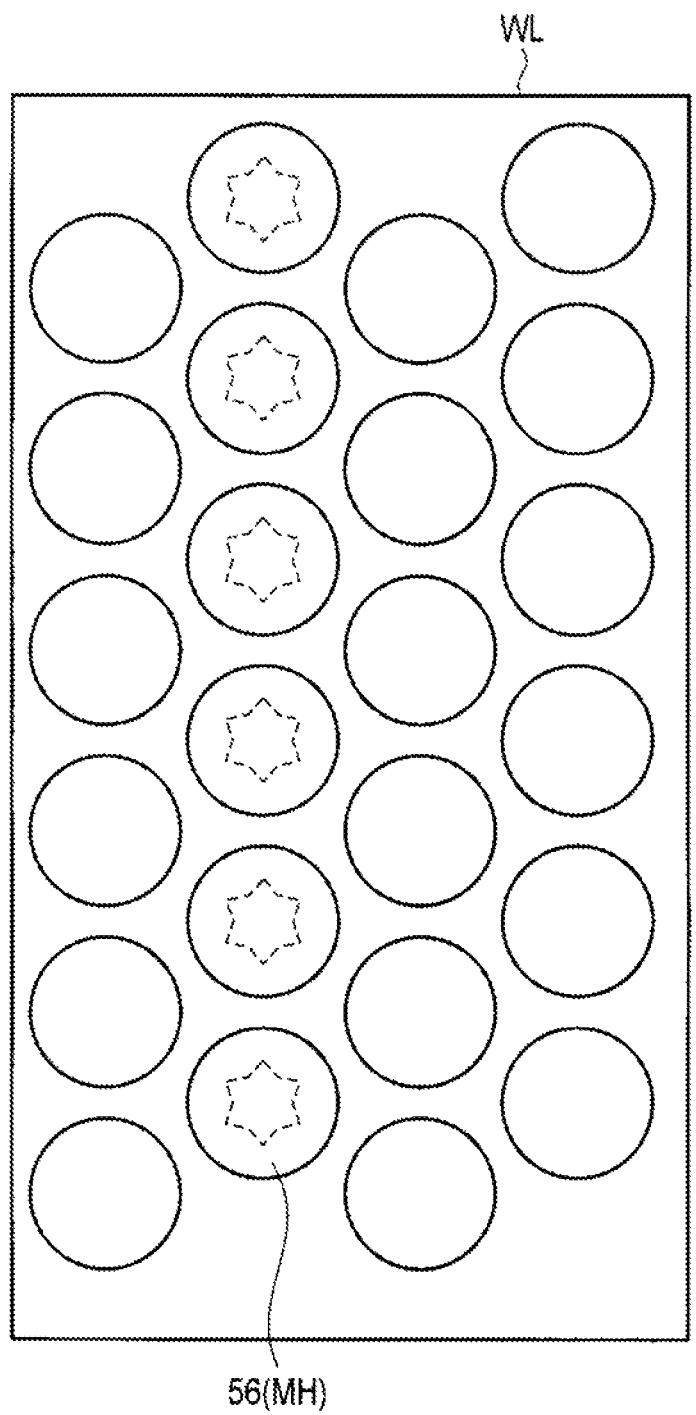
FIG. 28 is a plan view illustrating a configuration of a memory hole related to a comparative example.
Figure 29:
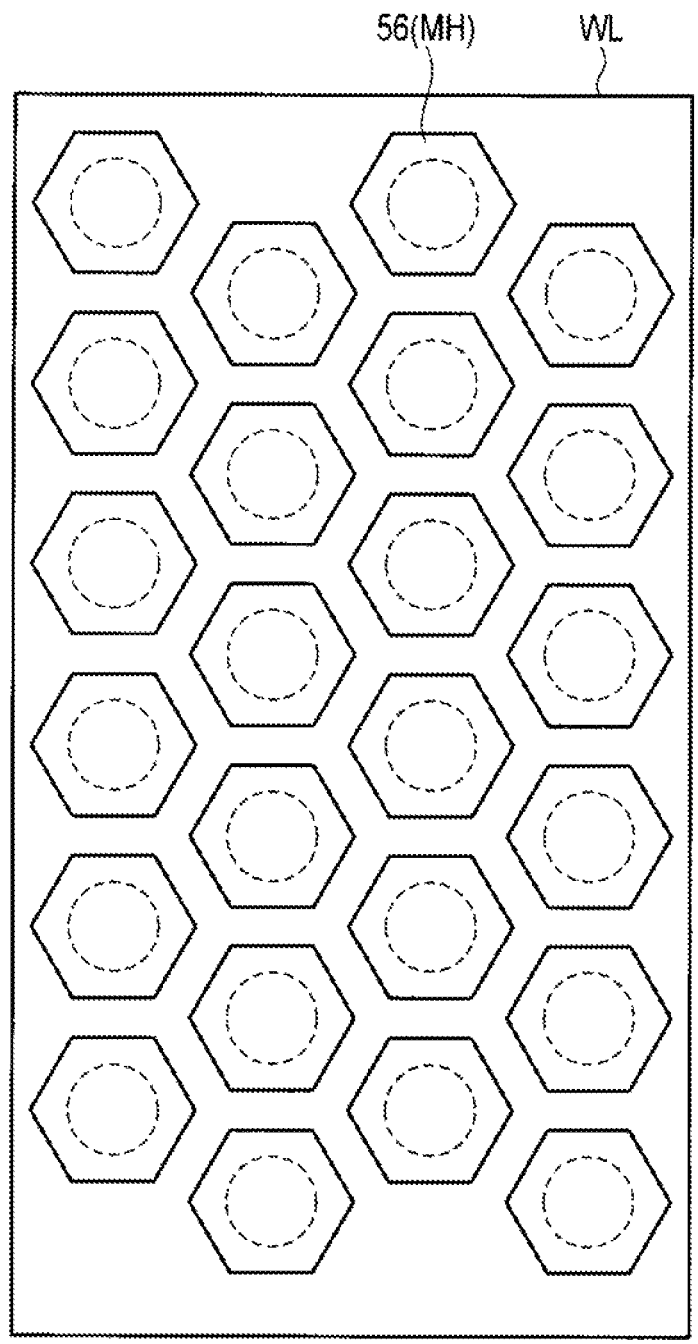
FIG. 29 is a plan view illustrating a configuration of a memory hole according to a fifth exemplary embodiment.

With reference to FIGS. 28 and 29, a nonvolatile semiconductor memory device according to a fifth exemplary embodiment will be described. In the fifth exemplary embodiment, a planar shape of an upper surface of the memory hole MH is a regular hexagonal shape. Accordingly, a planar shape of the upper surface of the memory hole MH may be made to be a circular shape. Hereinafter, the nonvolatile semiconductor memory device according to the fifth exemplary embodiment will be described in detail.

In addition, in the fifth exemplary embodiment, description of the same configuration as in the first exemplary embodiment will be omitted, and different configurations will be described mainly.

Configuration Example of Memory Hole

Hereinafter, with reference to FIGS. 28 and 29, a configuration example of the memory hole MH according to the fifth exemplary embodiment will be described.

As illustrated in FIG. 28, in a comparative example, a planar shape of the upper surface of the memory hole MH is a circular shape. On the other hand, a planar shape of the lower surface of the memory hole MH is a regular hexagonal shape of which each side is distorted. This is caused by problems in the processing of the memory hole MH, and is because a plurality of memory holes MH formed in the word lines WL (the word line group WLG) are disposed in a hexagonal densest form (quadruple zigzags).

In other words, structures around the memory hole MH do not have point symmetry with respect to a center of the memory hole MH during etching for forming the memory hole MH. That is to say, there are a location where a gap between the memory holes MH is wide and a location where a gap between the memory holes MH is narrow. More specifically, a distance between centers of two adjacent memory holes MH is short, and a distance between centers of three adjacent memory holes MH is long. In this case, a part which is in contact with the narrow region in the memory hole MH has a small etching amount, and a part which is in contact with the wide region therein has a large etching amount. This etching amount becomes noticeable toward the lower surface of the memory hole MH. Therefore, even if the upper surface of the memory hole MH has a circular shape, the lower surface thereof has a distorted regular hexagonal shape.

In addition, if the memory hole MH is formed in processes, a cross-sectional shape thereof is a tapered shape whose dimension is reduced toward the lower surface from the upper surface. That is, a planar shape of the memory hole MH is a circular shape with a great diameter in the upper surface, and is a distorted regular hexagonal shape with a smaller diameter (for example, a dimension of a diagonal line) in the lower surface than in the upper surface. This distortion causes a variation in an electrical characteristic of the memory cell.

In contrast, as illustrated in FIG. 29, in the fifth exemplary embodiment, a planar shape of the upper surface of the memory hole MH is a regular hexagonal shape. Accordingly, during etching for forming the memory hole MH, structures around the memory hole MH have point symmetry with respect to a center of the memory hole MH. In other words, a gap between the memory holes MH may be made uniform. For this reason, an etching amount of the memory holes MH may be made uniform. Therefore, a planar shape of the lower surface of the memory hole MH is a circular shape.

In addition, a cross-sectional shape of the memory hole MH is a tapered shape whose dimension is reduced toward the lower surface from the upper surface. That is, a planar shape of the memory hole MH is a regular hexagonal shape with a great diameter (for example, a dimension of a diagonal line) in the upper surface, and is a circular shape with a smaller diameter in the lower surface than in the upper surface.

Sixth Exemplary Embodiment

A nonvolatile semiconductor memory device according to a sixth exemplary embodiment will be described with reference to FIGS. 30 to 33. In the sixth exemplary embodiment, a NAND string including the pair of memory columnar portions 56A and the memory connection portion 57A connecting the memory columnar portions 56A to each other, and a NAND string including the pair of memory columnar portions 56B between which a width is equivalent to a width between the pair of memory columnar portions 56A and the memory connection portion 57B connecting the memory columnar portions 56B to each other, are formed. In addition, a width of each of the memory connection portion 57A and the memory connection portion 57B is made smaller than a diameter of each of the memory columnar portion 56A and the memory columnar portion 56B, and thus memory connection portions may be formed in a high density. Accordingly, the memory columnar portions 56 of four columns may be formed in a zigzag arrangement in a single word line group WLG, thereby achieving a high density of memory cells. Hereinafter, the nonvolatile semiconductor memory device according to the sixth exemplary embodiment will be described in detail.

In addition, in the sixth exemplary embodiment, description of the same configuration as in the first exemplary embodiment will be omitted, and different configurations will be described mainly.

Configuration Example of Memory String Unit

Hereinafter, with reference to FIGS. 30 to 33, a configuration example of a memory string unit STU according to the sixth exemplary embodiment will be described. Here, the memory string unit STU is an aggregate of memory strings including four memory strings which are adjacent to each other in the column direction and the row direction.

Figure 30:
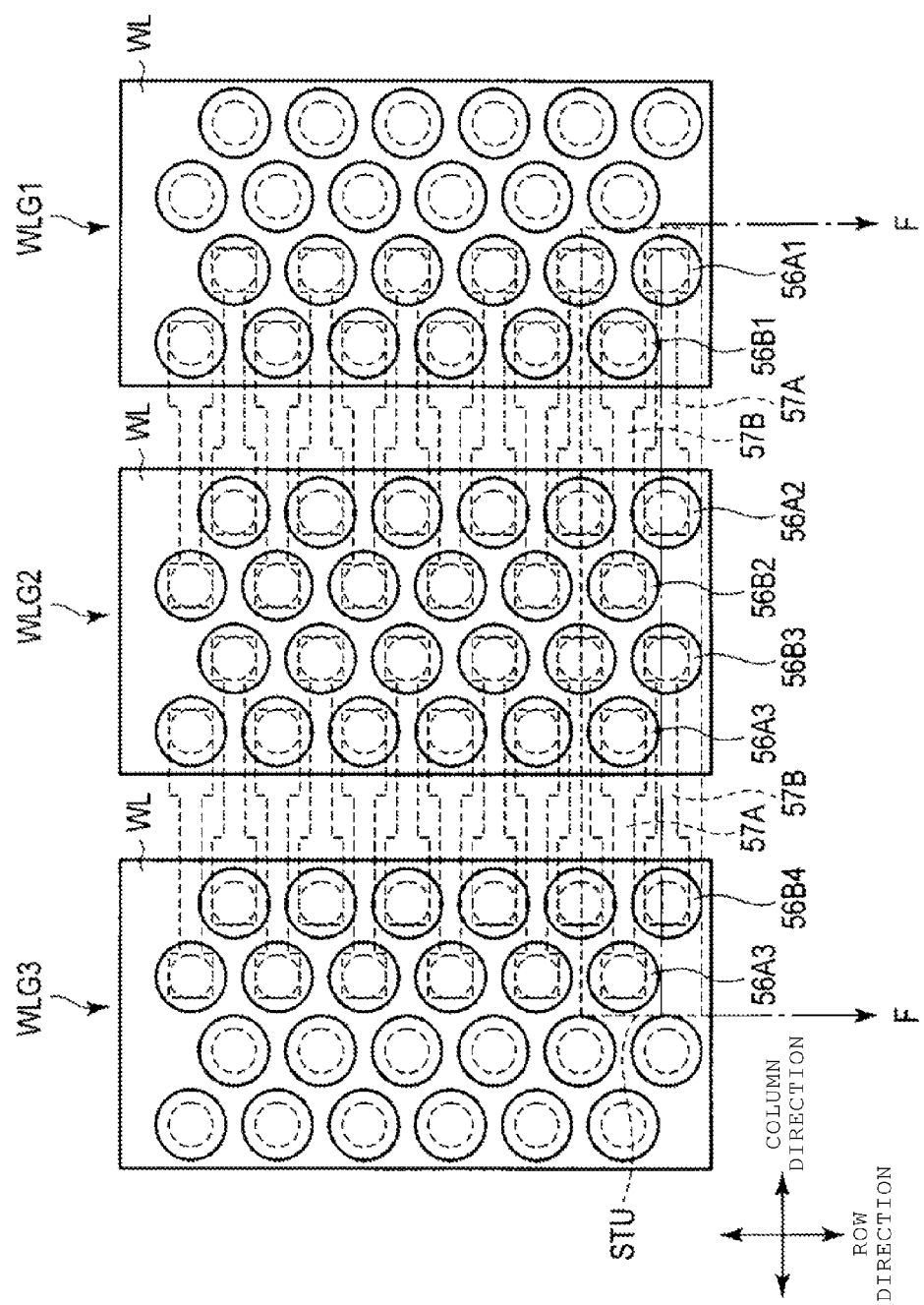
FIG. 30 is a plan view illustrating a memory string unit according to a sixth exemplary embodiment.

As illustrated in FIG. 30, the memory cell array includes a plurality of word line groups WLG. Each of the word line groups WLG has a plurality of stacked word lines WL, each of which extends in the row direction.

The memory cell array includes a plurality of memory string units which are arranged in the column direction and the row direction. Each memory string unit is formed over three word line groups WLG1, WLG2 and WLG3 adjacent to each other in the column direction.

Figure 31:
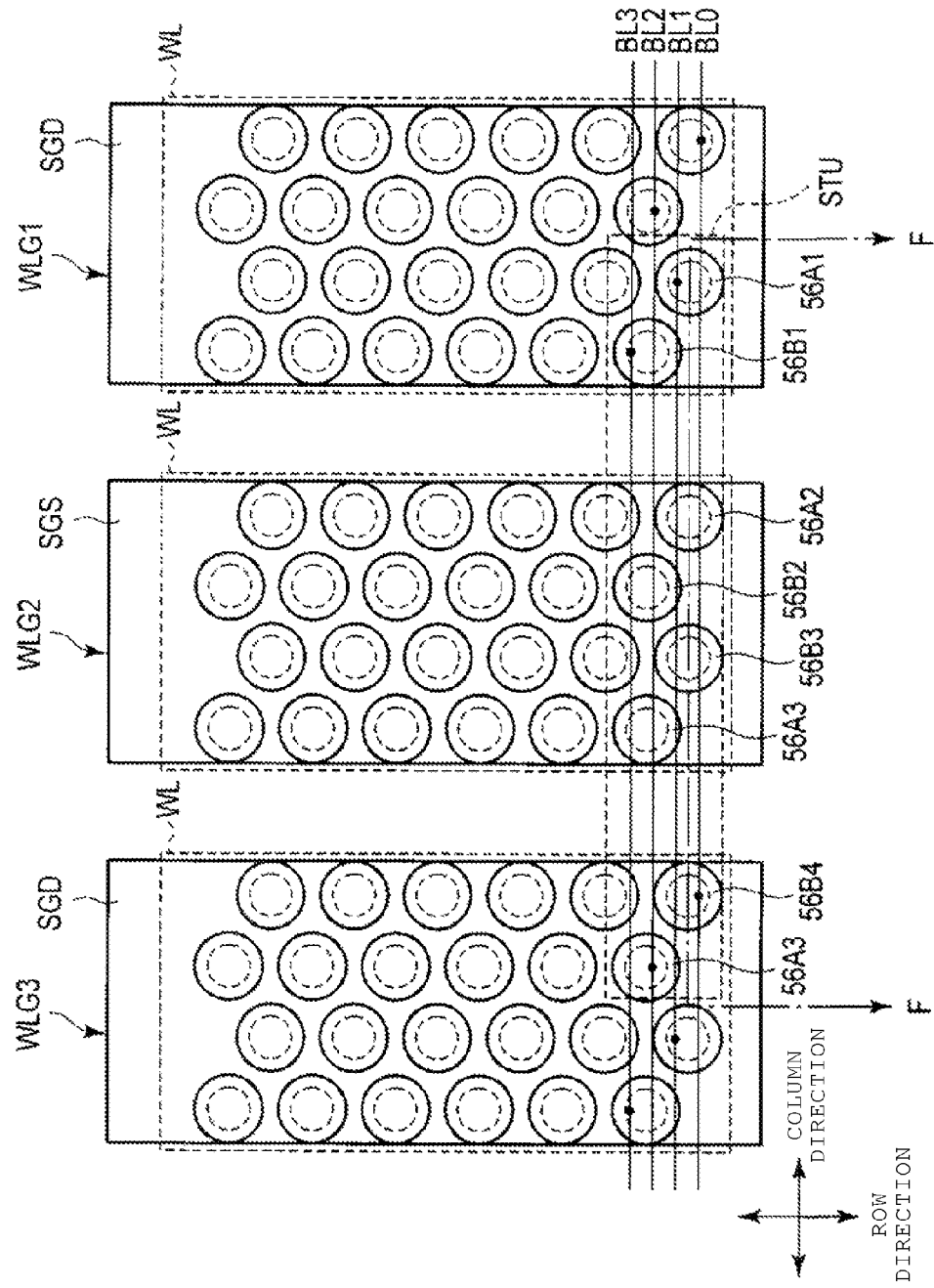
FIG. 31 is a plan view illustrating a memory string unit according to the sixth exemplary embodiment.

As illustrated in FIG. 31, a single select gate SG is formed over each word line group WLG. More specifically, a single drain side select gate SGD is formed over the word line group WLG1, a single source side select gate SGS is formed over the word line group WLG2, and a single drain side select gate SGD is formed over the word line group WLG3.

In addition, the bit lines BL which extend in the column direction are formed over the select gates SG. Four bit lines BL0 to BL3 are disposed over the memory string unit STU.

Hereinafter, the memory string unit STU will be described more in detail.

Figure 32:
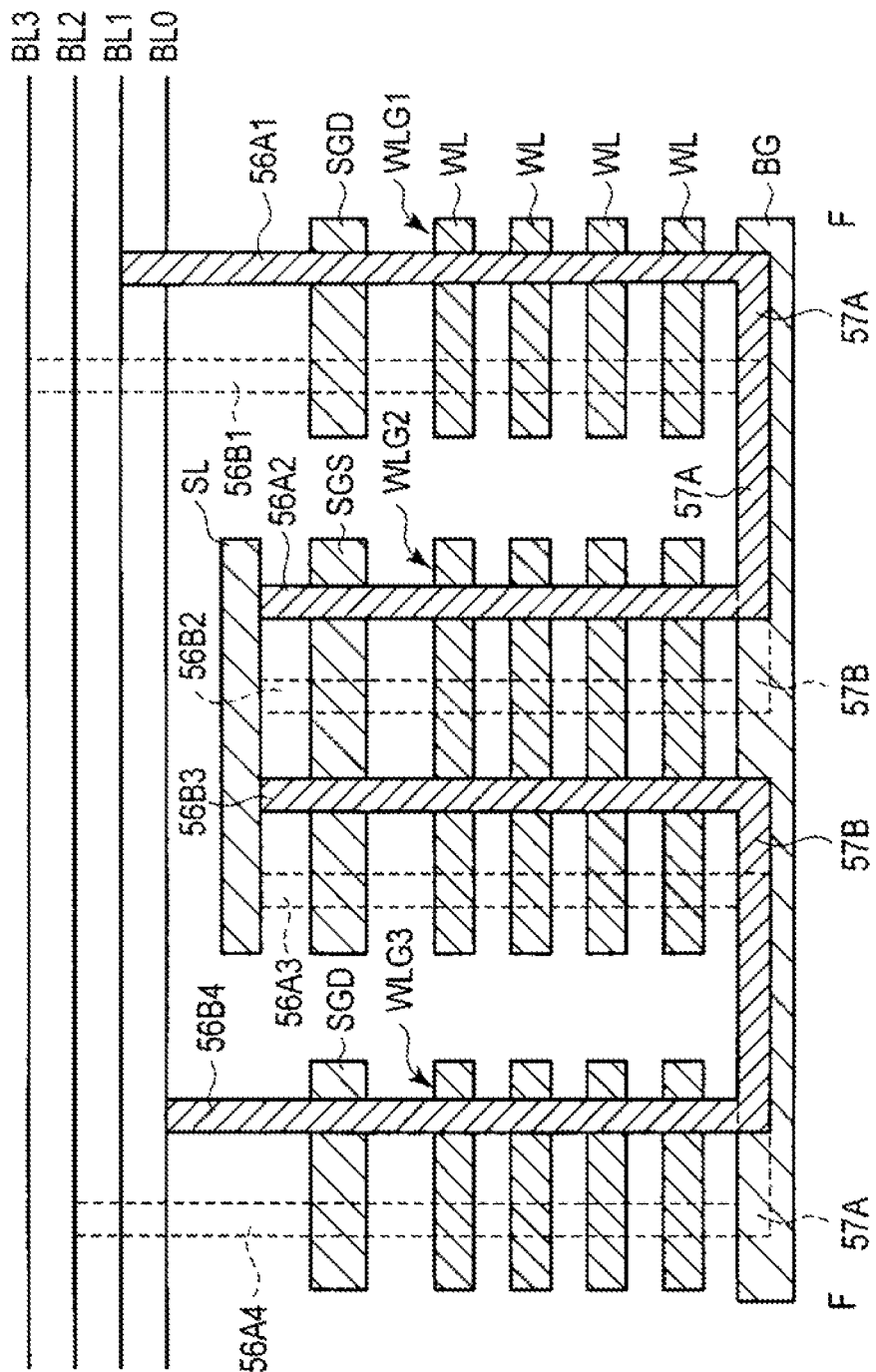
FIG. 32 is a cross-sectional view taken along the line F-F of FIGS. 30 and 31.

As illustrated in FIGS. 30 to 32, the memory string unit STU includes a first memory string to a fourth memory string.

The first memory string is constituted by the word line groups WLG1 and WLG2 adjacent to each other in the column direction, the pair of memory columnar portions 56A1 and 56A2, the memory connection portion 57A, the drain side select gate SGD, the source side select gate SGS, and the back gate BG.

The memory columnar portion 56A1 is formed so as to extend in the stack direction and to penetrate through the drain side select gate SGD and the word line group WLG1. An upper end of the memory columnar portion 56A1 is electrically connected to the bit line BL1. On the other hand, a lower end of the memory columnar portion 56A1 reaches an upper surface of the back gate BG, and is electrically connected to the memory connection portion 57A.

The memory columnar portion 56A2 is formed so as to extend in the stack direction and to penetrate through the source side select gate SGS and the word line group WLG2.

The memory columnar portion 56A2 is disposed at the same position as the memory columnar portion 56A1 in the row direction. An upper end of the memory columnar portion 56A2 is electrically connected to the source line SL. On the other hand, a lower end of the memory columnar portion 56A2 reaches the upper surface of the back gate BG, and is electrically connected to the memory connection portion 57A.

The memory connection portion 57A extends in the column direction and is formed inside the back gate BG. The memory connection portion 57A is formed so as to be in contact with the lower end of the memory columnar portion 56A1 and the lower end of the memory columnar portion 56A2. Accordingly, the memory columnar portion 56A1, the memory connection portion 57A, and the memory columnar portion 56A2 are electrically connected to each other.

The second memory string is constituted by the word line groups WLG1 and WLG2 adjacent to each other in the column direction, the pair of memory columnar portions 56B1 and 56B2, the memory connection portion 57B, the drain side select gate SGD, the source side select gate SGS, and the back gate BG.

The memory columnar portion 56B1 is formed so as to extend in the stack direction and to penetrate through the drain side select gate SGD and the word line group WLG1. The memory columnar portion 56B1 is disposed so as to be adjacent to the memory columnar portion 56A1 in the column direction. However, the memory columnar portion 56B1 is disposed so as to be deviated from the memory columnar portion 56A1 in the row direction. For this reason, the memory columnar portion 56B1 does not overlap the memory columnar portion 56A1 in the column direction, and partially overlaps the memory columnar portion 56A1 in the row direction. An upper end of the memory columnar portion 56B1 is electrically connected to the bit line BL3. On the other hand, a lower end of the memory columnar portion 56B1 reaches an upper surface of the back gate BG, and is electrically connected to the memory connection portion 57B.

The memory columnar portion 56B2 is formed so as to extend in the stack direction and to penetrate through the source side select gate SGS and the word line group WLG2. The memory columnar portion 56B2 is disposed at the same position as the memory columnar portion 56B1 in the row direction. In addition, the memory columnar portion 56B2 is disposed so as to be adjacent to the memory columnar portion 56A2 in the column direction. An upper end of the memory columnar portion 56B2 is electrically connected to the source line SL. On the other hand, a lower end of the memory columnar portion 56B2 reaches the upper surface of the back gate BG, and is electrically connected to the memory connection portion 57B.

The memory connection portion 57B extends in the column direction and is formed inside the back gate BG. The memory connection portion 57B is formed so as to be in contact with the lower end of the memory columnar portion 56B1 and the lower end of the memory columnar portion 56B2. Accordingly, the memory columnar portion 56B1, the memory connection portion 57B, and the memory columnar portion 56B2 are electrically connected to each other.

The memory columnar portion 56A2 is disposed between the memory columnar portion 56B1 and the memory columnar portion 56B2 in the column direction. The memory columnar portion 56B1 is disposed between the memory columnar portion 56A1 and the memory columnar portion 56A2 in the column direction. In addition, a distance between the memory columnar portion 56A1 and the memory columnar portion 56A2 is equivalent to a distance between the memory columnar portion 56B1 and the memory columnar portion 56B2. In other words, a dimension of the memory connection portion 57A in the column direction is equivalent to a dimension of the memory connection portion 57B in the column direction.

In addition, an intersection between a line segment connecting the memory columnar portion 56A1 to the memory columnar portion 56B2 and a line segment connecting the memory columnar portion 56B1 to the memory columnar portion 56A2, is considered. In this case, the memory columnar portion 56A1 and the memory columnar portion 56B1 are point symmetrical to the memory columnar portion 56B2 and the memory columnar portion 56A2 with respect to the intersection. In other words, a tetragon which connects the memory columnar portion 56A1, the memory columnar portion 56A2, the memory columnar portion 56B1, and the memory columnar portion 56B2 together is a parallelogram.

Further, a cross-sectional shape of the memory columnar portion 56 is a tapered shape whose dimension is reduced toward the lower surface from the upper surface. In other words, a planar shape of the memory columnar portion 56 is, for example, a circular shape with a great diameter in the upper surface, and is a circular shape with a smaller diameter in the lower surface than in the upper surface.

Figure 33A:
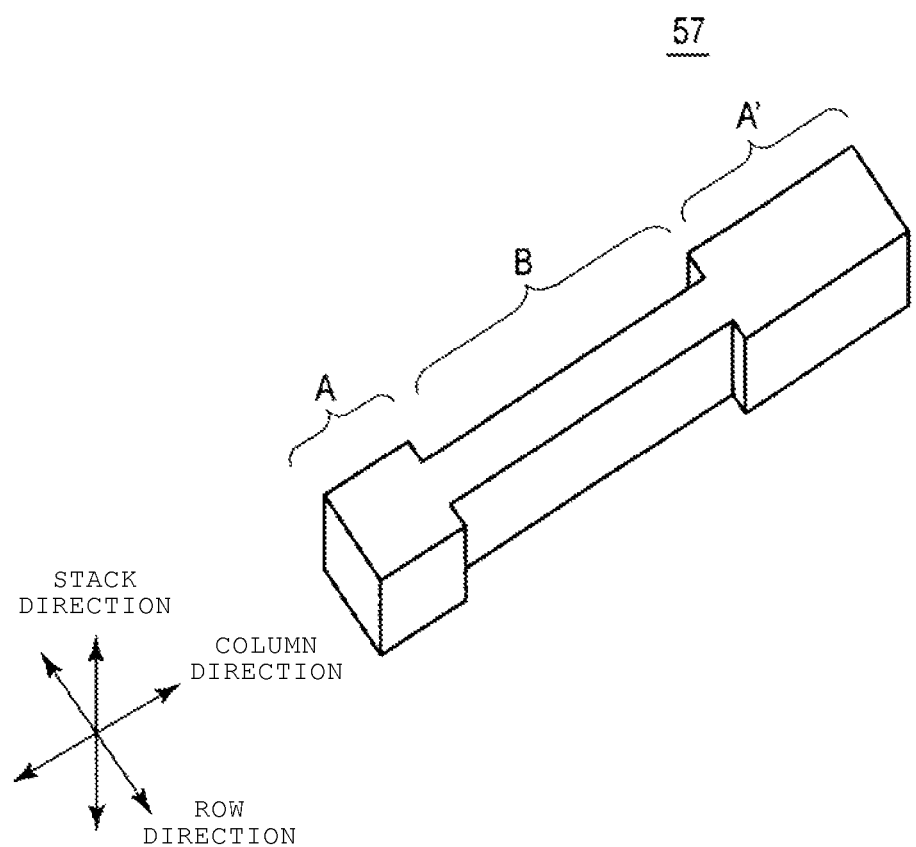
FIGS. 33A and 33B are a perspective views illustrating memory connection portions according to the sixth exemplary embodiment.

As illustrated in FIG. 33A, the memory connection portion 57 includes contact regions A and A' which are in contact with the memory columnar portions 56, and a connection region B which connects the contact regions A and A'. A dimension of each of the contact regions A and A' in the row direction is equivalent to a diameter of each of the lower surfaces of the memory columnar portions 56. On the other hand, a dimension of the connection region B in the row direction is smaller than a dimensions of each of the contact regions A and A' in the row direction.

In addition, a dimension of the connection region B in the row direction is preferably small to an extent (an extent of not being short-circuited) of not being in contact with the lower surfaces (the contact regions A and A') of the memory columnar portions 56 adjacent thereto in the row direction. That is, a dimension of the connection region B in the row direction is smaller than a distance between lower surfaces of two adjacent memory columnar portions 56 in the row direction.

Accordingly, the memory connection portion 57A and the memory connection portion 57B may be formed in the same layer and may be disposed in a high density.

In addition, if the contact region A' is made to be in contact with the memory columnar portion 56 at a position closest to the slit, a dimension of the contact region A' is larger than a dimension of the contact region A in the column direction. Accordingly, the memory connection portion 57A and the memory connection portion 57B may be disposed in a high density, and an increase in electrical resistance may be suppressed to a minimum level.

Figure 33B:
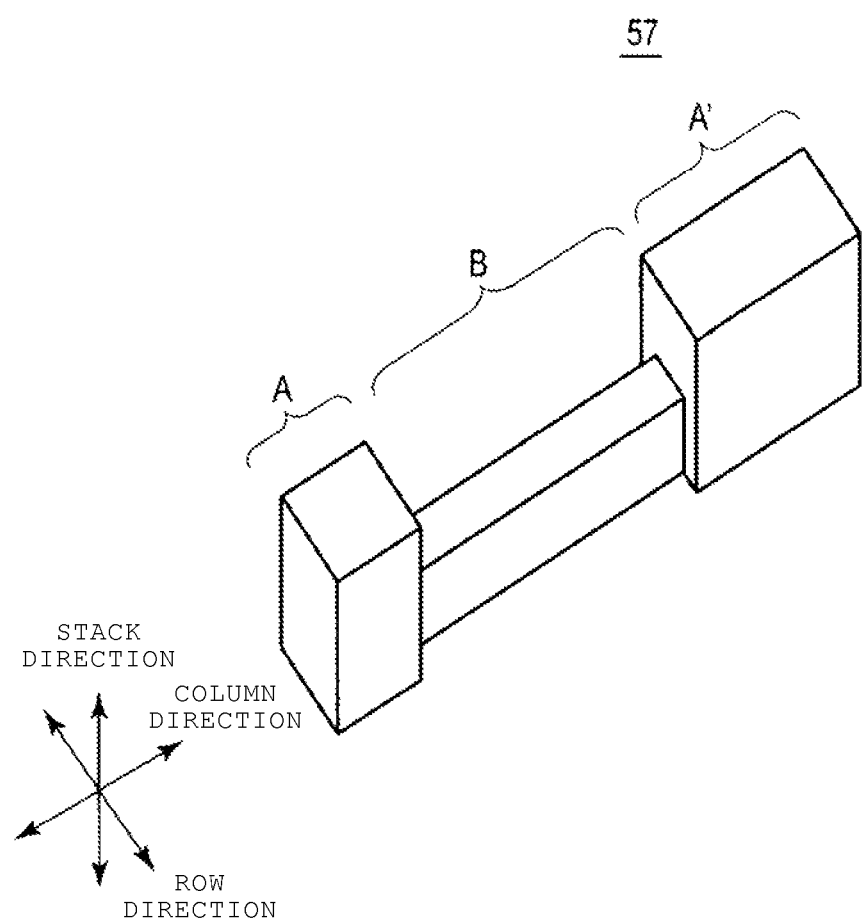

Further, there is a probability that the connection region B may be short-circuited to the lower surfaces of the memory columnar portions 56 adjacent to in the row direction even if a dimension of the connection region B in the row direction is made small. In this case, as illustrated in FIG. 33B, the upper surface of the connection region B may be a lower layer than the lower surfaces (the upper surfaces of the contact regions A and A') of the memory columnar portions 56 in order to increase a distance between the lower surfaces of the memory columnar portions 56 and the connection region B.

The third memory string is constituted by the word line groups WLG2 and WLG3 adjacent to each other in the column direction, the pair of memory columnar portions 56B3 and 56B4, the memory connection portion 57B, the source side select gate SGS, the drain side select gate SGD, and the back gate BG.

The memory columnar portion 56B3 is formed so as to extend in the stack direction and to penetrate through the source side select gate SGS and the word line group WLG2. The memory columnar portion 56B3 is disposed at the same position as the memory columnar portion 56A2 in the row direction. In addition, the memory columnar portion 56B3 is disposed so as to be adjacent to the memory columnar portion 56B2 on a side opposite the memory columnar portion 56A2 in the column direction. An upper end of the memory columnar portion 56B3 is electrically connected to the source line SL. On the other hand, a lower end of the memory columnar portion 56B3 reaches the upper surface of the back gate BG, and is electrically connected to the memory connection portion 57B.

The memory columnar portion 56B4 is formed so as to extend in the stack direction and to penetrate through the drain side select gate SGD and the word line group WLG3. The memory columnar portion 56B4 is disposed at the same position as the memory columnar portion 56B3 in the row direction. An upper end of the memory columnar portion 56B4 is electrically connected to the bit line BL0. On the other hand, a lower end of the memory columnar portion 56B4 reaches the upper surface of the back gate BG, and is electrically connected to the memory connection portion 57B.

The memory connection portion 57B extends in the column direction and is formed inside the back gate BG. The memory connection portion 57B is formed so as to be in contact with the lower end of the memory columnar portion 56B3 and the lower end of the memory columnar portion 56B4. Accordingly, the memory columnar portion 56B3, the memory connection portion 57B, and the memory columnar portion 56B4 are electrically connected to each other.

The fourth memory string is constituted by the word line groups WLG2 and WLG3 adjacent to each other in the column direction, the pair of memory columnar portions 56A3 and 56A4, the memory connection portion 57A, the source side select gate SGS, the drain side select gate SGD, and the back gate BG.

The memory columnar portion 56A3 is formed so as to extend in the stack direction and to penetrate through the source side select gate SGS and the word line group WLG2. The memory columnar portion 56A3 is disposed at the same position as the memory columnar portion 56B2 in the row direction. In addition, the memory columnar portion 56A3 is disposed so as to be adjacent to the memory columnar portion 56B3 on a side opposite the memory columnar portion 56B2 in the column direction. An upper end of the memory columnar portion 56A3 is electrically connected to the source line SL. On the other hand, a lower end of the memory columnar portion 56A3 reaches the upper surface of the back gate BG, and is electrically connected to the memory connection portion 57A.

The memory columnar portion 56A4 is formed so as to extend in the stack direction and to penetrate through the drain side select gate SGD and the word line group WLG3. The memory columnar portion 56A4 is disposed at the same position as the memory columnar portion 56A3 in the row direction. In addition, the memory columnar portion 56A4 is disposed so as to be adjacent to the memory columnar portion 56B4 in the column direction. An upper end of the memory columnar portion 56A4 is electrically connected to the bit line BL2. On the other hand, a lower end of the memory columnar portion 56A4 reaches the upper surface of the back gate BG, and is electrically connected to the memory connection portion 57A.

The memory connection portion 57A extends in the column direction and is formed inside the back gate BG. The memory connection portion 57A is formed so as to be in contact with the lower end of the memory columnar portion 56A3 and the lower end of the memory columnar portion 56A4. Accordingly, the memory columnar portion 56A3, the memory connection portion 57A, and the memory columnar portion 56A4 are electrically connected to each other.

The memory columnar portion 56B4 is disposed between the memory columnar portion 56A3 and the memory columnar portion 56A4 in the column direction. The memory columnar portion 56A3 is disposed between the memory columnar portion 56B3 and the memory columnar portion 56B4 in the column direction. In addition, a distance between the memory columnar portion 56A3 and the memory columnar portion 56A4 is equivalent to a distance between the memory columnar portion 56B3 and the memory columnar portion 56B4. In other words, a dimension of the memory connection portion 57A in the column direction is equivalent to a dimension of the memory connection portion 57B in the column direction.

Effects of the Sixth Exemplary Embodiment

According to the sixth exemplary embodiment, the NAND string including the pair of memory columnar portions 56A and the memory connection portion 57A connecting the memory columnar portions 56A to each other, and the NAND string including the pair of memory columnar portions 56B between which a distance is equivalent to a distance between the pair of memory columnar portions 56A and the memory connection portion 57B connecting the memory columnar portions 56B to each other, are formed. In addition, a width of each of the memory connection portion 57A and the memory connection portion 57B is made smaller than a diameter of each of the memory columnar portion 56A and the memory columnar portion 56B, and thus memory connection portions may be formed in the same layer and may be formed in a high density. Accordingly, the memory columnar portions 56 of four columns may be formed in a zigzag arrangement in a single word line group WLG, thereby achieving a high density of memory cells.

Further, in the sixth exemplary embodiment, the memory columnar portions 56 are formed in a zigzag arrangement, and the memory connection portions 57 are also formed in a zigzag arrangement. In other words, each NAND string is formed in the same configuration (the same dimension), and thus a configuration and an operation of the sense amplifier 4 or the back gate BG may be further simplified than in the first exemplary embodiment.

Seventh Exemplary Embodiment

With reference to FIGS. 34 to 66, a nonvolatile semiconductor memory device according to a seventh exemplary embodiment will be described. In the seventh exemplary embodiment, a NAND string including four memory columnar portions 56E, 56F, 56G and 56H and the memory connection portion 57 connecting lower ends thereof to each other, is formed. In addition, upper ends of the memory columnar portions 56E, 56F, 56G and 56H are respectively connected to bit lines BL, and each of the bit lines BL may be connected to either of the source line SL and the sense amplifier 4 around the memory cell array. Accordingly, the number of memory connection portions 57 may be reduced, and formation of the source line SL may be omitted in the memory cell array. Hereinafter, the nonvolatile semiconductor memory device according to the seventh exemplary embodiment will be described in detail.

In addition, in the seventh exemplary embodiment, description of the same configuration as in the first exemplary embodiment will be omitted, and different configurations will be described mainly.

Configuration Example of Memory String Unit

Hereinafter, with reference to FIGS. 34 to 39, a configuration example of a memory string unit according to the seventh exemplary embodiment will be described.

As illustrated in FIGS. 34 to 38, the memory string unit STU includes a first memory string to a fourth memory string arranged in the column direction.

The first memory string includes the word line group WLG1, a single memory columnar portion 56E, the memory connection portion 57, the select gate SG, and the back gate BG.

The memory columnar portion 56E is formed so as to extend in the stack direction and to penetrate through the select gate SG and the word line group WLG1. An upper end of the memory columnar portion 56E is electrically connected to the bit line BL3. On the other hand, a lower end of the memory columnar portion 56E reaches an upper surface of the back gate BG, and is electrically connected to the memory connection portion 57.

The second memory string includes the word line group WLG1, a single memory columnar portion 56F, the memory connection portion 57, the select gate SG, and the back gate BG.

The memory columnar portion 56F is formed so as to extend in the stack direction and to penetrate through the same select gate SG as the memory columnar portion 56E and the word line group WLG1. The memory columnar portion 56F is disposed so as to be adjacent to the memory columnar portion 56E in the column direction. However, the memory columnar portion 56F is disposed so as to be deviated from the memory columnar portion 56E in the row direction. An upper end of the memory columnar portion 56F is electrically connected to the bit line BL1. On the other hand, a lower end of the memory columnar portion 56F reaches the upper surface of the back gate BG, and is electrically connected to the memory connection portion 57.

The third memory string includes the word line group WLG2, a single memory columnar portion 56G, the memory connection portion 57, the select gate SG, and the back gate BG.

The memory columnar portion 56G is formed so as to extend in the stack direction and to penetrate through the select gate SG different from the select gate SG through which the memory columnar portion 56E penetrates, and the word line group WLG2. The memory columnar portion 56G is disposed at the same position as the memory columnar portion 56F in the row direction. An upper end of the memory columnar portion 56G is electrically connected to the bit line BL0. On the other hand, a lower end of the memory columnar portion 56G reaches the upper surface of the back gate BG, and is electrically connected to the memory connection portion 57.

The fourth memory string includes the word line group WLG2, a single memory columnar portion 56H, the memory connection portion 57, the select gate SG, and the back gate BG.

The memory columnar portion 56H is formed so as to extend in the stack direction and to penetrate through the same select gate SG as the memory columnar portion 56G and the word line group WLG2. The memory columnar portion 56H is disposed so as to be adjacent to the memory columnar portion 56G in the column direction. In addition, the memory columnar portion 56H is disposed at the same position as the memory columnar portion 56E in the row direction. An upper end of the memory columnar portion 56H is electrically connected to the bit line BL2. On the other hand, a lower end of the memory columnar portion 56H reaches the upper surface of the back gate BG, and is electrically connected to the memory connection portion 57.

The memory connection portion 57 extends in the column direction and is formed inside the back gate BG. The memory connection portion 57 is formed so as to be in contact with the lower ends of the memory columnar portions 56E, 56F, 56G and 56H. Accordingly, the memory columnar portions 56E, 56F, 56G and 56H and the memory connection portion 57 are electrically connected to each other.

Figure 38:
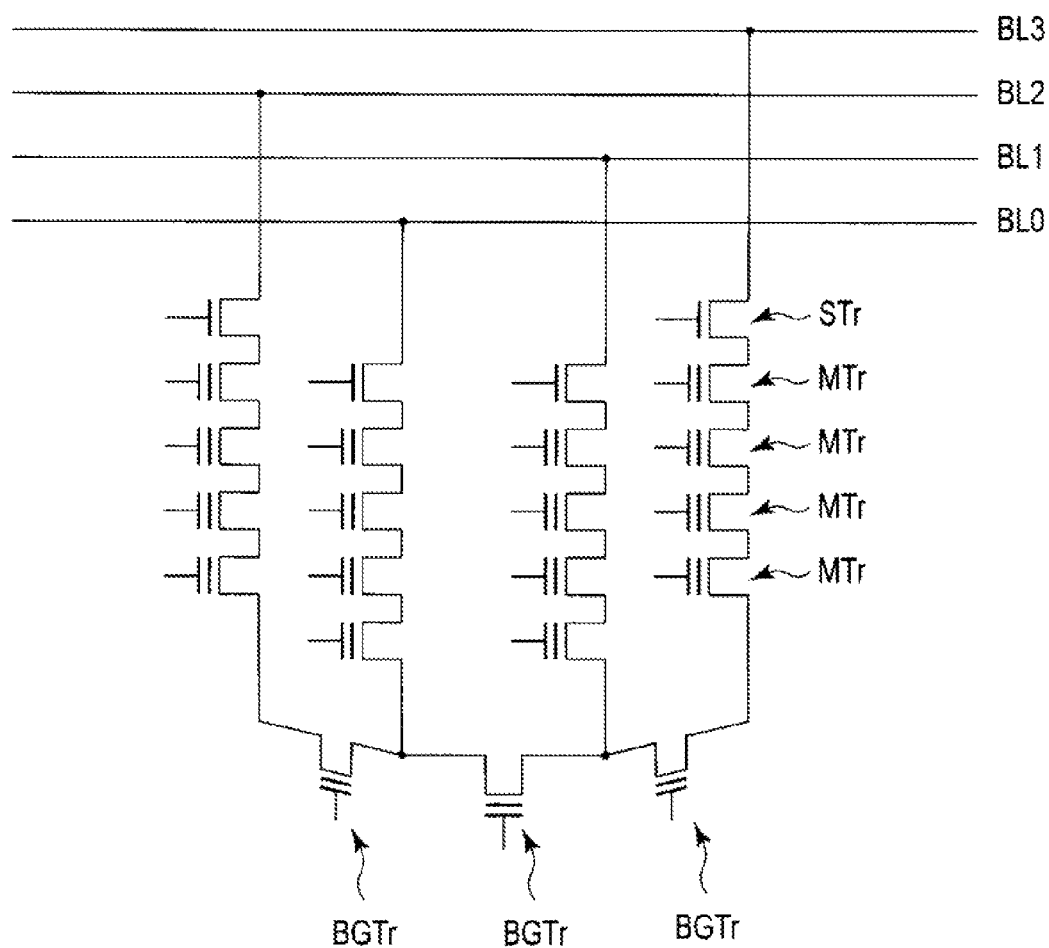
FIG. 38 is a circuit diagram illustrating the memory string unit according to the seventh exemplary embodiment.

As illustrated in FIG. 38, in each memory string, the memory columnar portion 56 and the select gate SG form a select transistor STr; the memory columnar portion 56 and the word line WL form the memory cell transistor MTr; and the memory connection portion 57 and the back gate BG form a back gate transistor BGTr.

As illustrated, the adjacent memory strings share the same back gate transistor BGTr. Gates of all the back gate transistors BGTr are connected in common. In addition, gates of the memory cell transistors MTr of the same layer in the memory strings (the first memory string and the second memory string) connected to the odd-numbered bit lines BL are connected to a common word line WL. Similarly, gates of the memory cell transistors MTr of the same layer in the memory strings (the third memory string and the fourth memory string) connected to the even-numbered bit lines BL are connected to a common word line WL.

Figure 39:
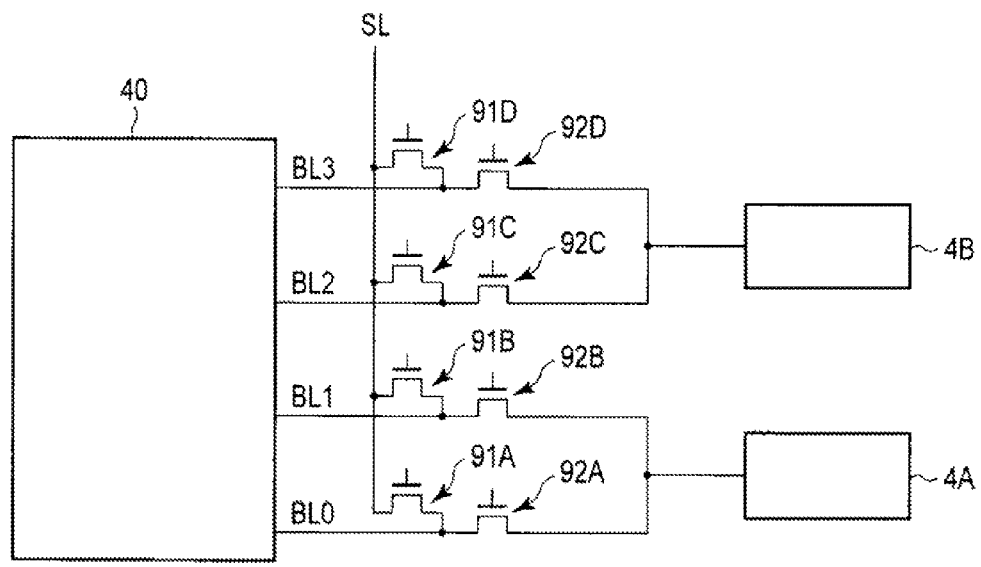
FIG. 39 is a circuit diagram illustrating an example of a connection between a NAND string and a sense amplifier according to the seventh exemplary embodiment.

As illustrated in FIG. 39, the bit lines BL0 and BL1 are electrically connected in common to the sense amplifier 4A. More specifically, the bit line BL0 is electrically connected to one end of a current path of a transistor 92A, and the other end of the current path of the transistor 92A is electrically connected to the sense amplifier 4A. Similarly, the bit line BL1 is electrically connected to the sense amplifier 4A via a transistor 92B.

Similarly, the bit lines BL2 and BL3 are electrically connected in common to the sense amplifier 4B via transistors 92C and 92D.

The bit lines BL0, BL1, BL2 and BL3 are electrically connected in common to the source line SL. More specifically, the bit line BL0 is electrically connected to one end of the current path of a transistor 91A, and the other end of the current path of the transistor 91A is electrically connected to the source line SL. Similarly, the bit lines BL1, BL2 and BL3 are connected to the source line SL via transistors 91B, 91C and 91D.

Figure 35:
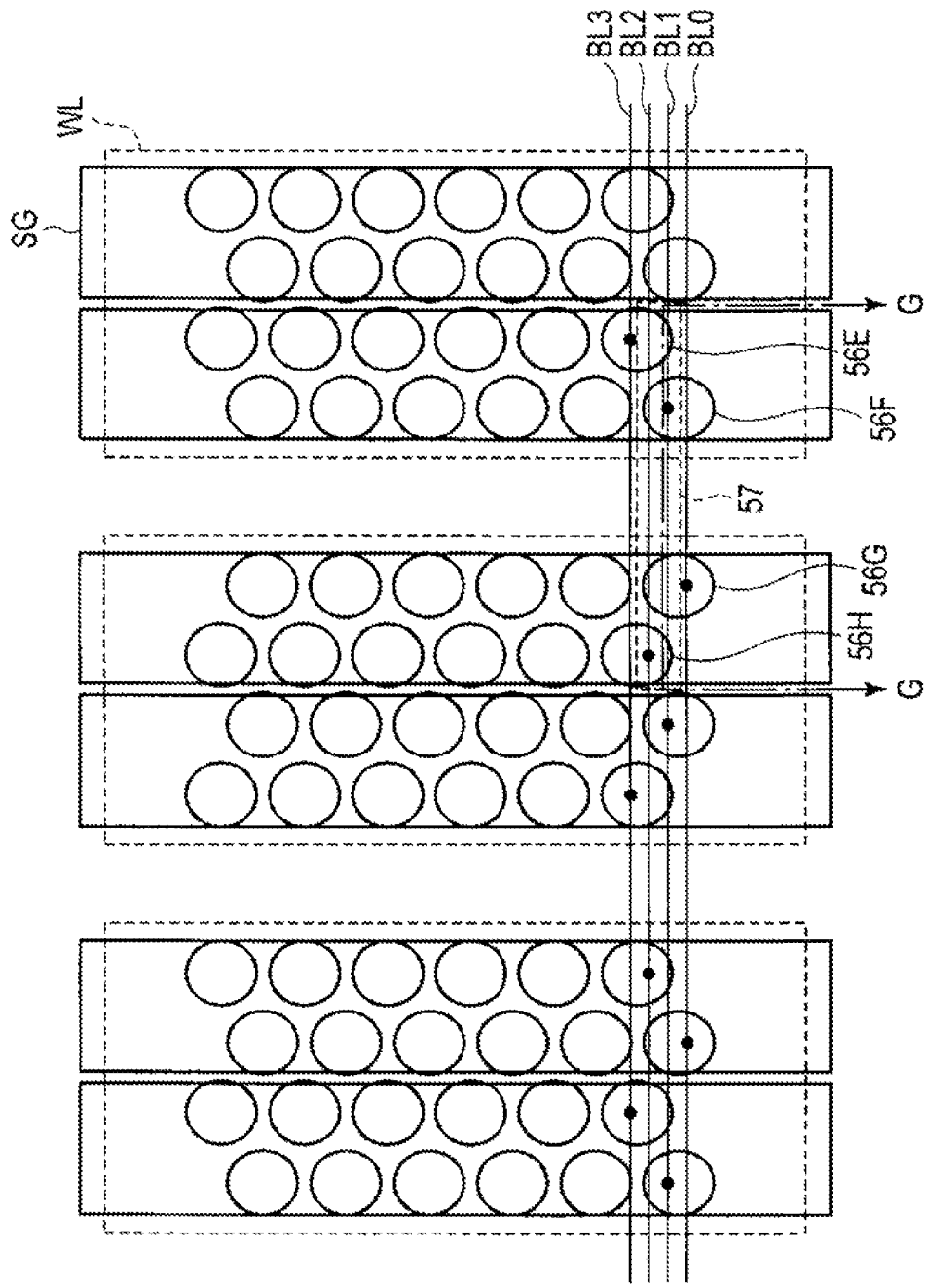
FIG. 35 is a plan view illustrating a memory string unit according to the seventh exemplary embodiment.

In addition, as illustrated in FIG. 35, the select gate SG may be divided into two select gates in the column direction. Accordingly, leakage current and program disturbance of an unselected memory string may be alleviated.

Figure 36:
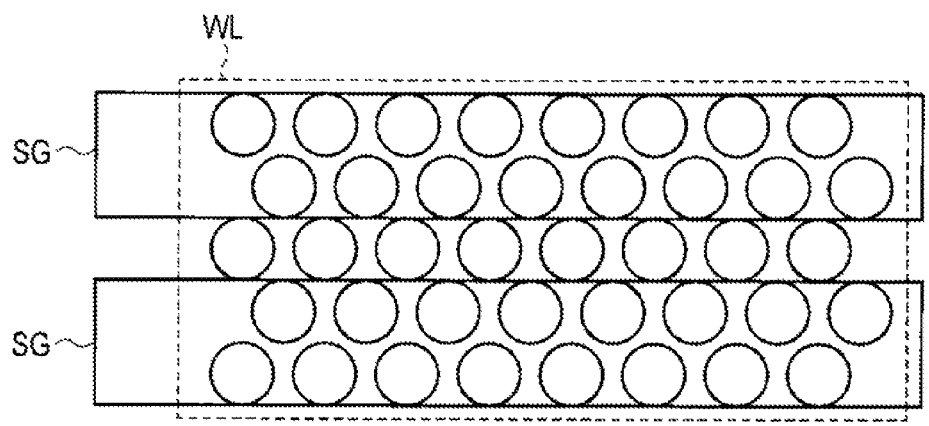
FIG. 36 is a plan view illustrating a memory string unit according to the seventh exemplary embodiment.
Figure 37:
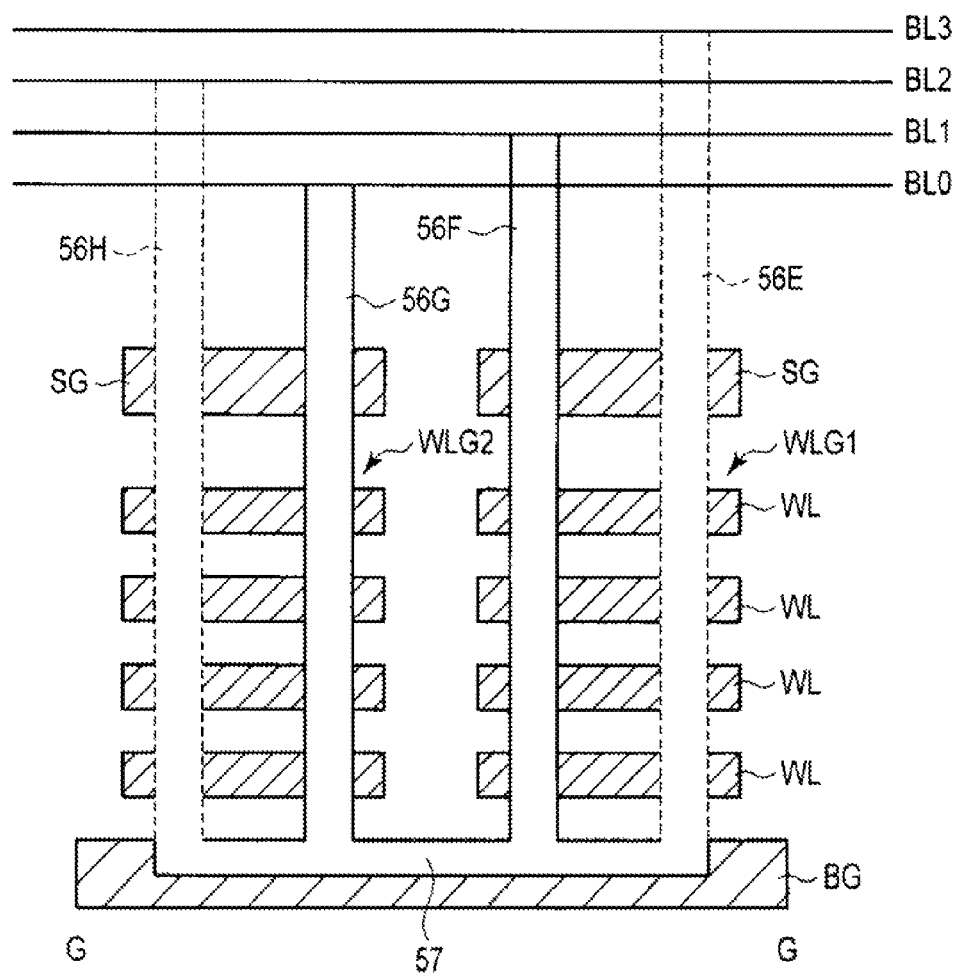
FIG. 37 is a cross-sectional view taken along the line G-G of FIG. 34.

As illustrated in FIG. 36, the dummy holes DH may be formed between the two divided select gates SG in the column direction.

Read Operation

Hereinafter, a read operation will be described.

In the read operation, if the memory strings (the first memory string and the second memory string) connected to the odd-numbered bit lines BL1 and BL3 are selected memory strings, the memory strings (the third memory string and the fourth memory string) connected to the even-numbered bit lines BL0 and BL2 are unselected memory strings.

On the other hand, if the memory strings connected to the even-numbered bit lines BL0 and BL2 are selected memory strings, the memory strings connected to odd-numbered bit lines BL1 and BL3 are the unselected memory strings. In the following, a case where the memory strings connected to the odd-numbered bit lines BL1 and BL3 are the selected memory strings will be described as an example.

First, the transistors 92B and 92D are turned on, and the transistors 91B and 91D are turned off, so that the sense amplifier 4A is electrically connected to the bit line BL1, and the sense amplifier 4B is electrically connected to the bit line BL3. On the other hand, the transistors 92A and 92C are turned off, and the transistors 91A and 91C are turned on, so that the bit lines BL0 and BL2 are electrically connected to the source line SL. Accordingly, a source voltage is applied to the bit lines BL0 and BL2 so as to function as the source line SL.

In this state, a voltage Vbl is applied to the odd-numbered bit lines BL1 and BL3. On the other hand, a voltage Vss (for example, 0 V) is applied to the source line SL. In other words, the voltage Vss is applied to the even-numbered bit lines BL0 and BL2. In addition, all of the select transistors STr and the back gate transistors BGTr are made to be turned on.

Further, a voltage Vread is applied to the gates (word line WL) of all of the memory cells of the memory strings connected to the even-numbered bit lines BL0 and BL2. Accordingly, the voltage Vss is transmitted to the current path of the back gate transistor BGTr. Furthermore, a voltage Vcgr is applied to the gates of the selected memory cell transistors MTr of the even-numbered bit lines BL0 and BL2, and the voltage Vread is applied to the unselected memory cell transistors MTr. The voltage Vread is a value which is considerably greater than a threshold value of each transistor, and the voltage Vcgr is an extent of a value for slightly conducting a channel of each transistor. In other words, the voltage Vread is higher than the voltage Vcgr.

As described above, the current path of the back gate transistor BGTr is set to the same potential as the source line SL, and is set to have a potential difference with the odd-numbered bit lines BL1 and BL3, thereby performing a read operation on the memory strings connected to the odd-numbered bit lines BL1 and BL3.

Write Operation

Hereinafter, a write operation will be described.

Also in the write operation, in the same manner as in the read operation, if the memory strings connected to the odd-numbered bit lines BL1 and BL3 are selected memory strings, the memory strings connected to the even-numbered bit lines BL0 and BL2 are unselected memory strings. In the following, a case where the memory strings connected to the odd-numbered bit lines BL1 and BL3 are selected memory strings will be described as an example.

First, in the same manner as in the read operation, the bit line BL1 is electrically connected to the sense amplifier 4A, and the bit line BL3 is electrically connected to the sense amplifier 4B. On the other hand, the bit lines BL0 and BL2 are electrically connected to the source line SL.

In this state, a voltage corresponding to writing data which is temporarily stored in the sense amplifier 4 (the data storage circuit (latch section)) is applied to the odd-numbered bit lines BL1 and BL3. For example, if "0" data (data which increases a threshold value of a cell) is written, the bit line BL is set to 0 V. On the other hand, if "1" data (data which does not change a threshold value of a cell) is written, the bit line BL is set to a non-writing voltage (for example, a voltage VDD). In addition, a voltage Vsl is applied to the source line SL. Here, the voltage Vsl is set to a non-writing voltage (for example, the voltage VDD). In other words, the non-writing voltage is applied to the even-numbered bit lines BL0 and BL2. The drain side select transistors STr connected to the odd-numbered bit lines BL1 and BL3 are made to be turned on. Further, the source side select transistors STr and all of the back gate transistors BGTr are turned off. Accordingly, a channel current flows through the current paths of the memory strings connected to the odd-numbered bit lines BL1 and BL3.

Furthermore, a voltage Vpgm is applied to the gates of the selected memory cells of the even-numbered bit lines BL0 and BL2, and a voltage Vpass is applied to the gates of the unselected memory cells (Vpass<Vpgm). Accordingly, a high electric field is applied only to the selected memory cells, and data is written on the basis of data to be written which is temporarily stored in the sense amplifier 4 connected to the bit line BL.

In addition, in the write operation, the memory strings which are connected to all bit lines BL (the odd-numbered bit lines BL1 and BL3 and the even-numbered bit lines BL0 and BL2) may be selected memory strings.

Figure 40:
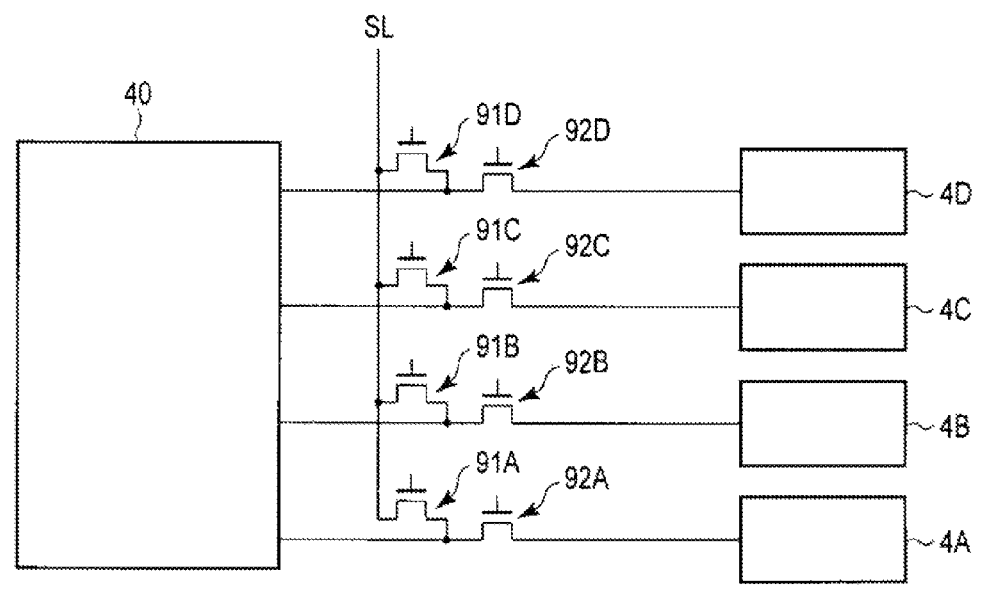
FIG. 40 is a circuit diagram illustrating another example of a connection between a NAND string and a sense amplifier according to the seventh exemplary embodiment.

In this case, as illustrated in FIG. 40, the bit lines BL0 to BL3 are required to be respectively connected to the sense amplifiers 4A to 4D. More specifically, the bit line BL0 is connected to the sense amplifier 4A via the transistor 92A; the bit line BL1 is connected to the sense amplifier 4B via the transistor 92B; the bit line BL2 is connected to the sense amplifier 4C via the transistor 92C; and the bit line BL3 is connected to the sense amplifier 4D via the transistor 92D.

Figure 41:
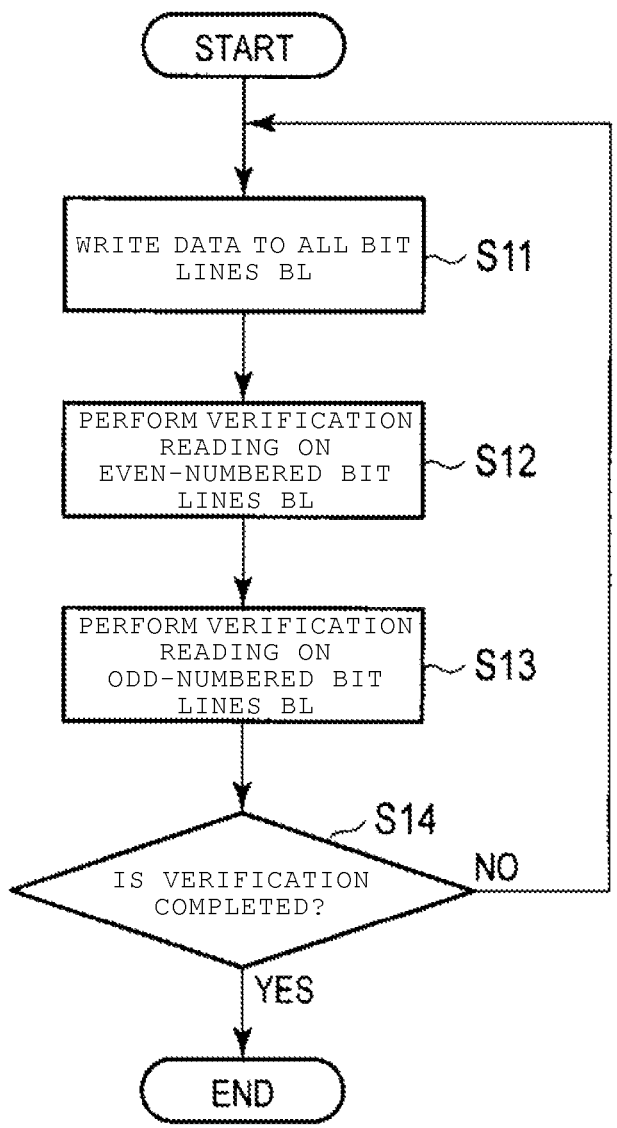
FIG. 41 is a flowchart illustrating a write operation according to the seventh exemplary embodiment.

In addition, a verification reading after data is written to all the bit lines BL is necessarily performed by selecting the odd-numbered bit lines BL1 and BL3 and the even-numbered bit lines BL0 and BL2 in the same manner as in the above-described read operation. More specifically, as illustrated in FIG. 41, data is written to all the bit lines BL (step S11), verification reading is performed on the even-numbered bit lines BL0 and BL2 (step S12), and verification reading is performed on the odd-numbered bit lines BL1 and BL3 (step S13). Then, in step S14, if the verification reading is completed, the write operation finishes (Yes in step S14). On the other hand, if the verification reading is not completed, the write operation is performed again in step S11 (No in step S14).

Modification Examples

Hereinafter, with reference to FIGS. 42 to 66, Modification Examples of the seventh exemplary embodiment will be described.

Figure 42:
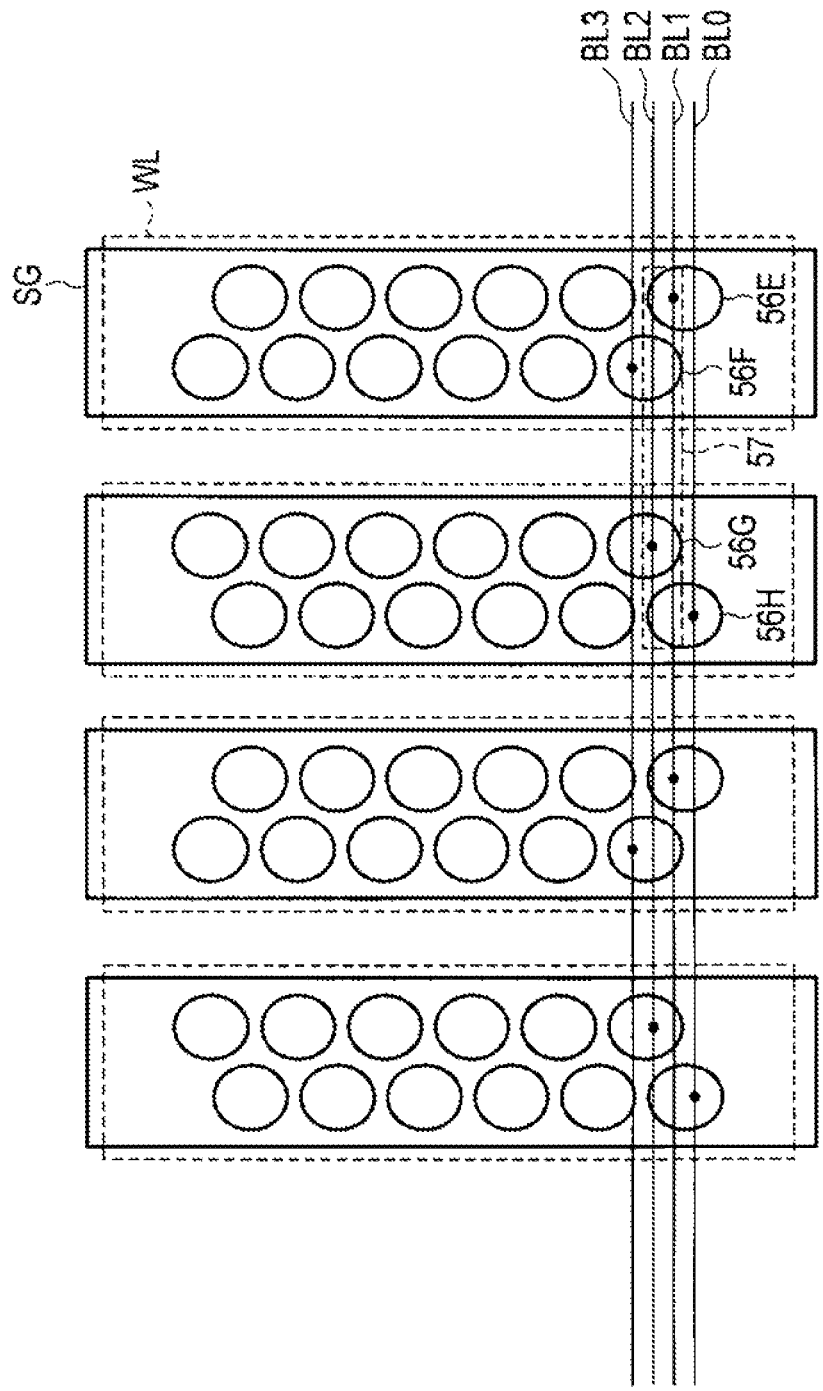
FIG. 42 is a plan view illustrating a memory string unit according to a first modification example of the seventh exemplary embodiment.

As illustrated in FIG. 42, in Modification Example 1, the word line group WLG and the select gate SG may be divided in the row direction. In other words, the memory columnar portions 56 may be disposed not in quadruple zigzags but in double zigzags.

Figure 43:
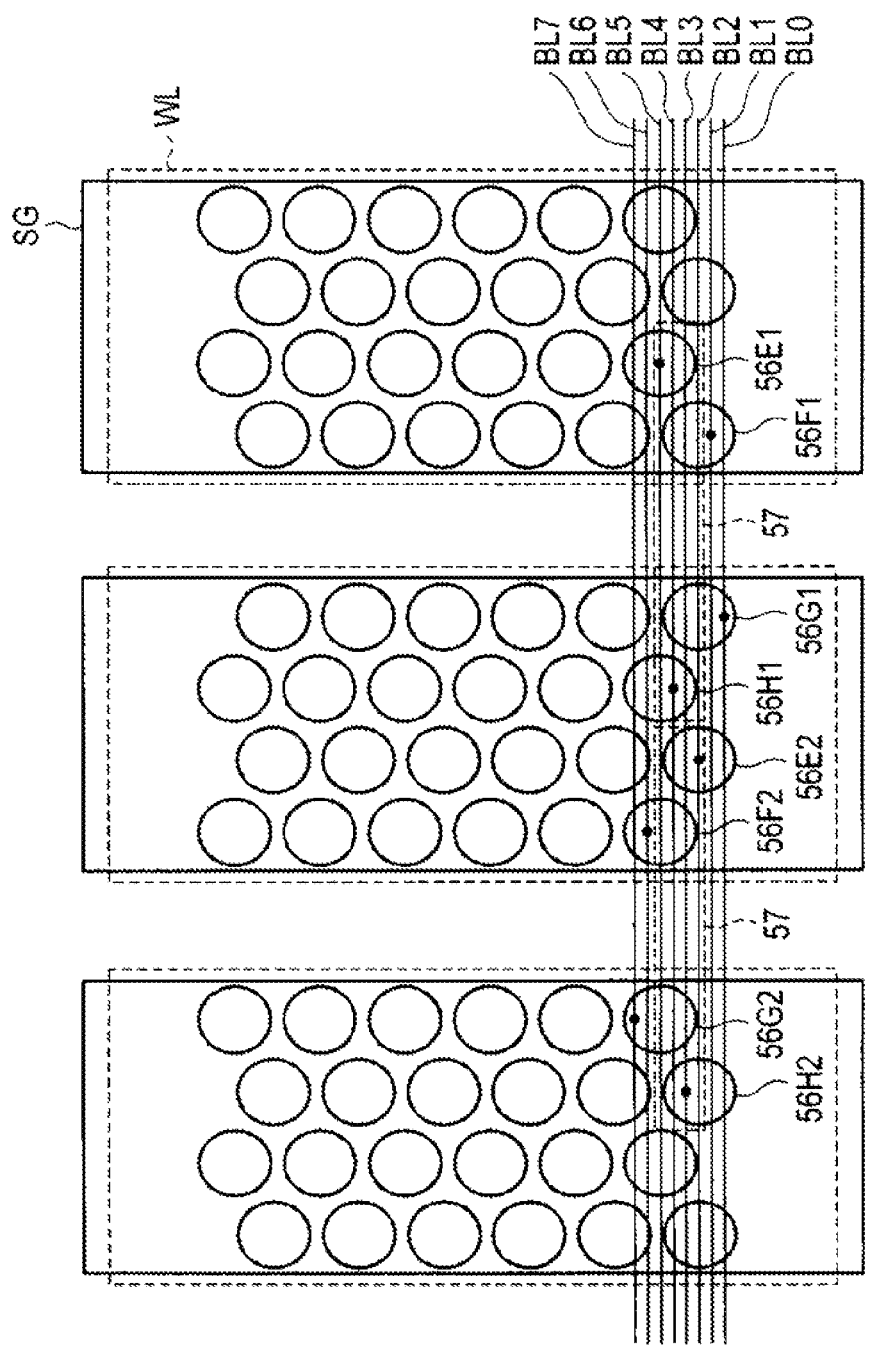
FIG. 43 is a plan view illustrating a memory string unit according to a second modification example of the seventh exemplary embodiment.
Figure 44:
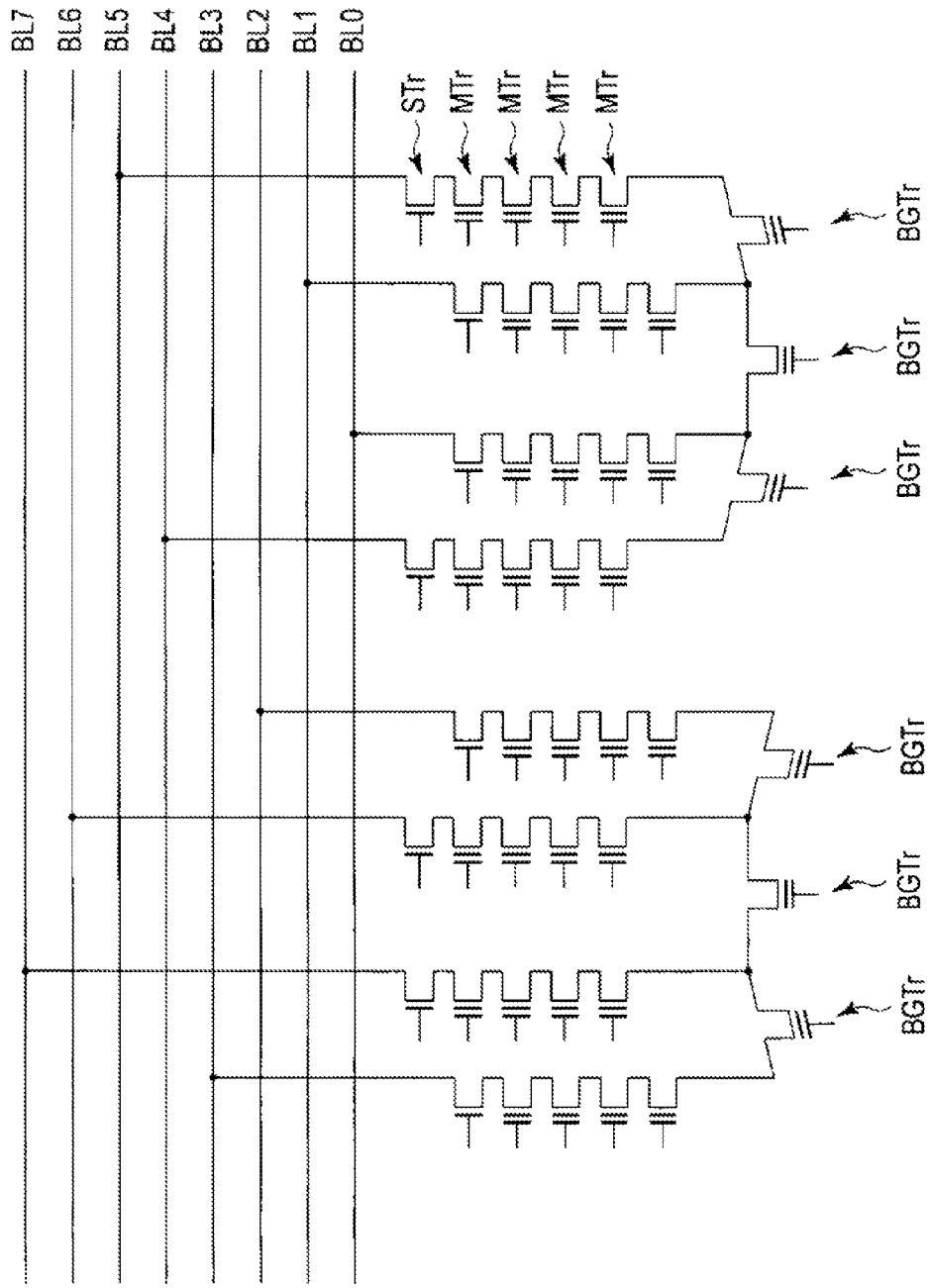
FIG. 44 is a circuit diagram illustrating a memory string unit according to the second modification example of the seventh exemplary embodiment.

As illustrated in FIGS. 43 and 44, in Modification Example 2, the number of bit lines BL may be doubled.

More specifically, in a first memory string unit including a first memory string to a fourth memory string arranged in the column direction, the first memory string (memory columnar portion 56E1) is connected to the bit line BL5, the second memory string (memory columnar portion 56F1) is connected to the bit line BL1, the third memory string (memory columnar portion 56G1) is connected to the bit line BL0, and the fourth memory string (memory columnar portion 56H1) is connected to the bit line BL4.

In addition, in a second memory string unit including a fifth memory string to an eighth memory string arranged in the column direction, the fifth memory string (memory columnar portion 56E2) is connected to the bit line BL2, the sixth memory string (memory columnar portion 56F2) is connected to the bit line BL6, the seventh memory string (memory columnar portion 56G2) is connected to the bit line BL7, and the eighth memory string (memory columnar portion 56H2) is connected to the bit line BL3.

In a case of Modification Example 2, when the memory holes MH of the block BLK boundary as illustrated in FIGS. 24 to 26 are selected, the double word lines WL and select gates SG at both ends of the block BLK are selected.

As above, according to Modification Example 2, the number of bit lines BL is made to be doubled, and thus the number of selected memory strings may be doubled. For this reason, writing and reading performances may be improved by a factor of two.

Figure 45:
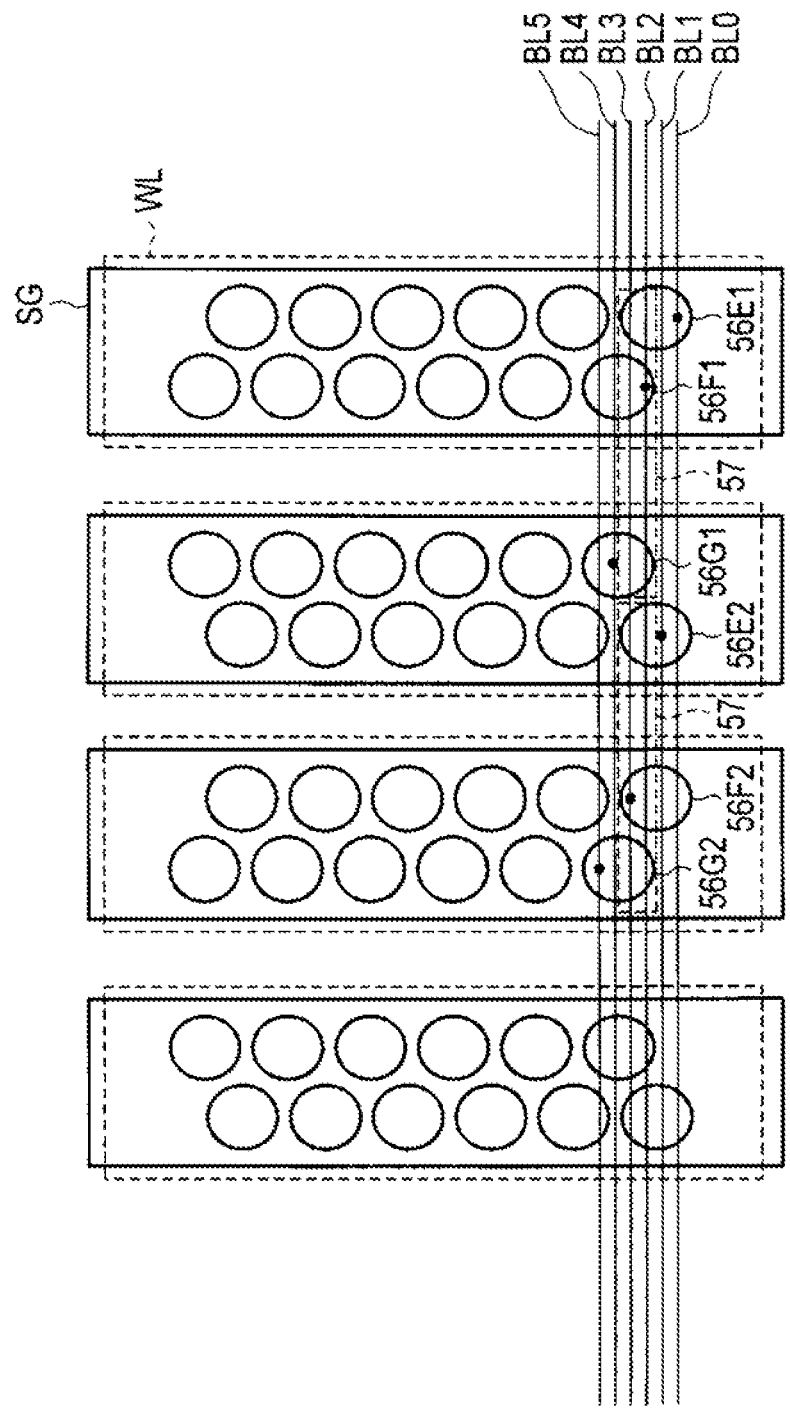
FIG. 45 is a plan view illustrating a memory string unit according to a third modification example of the seventh exemplary embodiment.
Figure 46:
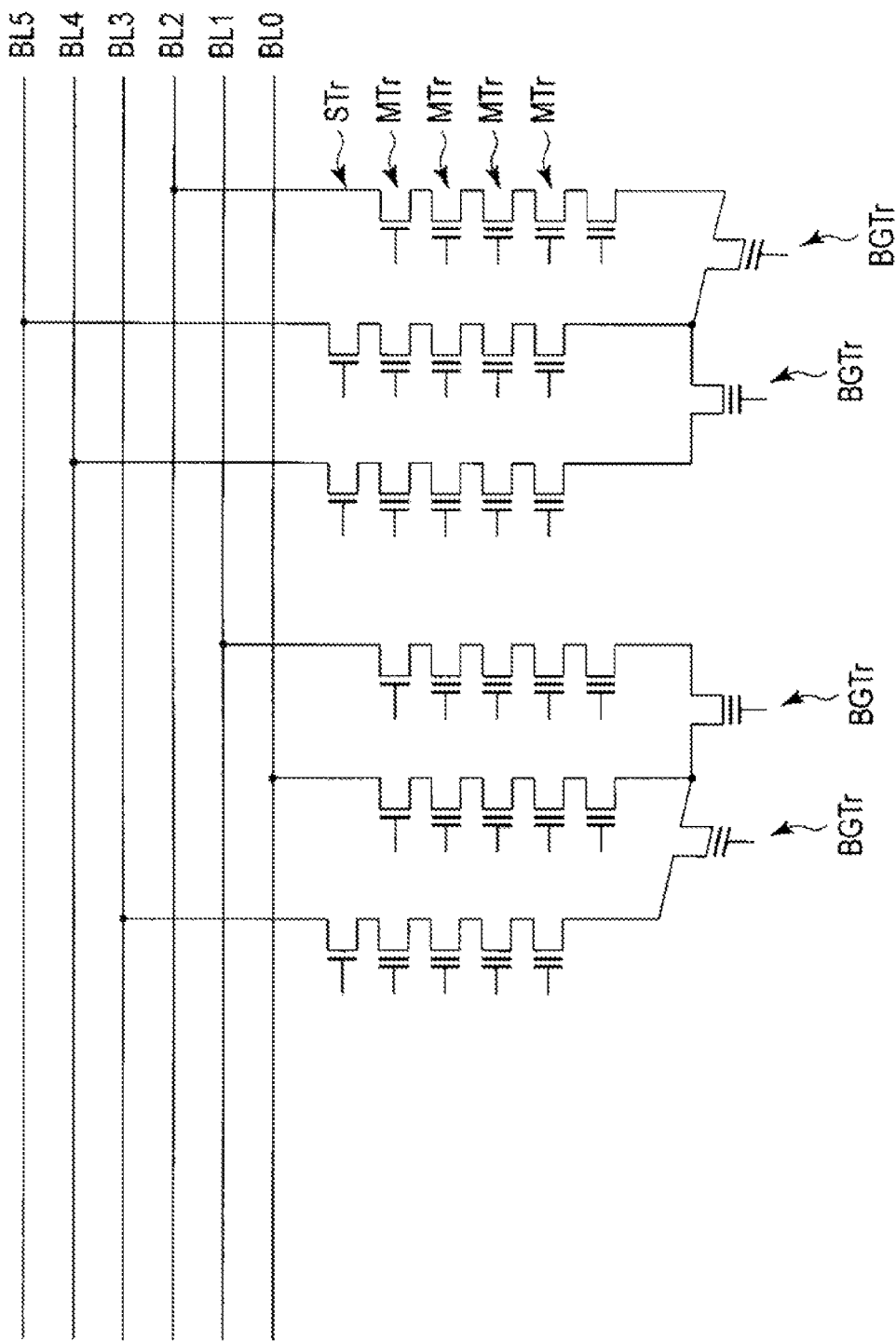
FIG. 46 is a circuit diagram illustrating a memory string unit according to the third modification example of the seventh exemplary embodiment.

As illustrated in FIGS. 45 and 46, in Modification Example 3, the memory string unit may include three memory strings, and the number of bit lines BL may be 1.5 times.

More specifically, in a first memory string unit including a first memory string to a third memory string arranged in the column direction, the first memory string (memory columnar portion 56E1) is connected to the bit line BL2, the second memory string (memory columnar portion 56F1) is connected to the bit line BL5, and the third memory string (memory columnar portion 56G1) is connected to the bit line BL4.

In addition, in a second memory string unit including a fourth memory string to a sixth memory string arranged in the column direction, the fourth memory string (memory columnar portion 56E2) is connected to the bit line BL1, the fifth memory string (memory columnar portion 56F2) is connected to the bit line BL0, and the sixth memory string (memory columnar portion 56G2) is connected to the bit line BL3.

As above, according to Modification Example 3, the number of bit lines BL is made to be 1.5 times, and thus the number of selected memory strings may be 1.5 times. For this reason, writing and reading performances may be improved by a factor of 1.5 times.

In the above Modification Examples 2 and 3, the number of bit lines BL is increased, and thus a pitch between the bit lines BL is reduced. Accordingly, there is a case where processing such as lithography is hard to be performed. In addition, of two adjacent bit lines BL, one bit line BL is selected, and the other bit line BL is unselected (source line SL). Therefore, the number of bit lines BL which are simultaneously selected is reduced.

Figure 47:
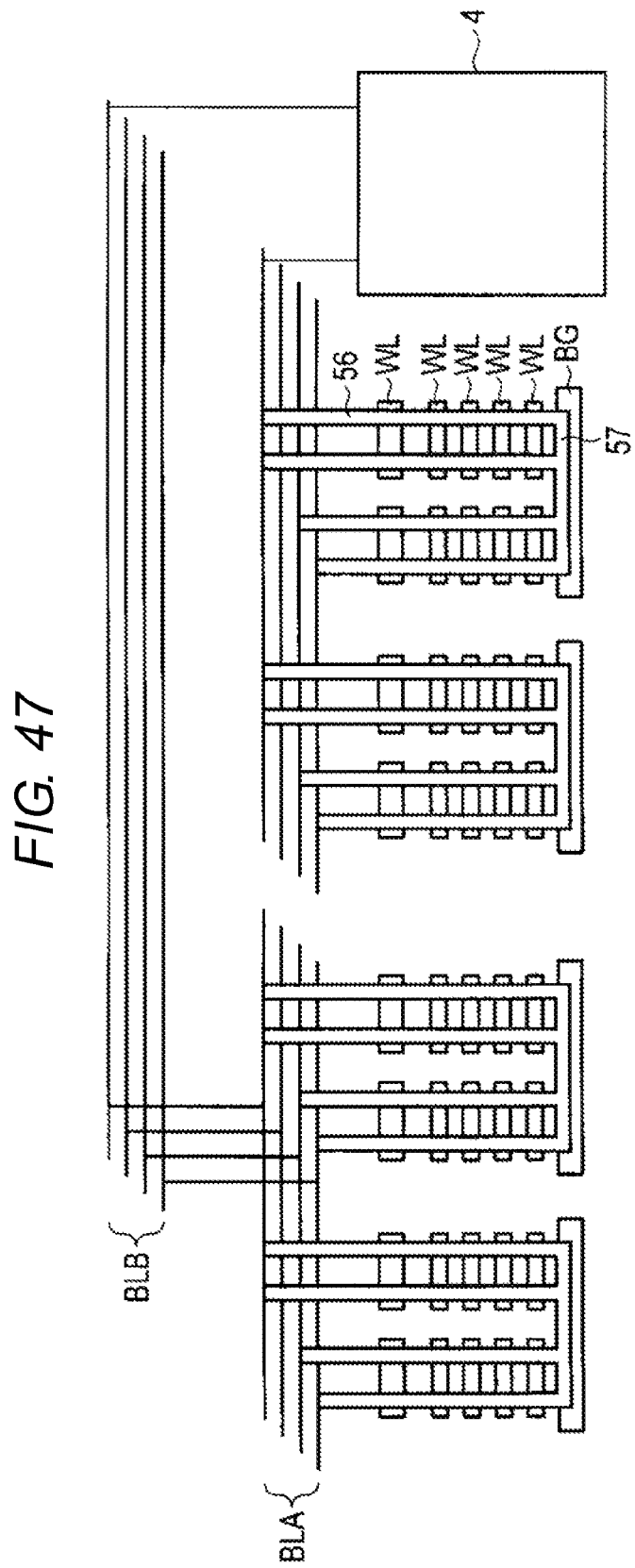
FIG. 47 is a cross-sectional view illustrating a memory string unit according to second and third modification examples of the seventh exemplary embodiment.

In contrast, as illustrated in FIG. 47, the bit lines BL may be formed in a plurality of layers. More specifically, bit lines BLA are formed in the first layer, and bit lines BLB are formed in a second layer which is located over the first layer. Some of the bit lines BLA disposed in the first layer are directly connected to the sense amplifier 4. On the other hand, the others of the bit lines BLA disposed in the first layer are connected to the sense amplifier 4 via the bit lines BLB of the second layer. Accordingly, the number of selected memory strings may be doubled or several times. For this reason, writing and reading performances may be improved.

Figure 48:
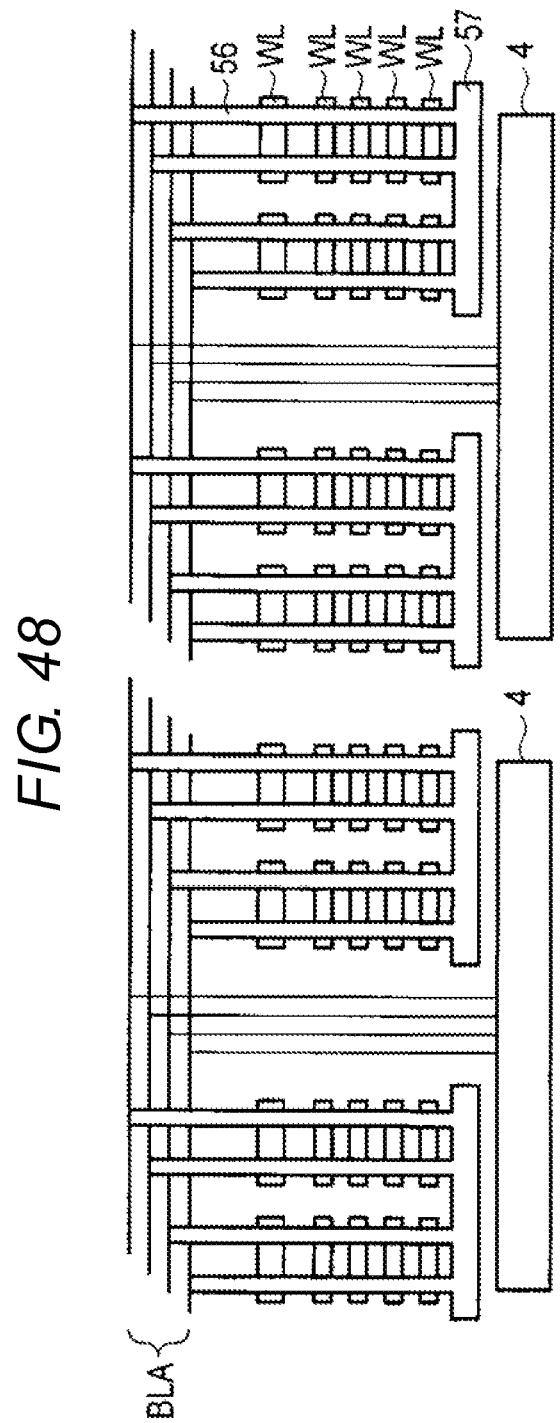
FIG. 48 is a cross-sectional view illustrating a memory string unit according to second and third modification examples of the seventh exemplary embodiment.

In addition, as illustrated in FIG. 48, only bit lines BLA of the first layer may be formed, and the sense amplifier 4 may be provided on a lower side for each predetermined region. More specifically, some of the bit lines BLA disposed in the first layer are directly connected to the sense amplifier 4 which is disposed thereunder. On the other hand, the others of the bit lines BLA disposed in the first layer are directly connected to the sense amplifier 4 disposed thereunder.

Figure 49:
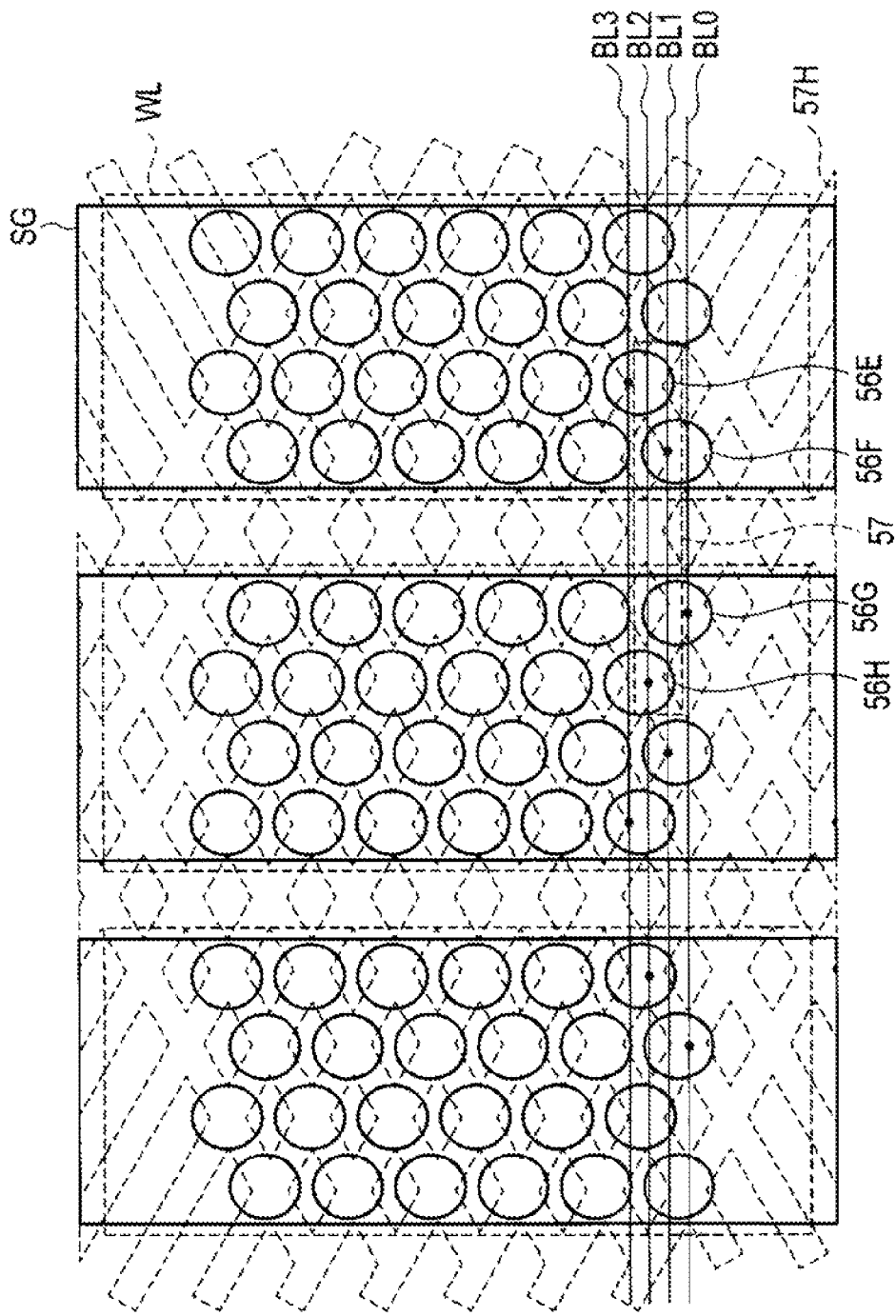
FIG. 49 is a plan view illustrating a memory string unit according to the fourth modification example of the seventh exemplary embodiment.
Figure 50:
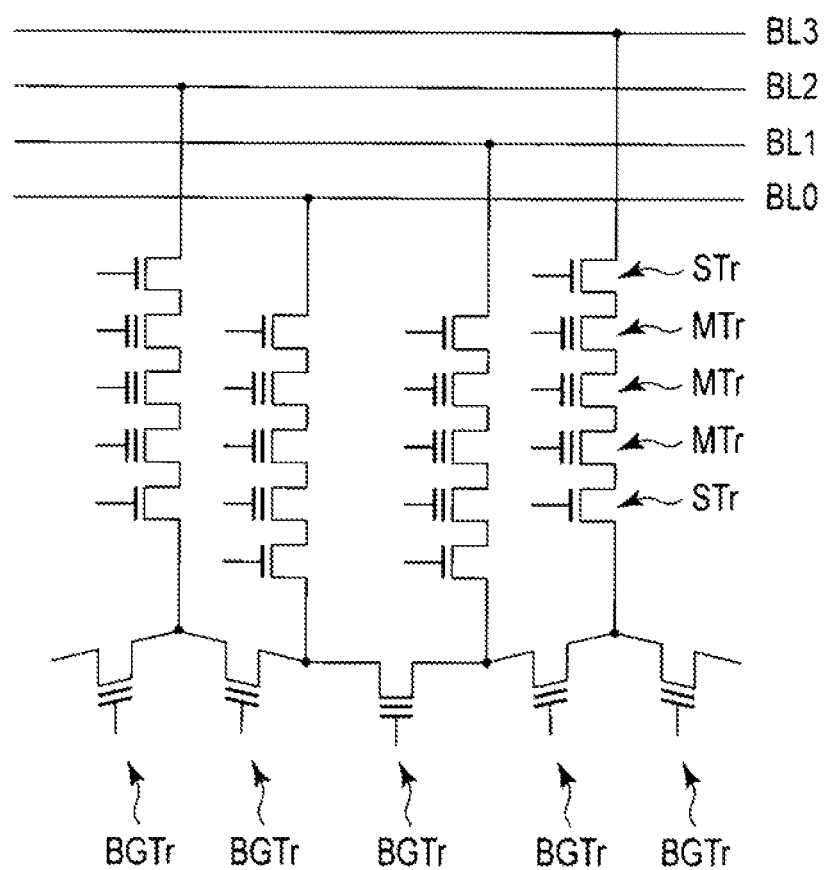
FIG. 50 is a circuit diagram illustrating a memory string unit according to the fourth modification example of the seventh exemplary embodiment.

As illustrated in FIGS. 49 and 50, in Modification Example 4, four memory strings may not only be connected to each other via the memory connection portion 57, but a plurality of memory strings may also be connected to each other via a memory connection portion 57H.

The memory connection portion 57H is formed in the same layer (back gate BG) as the memory connection portion 57. The memory connection portion 57H extends, for example, in a tilt direction with respect to the row direction and the column direction, and is formed in a lattice form. Accordingly, all the memory strings adjacent to each other along the memory connection portion 57H are connected to each other via the back gate transistors BGTr. In addition, the memory connection portion 57H may be formed over adjacent blocks BLK, and may be divided in the adjacent blocks. In other words, the memory strings may be connected to and disconnected from each other in the adjacent blocks BLK. Further, the select transistor STr is formed between the memory cell transistor MTr which is located at the lowermost side of the memory string and the back gate transistor BGTr. The select transistor STr is turned on in a read operation, and is turned off in a write operation.

As above, according to Modification Example 4, a plurality of selected memory strings are connected to a plurality of unselected memory strings, thereby averaging floating of sources (current paths of the back gate transistors BGTr).

Figure 51:
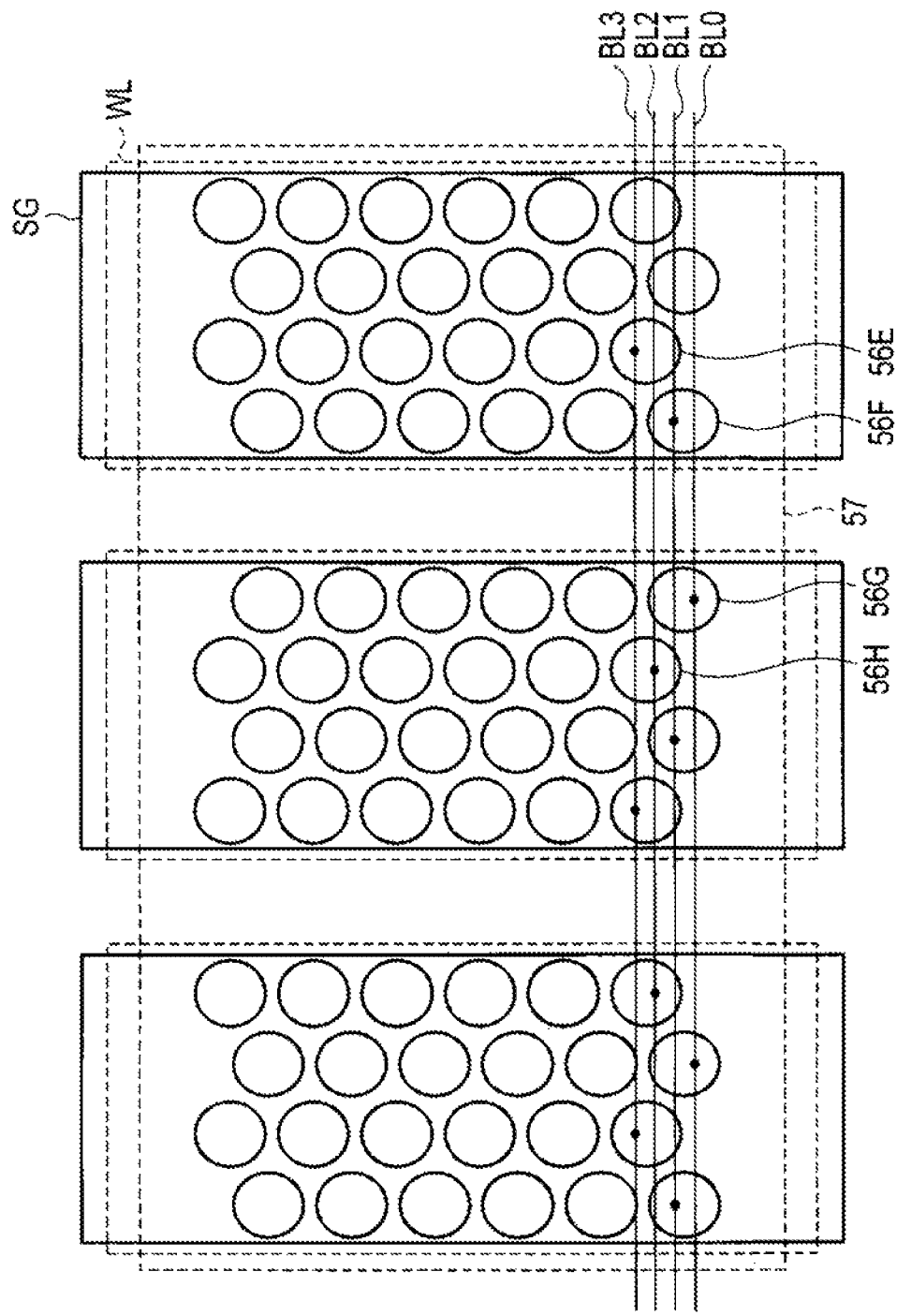
FIG. 51 is a plan view illustrating a memory string unit according to a fifth modification example of the seventh exemplary embodiment.
Figure 61:
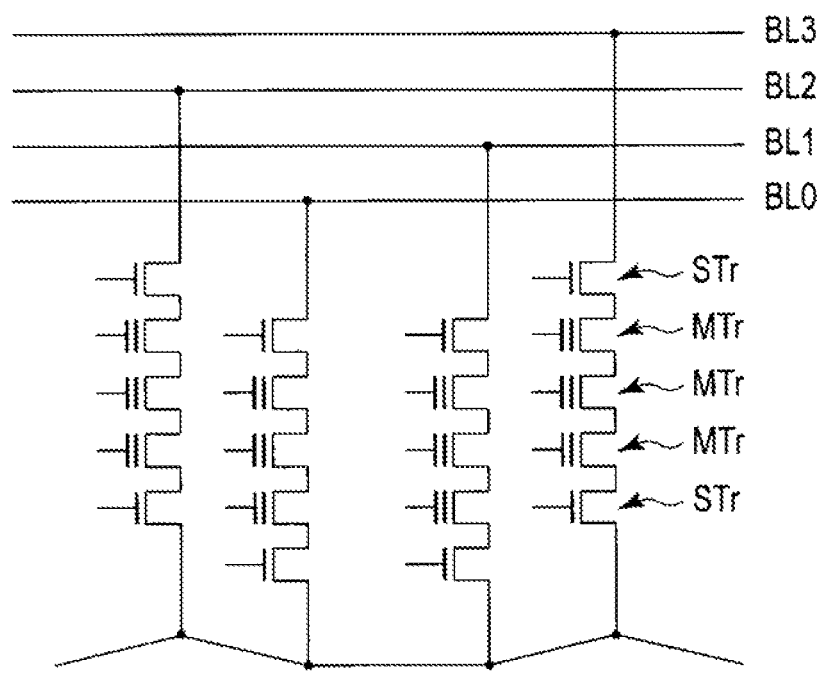
FIG. 61 is a circuit diagram illustrating a memory string unit according to the fifth modification example of the seventh exemplary embodiment.

As illustrated in FIGS. 51 and 61, in Modification Example 5, a plurality of memory strings may be connected to each other via the planar memory connection portion 57.

The memory connection portion 57 is formed so as to spread in the row direction and the column direction. Accordingly, all the memory strings are connected to each other via the back gate transistors BGTr. In addition, the memory connection portion 57 may be formed over adjacent blocks BLK, and may be divided in the adjacent blocks. In other words, the memory strings may be connected to and disconnected from each other in the adjacent blocks BLK. Further, the select transistor STr is formed between the memory cell transistor MTr which is located at the lowermost side of the memory string and the back gate transistor BGTr.

In addition, the memory connection portion 57 may be formed of a conductive layer. In this case, as illustrated in FIG. 61, all memory strings are electrically connected to each other without forming the back gate transistor BGTr.

As above, according to Modification Example 5, a plurality of selected memory strings are connected to a plurality of unselected memory strings, thereby averaging floating of sources (current paths of the back gate transistors BGTr).

Figure 52:
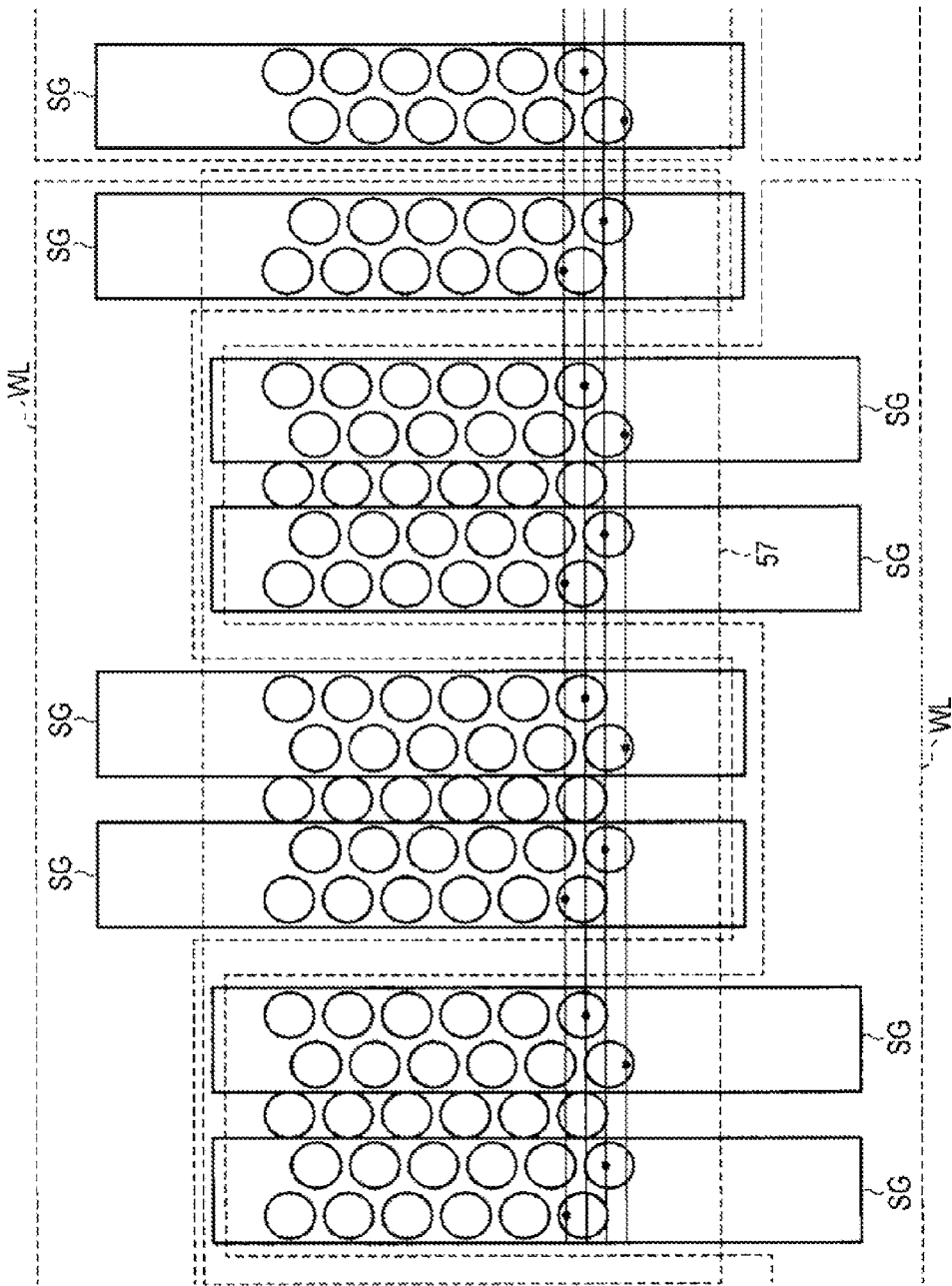
FIG. 52 is a plan view illustrating a memory string unit according to the fifth modification example of the seventh exemplary embodiment.

As illustrated in FIG. 52, a pitch of the select gate SG may be a half of a pitch of the word line WL. In addition, roots (end portions) of the word lines WL may be bundled every other line, so as to be electrically connected to each other. Therefore, the number of word line driving circuits may be reduced. Further, the dummy holes DH may be formed between two divided select gates SG in the same manner as in FIG. 36.

Figure 53:
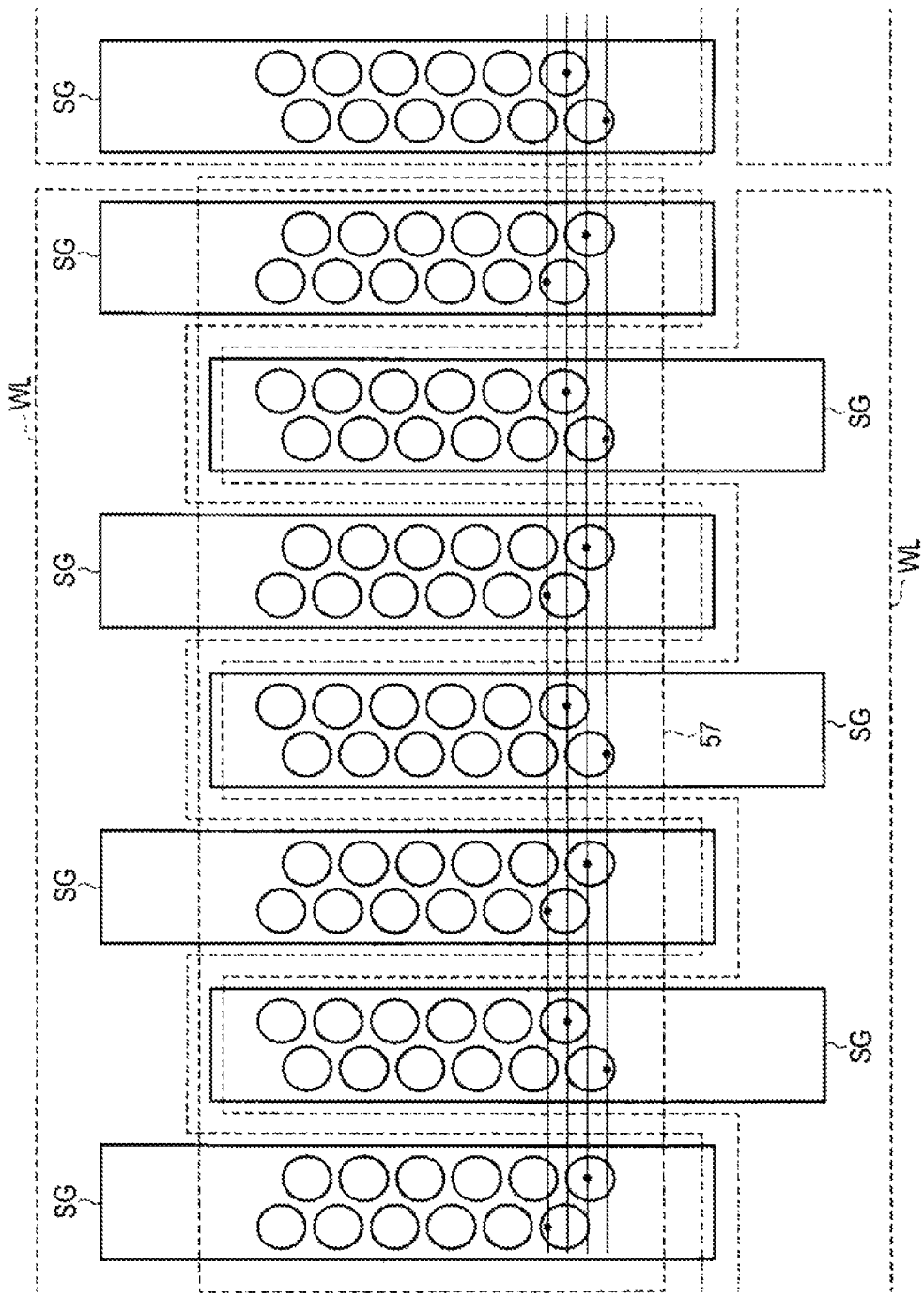
FIG. 53 is a plan view illustrating a memory string unit according to the fifth modification example of the seventh exemplary embodiment.

As illustrated in FIG. 53, a pitch of the select gate SG may be the same as a pitch of the word line WL, and two memory holes MH (memory columnar portions 56) may be disposed in each select gate SG and each word line WL in the column direction. In addition, roots (end portions) of the word lines WL may be bundled every other line, so as to be electrically connected to each other. Therefore, the number of word line driving circuits may be reduced.

Figure 54:
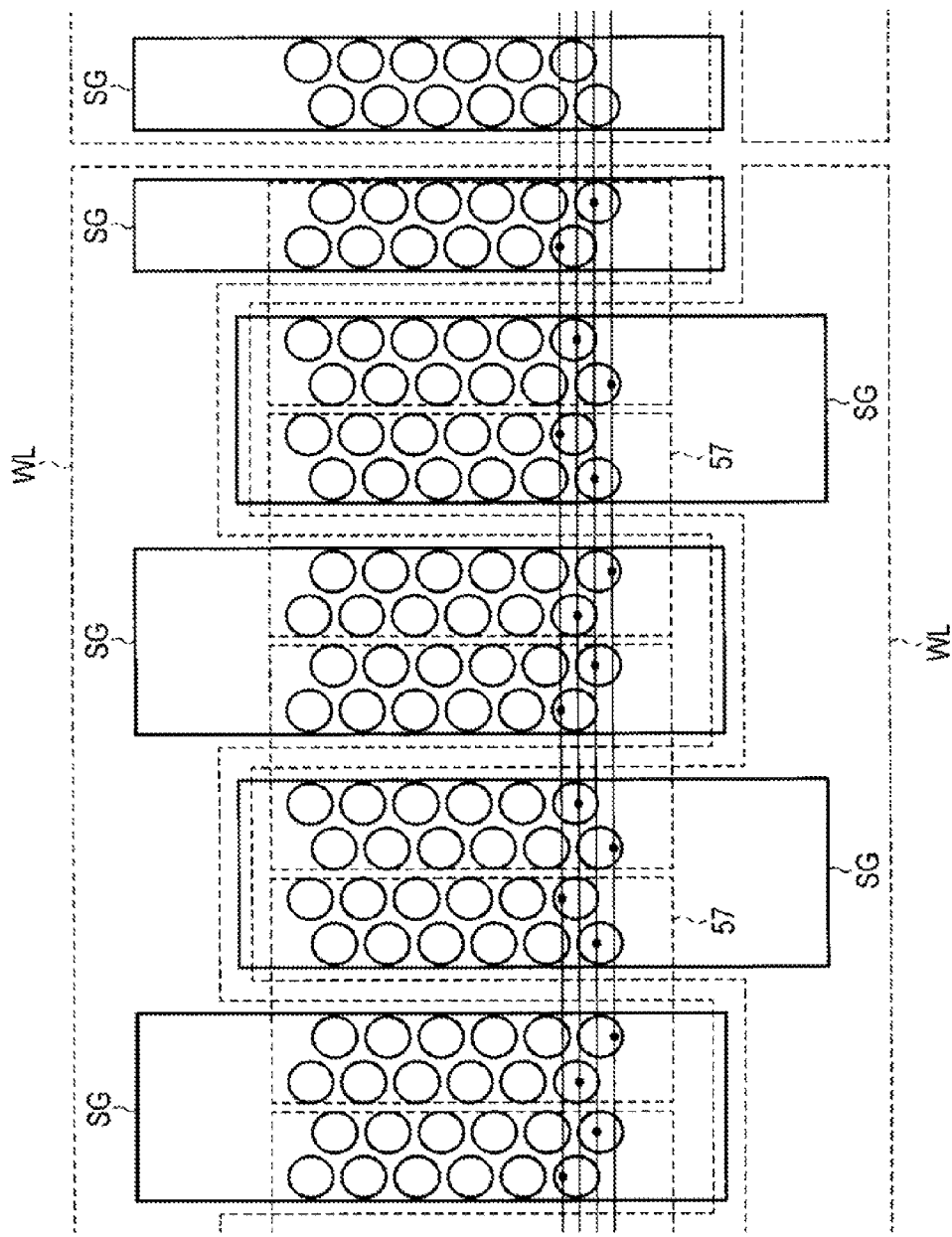
FIG. 54 is a plan view illustrating a memory string unit according to the fifth modification example of the seventh exemplary embodiment.

As illustrated in FIG. 54, four memory columnar portions 56 may be disposed in each select gate SG and each word line WL in the column direction in the same manner as in FIG. 51, but the memory connection portion 57 may not be formed on the entire surface unlike in FIG. 51. Here, the memory connection portion 57 is formed so as to connect the memory columnar portions 56 of four columns adjacent in the column direction to each other. In addition, roots (end portions) of the word lines WL may be bundled every other line, so as to be electrically connected to each other. Therefore, the number of word line driving circuits may be reduced.

Figure 55:
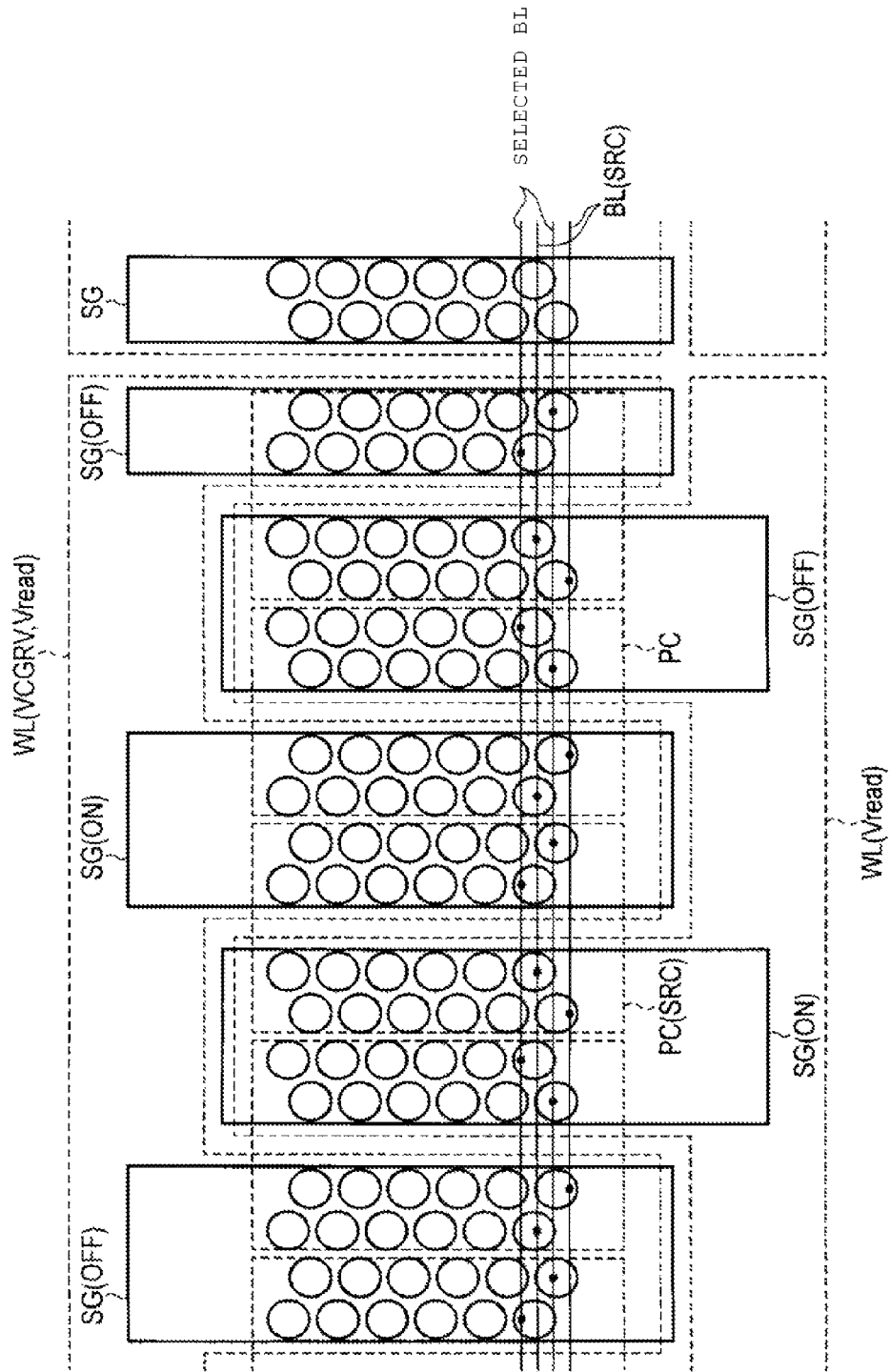
FIG. 55 is a plan view illustrating a read operation in a structure illustrated in FIG. 54.

In the structure illustrated in FIG. 54, a read operation illustrated in FIG. 55 is performed. More specifically, a sense amplifier is connected to the selected bit line BL, and a potential of a source line SRC is applied to the unselected bit line BL. The select gate SG and the word line WL have the same shape in a plane. Only two drain side select gates SG illustrated in FIG. 55 are turned on, and the other select gates SG are turned off. The voltage Vread is supplied to all word lines WL including the memory columnar portions 56 to which the potential of the source line SRC is supplied. On the other hand, among the word lines WL including the memory columnar portions 56 to which a potential of the selected bit lines BL is supplied, the reading potential Vcgr is supplied to selected word lines WL, and the potential Vread is supplied to the other word lines WL. If a threshold value of the selected memory cell is lower than the reading potential Vcgr in this state, the memory cell is turned on. On the other hand, if the threshold value of the selected memory cell is higher than the reading potential Vcgr, the memory cell is turned off. As a result, data of the memory cell is read to the sense amplifier via the selected bit line BL.

Figure 56:
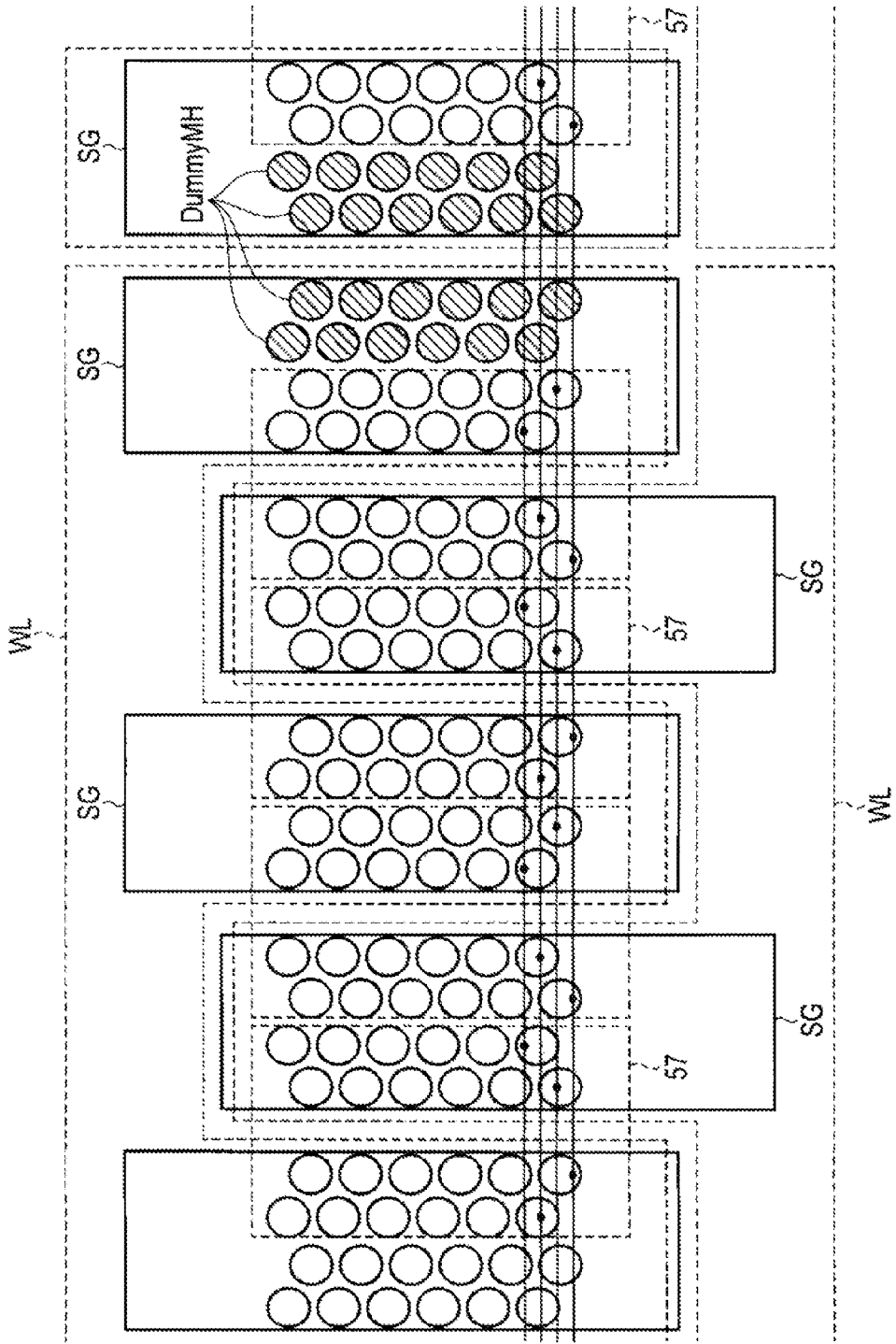
FIG. 56 is a plan view illustrating a block end of the memory string unit according to the fifth modification example of the seventh exemplary embodiment.

As illustrated in FIG. 56, the memory columnar portions 56 of four columns are disposed in the select gate SG in the block BLK end. In addition, if a problem occurs in an electrical characteristic, for example, the memory columnar portions of two columns of the block BLK end side may be dummy columnar portions.

Figure 57:
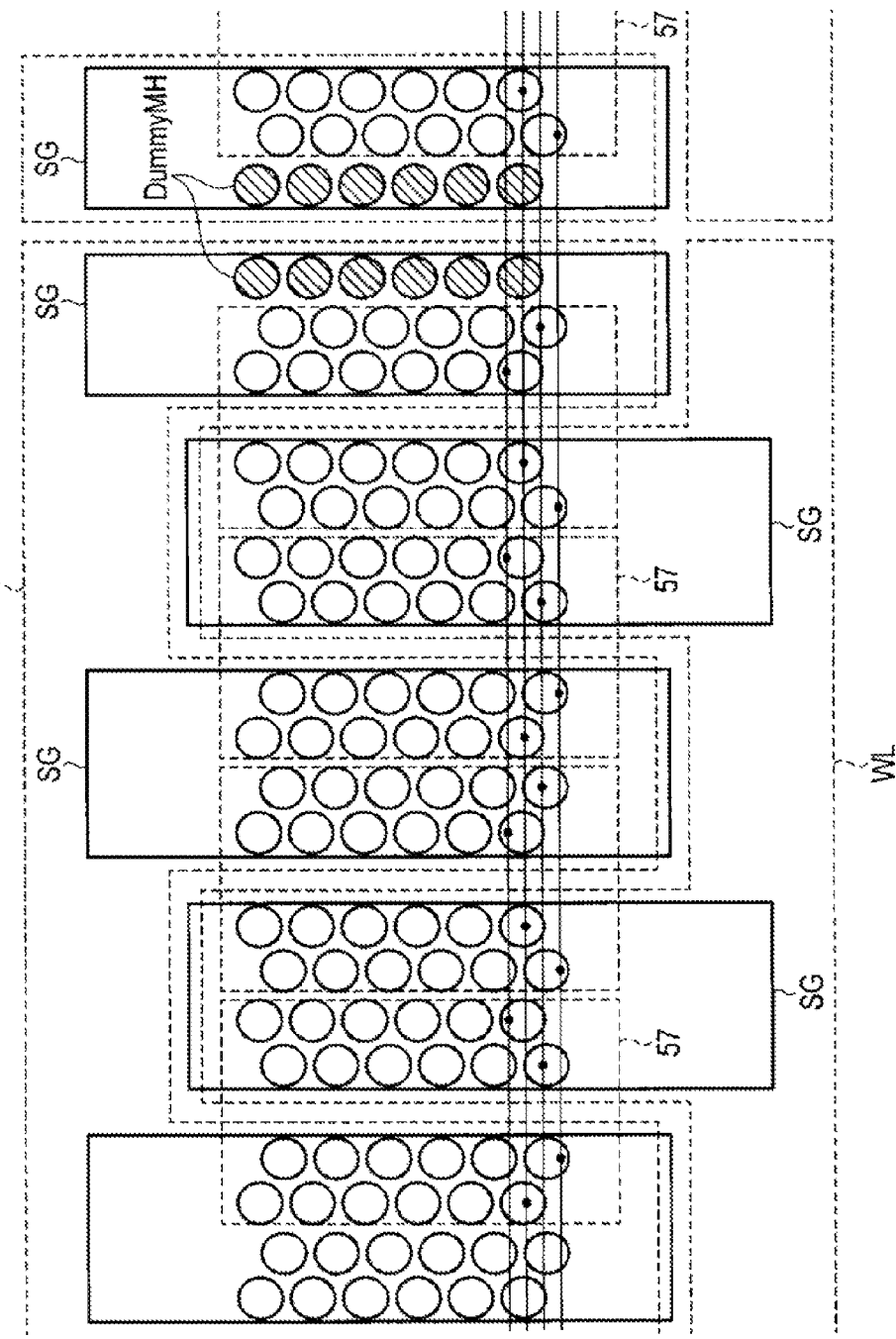
FIG. 57 is a plan view illustrating a block end of the memory string unit according to the fifth modification example of the seventh exemplary embodiment.

As illustrated in FIG. 57, the memory columnar portions 56 of three columns may be disposed in the select gate SG in the block BLK end. In addition, if a problem occurs in an electrical characteristic, for example, the memory columnar portions of one column of the block BLK end side may be dummy columnar portions.

As illustrated in FIG. 58, dummy holes and dummy bit lines may be provided, and contacts and metal wirings (source lines) may be further provided thereon, thereby enhancing sources.

Figure 59A:
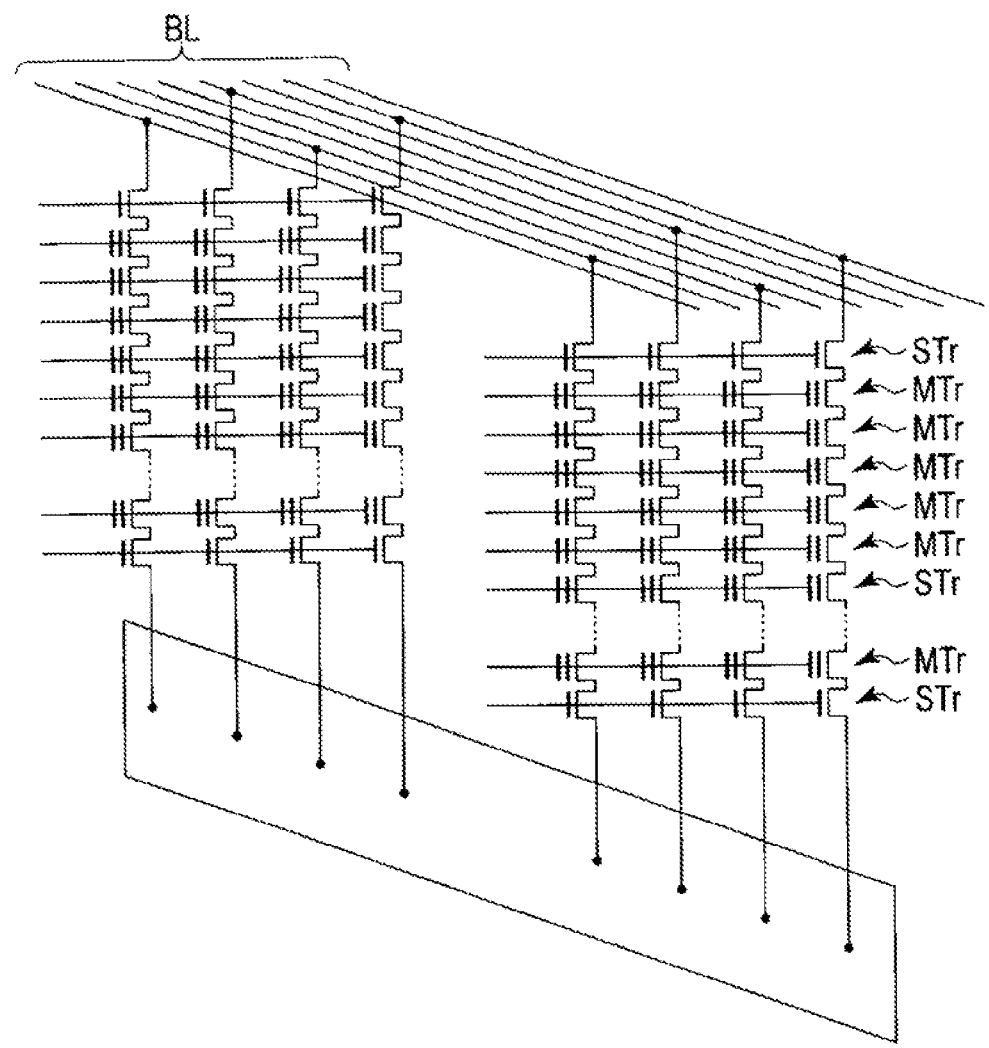
FIGS. 59A and 59B are circuit diagrams illustrating a structure illustrated in FIG. 58.
Figure 59B:
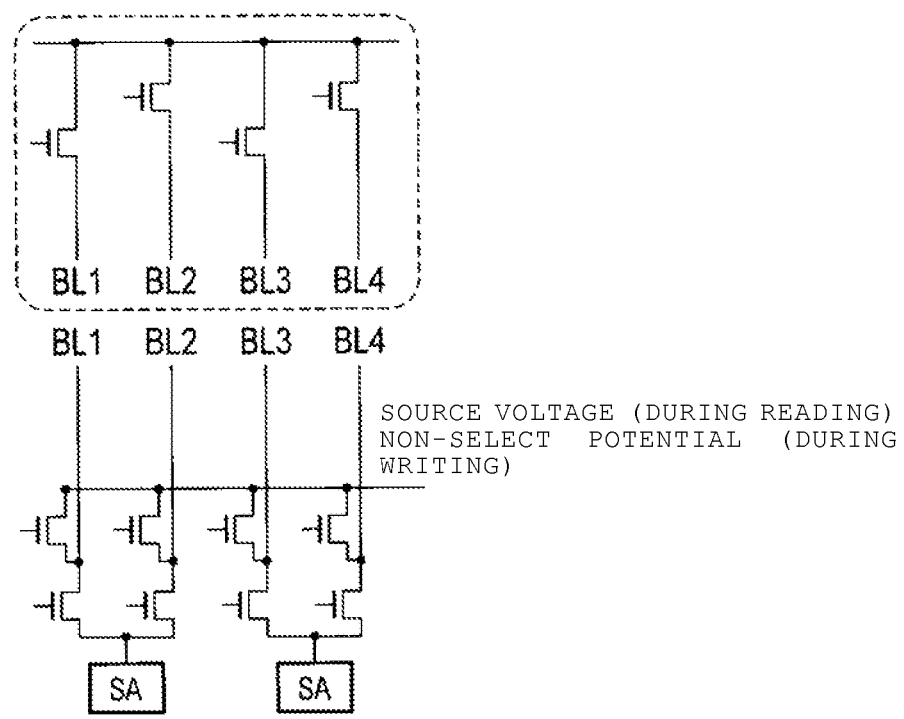

If a resistance of the bit line BL increases, discharge transistors may be provided at ends on a side opposite the sense amplifiers of the bit lines BL as illustrated in FIGS. 59A and 59B. In addition, during a read operation, a source potential is also given from the discharge transistor to the bit line BL connected to the source line SL. The discharge transistor may also be used when the bit line BL is discharged, such as writing of data, in operations other than the read operation.

Figure 60:
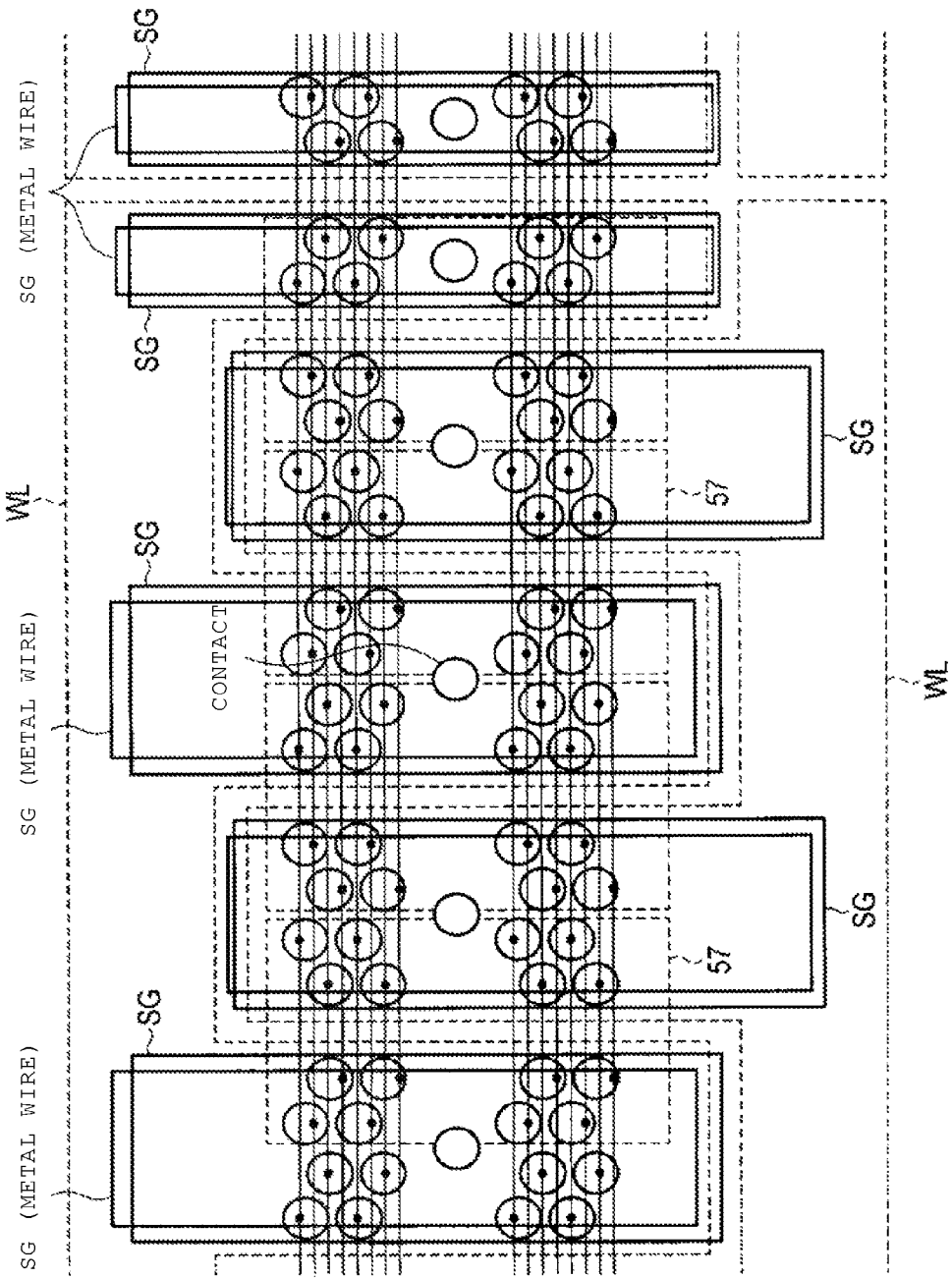
FIG. 60 is a plan view illustrating a memory string unit according to the fifth modification example of the seventh exemplary embodiment.

In addition, if a resistance of the select gate SG increases, as illustrated in FIG. 60, a metal wire may be formed over the select gate SG so as to be parallel to the select gate SG. Further, the metal wire and the select gate SG may be shunted via a contact.

The structures of FIGS. 52 to 60 may be all combined together.

Figure 62:
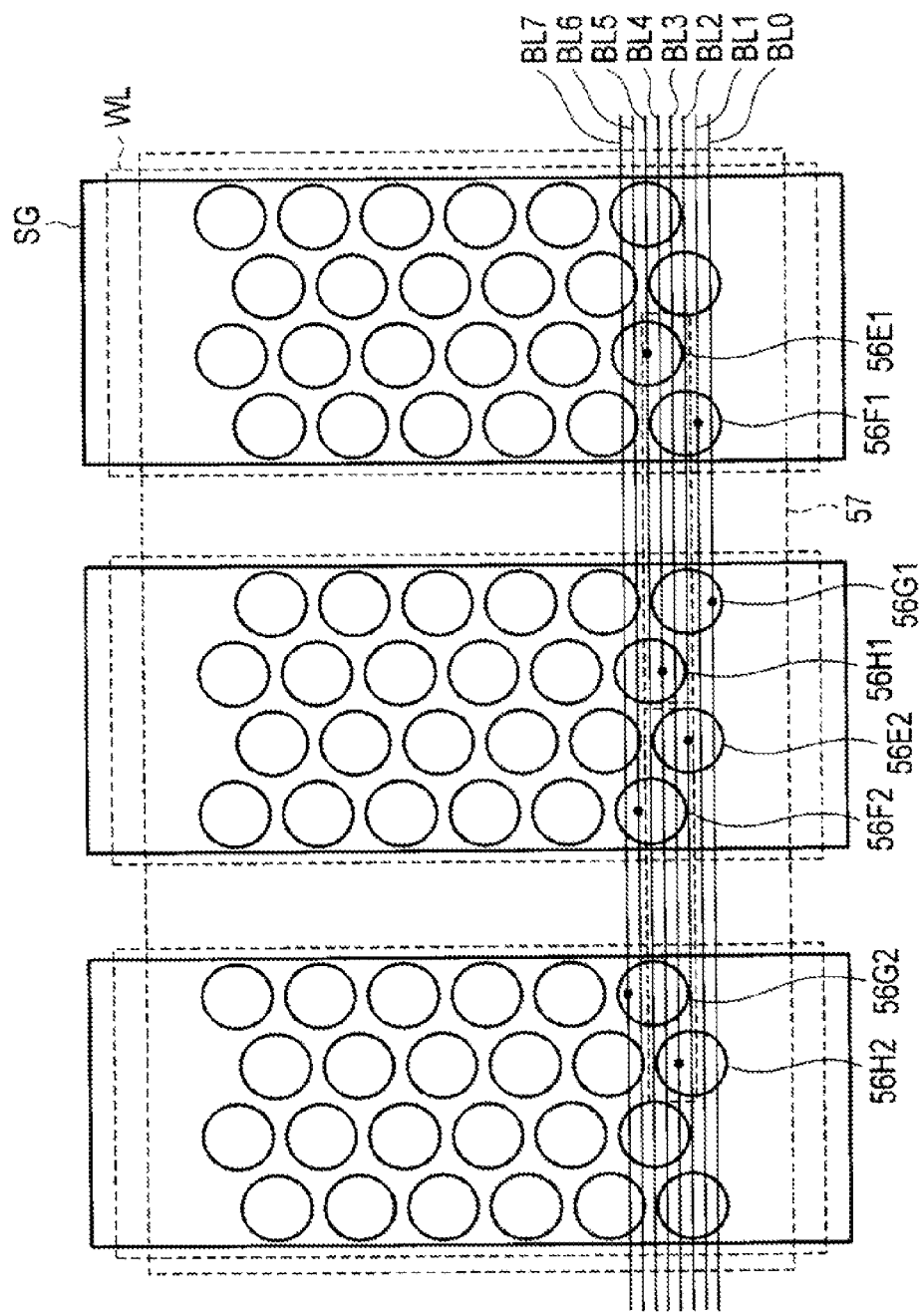
FIG. 62 is a plan view illustrating a memory string unit according to a sixth modification example of the seventh exemplary embodiment.

As illustrated in FIG. 62, in Modification Example 6, the number of bit lines BL of Modification Example 5 (or Modification Example 4) may be doubled in the same manner as in Modification Example 3. Accordingly, the number of selected memory strings may be doubled, and floating of sources may be averaged.

In the above Modification Example 6, the number of selectable bit lines BL may be increased, but the number of whole bit lines BL is increased, and thus a pitch thereof is reduced. Accordingly, there is a case where processing such as lithography is hard to perform.

Figure 63:
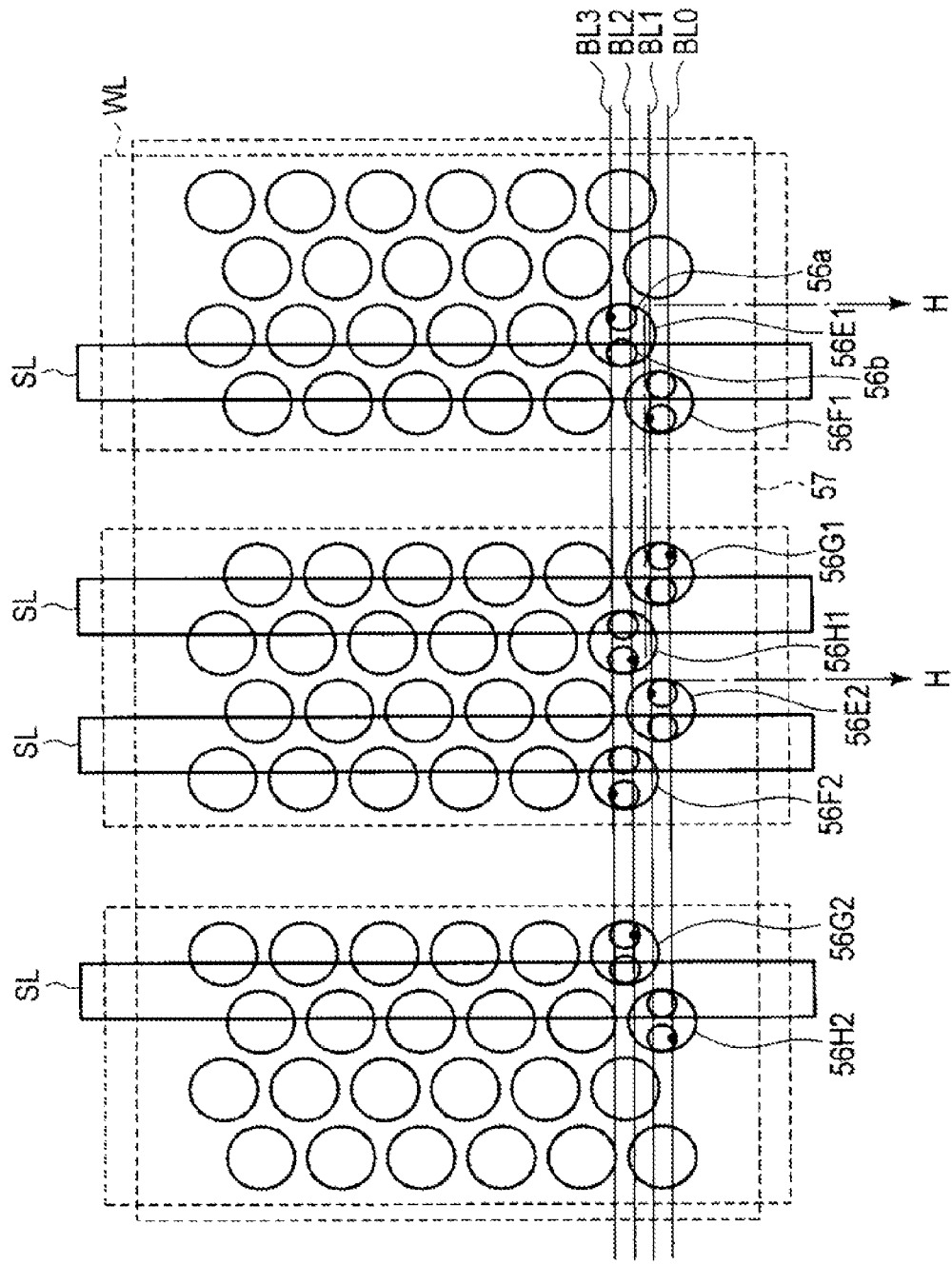
FIG. 63 is a plan view illustrating a memory string unit according to a seventh modification example of the seventh exemplary embodiment.
Figure 64:
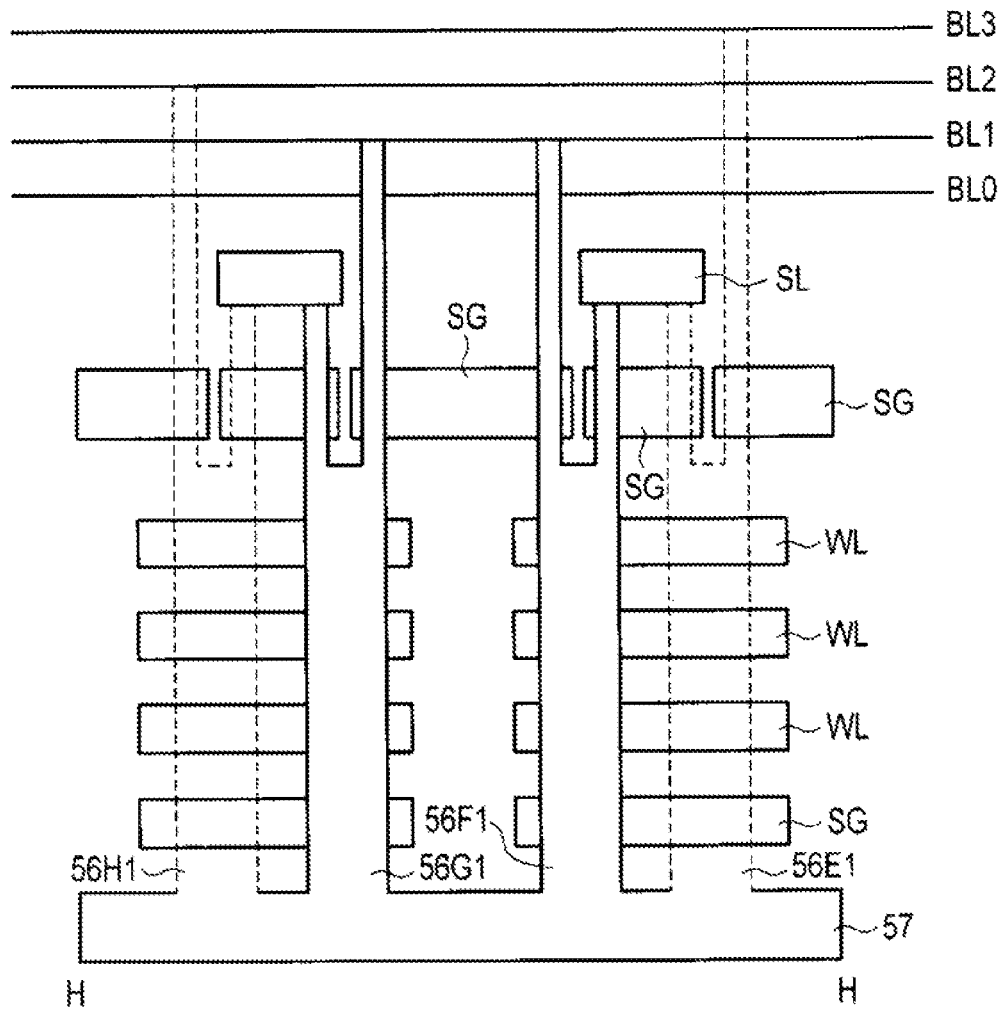
FIG. 64 is a cross-sectional view illustrating a memory string unit according to the seventh modification example of the seventh exemplary embodiment.
Figure 65:
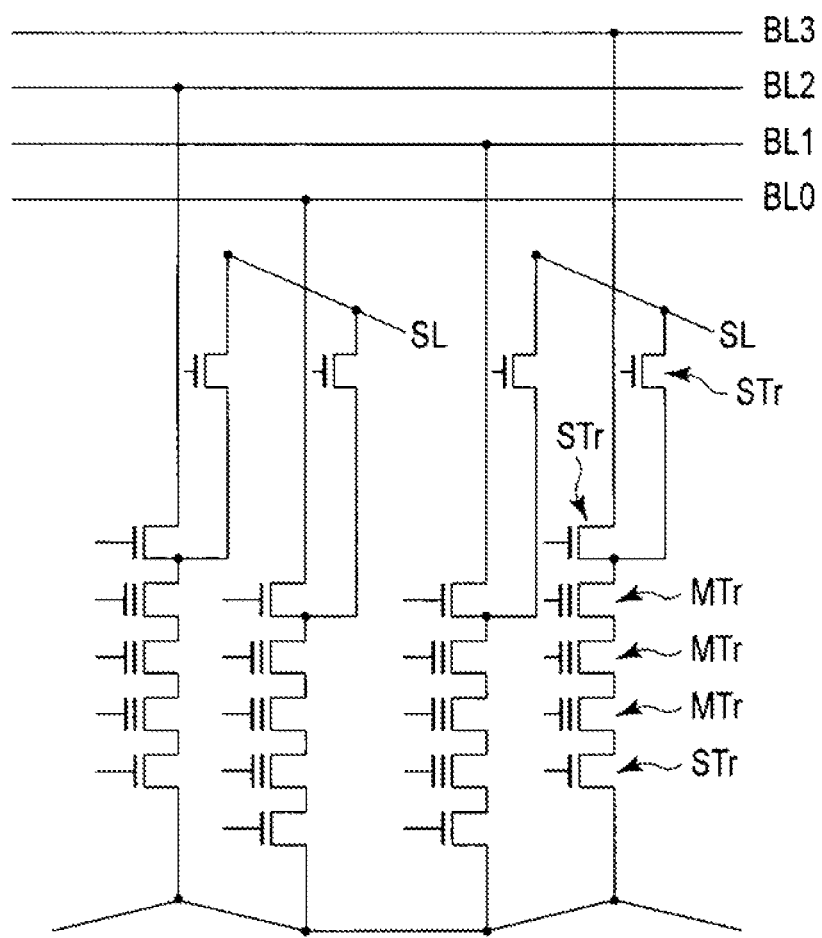
FIG. 65 is a circuit diagram illustrating a memory string unit according to the seventh modification example of the seventh exemplary embodiment.

In contrast, as illustrated in FIGS. 63 to 65, in Modification Example 7, each memory columnar portion 56 (memory string) includes a first memory columnar portion 56a connected to the bit line BL located thereover and a second memory columnar portion 56b connected to the source line SL.

The first memory columnar portion 56a is formed on one side in the column direction at the upper part of the memory columnar portion 56. The first memory columnar portion 56a is formed so as to penetrate through the select gate SG, and an upper end thereof is connected to the bit line BL. In other words, the first memory columnar portion 56a and the select gate SG form a select transistor STr on the bit line BL side.

The second memory columnar portion 56b is formed on the other side in the column direction at the upper part of the memory columnar portion 56. In other words, the first memory columnar portion 56a and the second memory columnar portion 56b are disposed so as to be adjacent to each other in the column direction. The second memory columnar portion 56b is formed so as to penetrate through the select gate SG, and an upper end thereof is connected to the source line SL. In other words, the second memory columnar portion 56b and the select gate SG form the select transistor STr on the source line SL side.

In write and read operations, if a memory string is a selected memory string, the select transistor STr on the bit line BL side is made to be turned on, and the select transistor STr on the source line SL side is made to be turned off. On the other hand, if the memory string is an unselected memory string, the select transistor STr on the bit line BL side is made to be turned off, and the select transistor STr on the source line SL side is made to be turned on. Accordingly, the selected memory string is electrically connected to the bit line BL, and the unselected memory string is electrically connected to the source line SL. In addition, the select transistor STr disposed on the lower side of the memory string is turned on in a read operation, and is turned off in a write operation.

Figure 66:
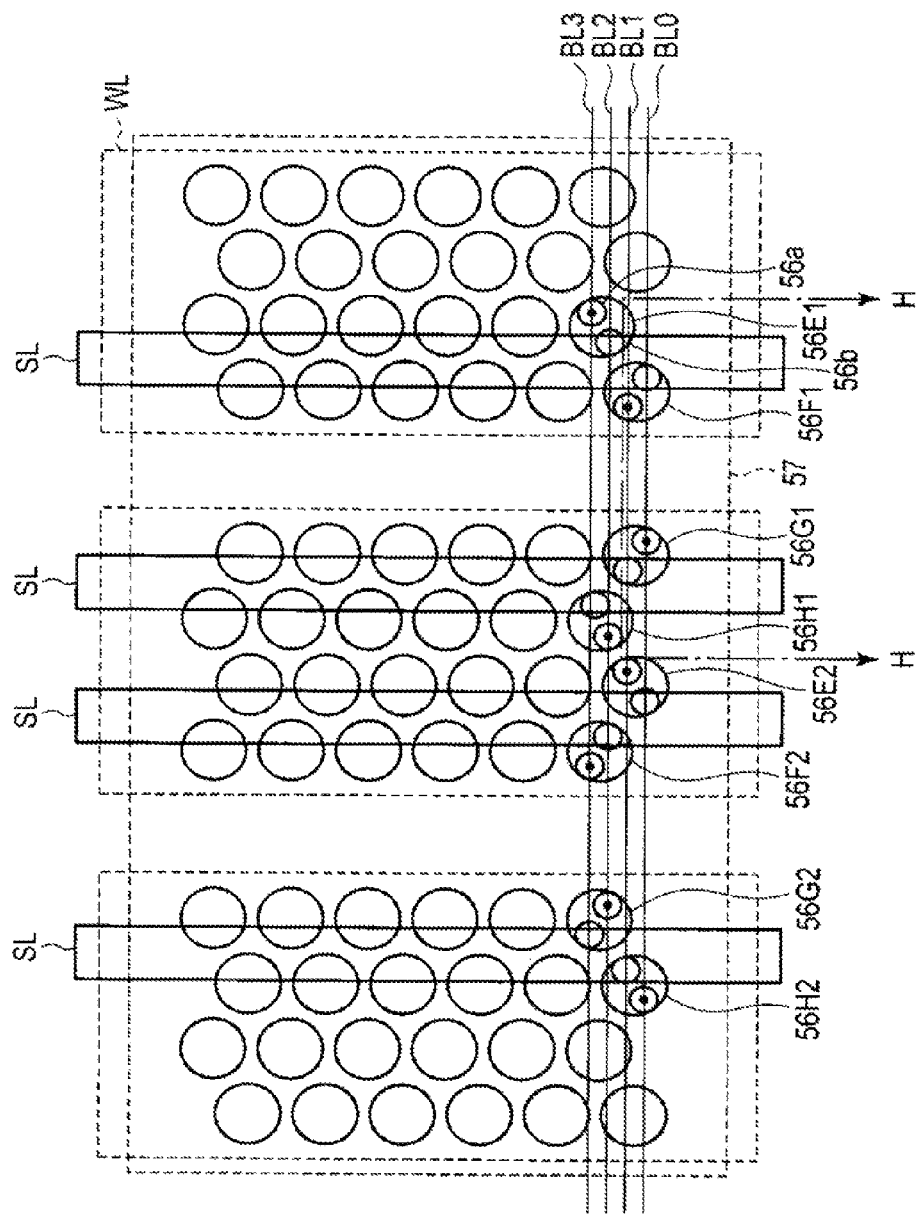
FIG. 66 is a plan view illustrating a memory string unit according to an eighth modification example of the seventh exemplary embodiment.

As illustrated in FIG. 66, the first memory columnar portion 56a and the second memory columnar portion 56b may exchange their positions. More specifically, the first memory columnar portion 56a and the second memory columnar portion 56b may be disposed so as to be adjacent to each other in a tilt direction with respect to the column direction and the row direction. Accordingly, processing such as lithography may be easily performed when the first memory columnar portion 56a and the second memory columnar portion 56b are formed.

In addition, also in each Modification Example, the memory strings connected to all of the bit lines BL (the odd-numbered bit lines BL1 and BL3 and the even-numbered bit lines BL0 and BL2) may be selected memory strings in a write operation.

In the structure (including structures of Modification Examples) according to the seventh exemplary embodiment, the memory connection portion 57 which connects the lower ends to each other may be formed in the same manner as a connection portion which connects lower ends of U-shaped semiconductors of p-BiCS to each other, and may be formed on a substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
first and second word line groups, each including a plurality of stacked word lines above a substrate having first and second layers that are insulated from each other;
a first memory string including a first memory column through the first word line group, a second memory column through the second word line group, and a first memory connection portion electrically coupling the first and second memory columns; and
a second memory string including a third memory column through the first word line group, a fourth memory column through the second word line group, and a second memory connection portion electrically coupling the third and fourth memory columns, wherein
the first memory connection portion is formed in the first layer of the substrate and the second memory connection portion is formed in the second layer of the substrate that is lower than the first layer.

2. The device according to claim 1, wherein the first and second memory connection portions extend in a first direction that is perpendicular to a second direction along which each of the stacked word lines extend, and the first memory connection portion is bounded by the second memory connection portion in the first direction and is aligned with a part of the second memory connection portion in the second direction.

3. The device according to claim 1, wherein the stacked word lines of the first and second word line groups extend in a first direction, and the first and second memory connection portions each extend in a second direction that is transverse to the first direction, to connect the first and second memory columns, and the third and fourth memory columns, respectively.

4. The device according to claim 3, wherein the first and third memory columns are aligned partially in the first direction and no portions of the first and third memory columns are aligned in the second direction, and the second and fourth memory columns are aligned partially in the first direction and no portions of the second and fourth memory columns are aligned in the second direction.

5. The device according to claim 1, wherein the first and third memory columns are linearly symmetrical to the second and fourth memory columns with respect to a straight line which connects a middle point of a first line segment connecting the first and second memory columns to a middle point of a second line segment connecting the third and fourth memory columns.

6. The device according to claim 1, wherein the first layer comprise a back gate for the first memory string driven by a first back gate driving circuit and the second layer comprise a back gate for the second memory string driven by a second back gate driving circuit, and the first and second layers are separated by an insulating layer.

7. The device according to claim 1, further comprising:
first and second selection gates, which are selection gates for the first and second memory strings, formed respectively over the first and second word line groups; and
third and fourth selection gates, which are selection gates for the third and fourth memory strings formed respectively over the second and third word line groups,
wherein the second selection gate is electrically connected to the third selection gate.

8. The device according to claim 1, further comprising:
first and second selection gates, which are selection gates for the first and second memory strings, formed respectively over the first and second word line groups; and
third and fourth selection gates, which are selection gates for the third and fourth memory strings formed respectively over the second and third word line groups,
wherein the second selection gate is electrically insulated from the third selection gate.

9. The device according to claim 8, further comprising:
a third memory string including a fifth memory column through the first word line group, a sixth memory column through the second word line group, and a third memory connection portion electrically connecting the fifth and sixth memory columns, wherein
the substrate has a third layer that is lower than and insulated from the first and second layers, and
the third memory connection portion is formed in the third layer of the substrate.

10. The device according to claim 9, wherein
the first, second, and third memory connection portions extend in a first direction that is perpendicular to a second direction along which each of the stacked word lines extend, and
the first memory connection portion is bounded by the second memory connection portion in the first direction and is aligned with a part of the second memory connection portion in the second direction, and the second connection portion is bounded by the third memory connection portion in the first direction and is aligned with a part of the third memory connection portion in the second direction.

11. A nonvolatile semiconductor memory device comprising:
first and second word line groups, each of which includes a plurality of stacked word lines that extend in a first direction;
a first memory column through the first word line group and electrically connected to a first bit line;
a second memory column through the second word line group and electrically connected to a second bit line, the second memory column being disposed at a same position as the first memory column in the first direction;
a third memory column through the first word line group, adjacent to the first memory column in a second direction perpendicular to the first direction, and disposed at a position deviated from the first memory column in the first direction;
a fourth memory column through the second word line group, and disposed at a same position as the third memory column in the first direction; and
a memory connection portion that electrically connects the first to fourth memory columns to each other,
wherein, when a memory cell of the first memory column is selected, the first bit line is connected to a sense amplifier, and a source line voltage is supplied to the second bit line, and
wherein, when a memory cell of the second memory column is selected, the second bit line is connected to the sense amplifier, and the source line voltage is supplied to the first bit line.

12. The device according to claim 11, wherein
when data is read from a memory cell of the second memory column, the second bit line is connected to the sense amplifier, and the source line voltage is supplied to the first bit line, and
when data is to be written to memory cells of the first memory column and the second memory column, the first bit line and the second bit line are connected to the sense amplifier, and a voltage corresponding to the data to be written is applied from the sense amplifier to the first bit line and the second bit line.

* * * * *